US010734786B2

(12) United States Patent
Hirose et al.

(10) Patent No.: US 10,734,786 B2
(45) Date of Patent: Aug. 4, 2020

(54) SEMICONDUCTOR LIGHT EMITTING ELEMENT AND LIGHT EMITTING DEVICE INCLUDING SAME

(71) Applicant: HAMAMATSU PHOTONICS K.K., Hamamatsu-shi, Shizuoka (JP)

(72) Inventors: Kazuyoshi Hirose, Hamamatsu (JP); Yoshitaka Kurosaka, Hamamatsu (JP); Takahiro Sugiyama, Hamamatsu (JP); Yuu Takiguchi, Hamamatsu (JP); Yoshiro Nomoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/292,531

(22) Filed: Mar. 5, 2019

(65) Prior Publication Data
US 2019/0252856 A1 Aug. 15, 2019

Related U.S. Application Data

(63) Continuation-in-part of application No. PCT/JP2017/031466, filed on Aug. 31, 2017.

(30) Foreign Application Priority Data

Sep. 7, 2016 (JP) .................................. 2016-174708
Jun. 8, 2018 (JP) .................................. 2018-110112

(51) Int. Cl.
*H01S 5/00* (2006.01)
*H01S 5/183* (2006.01)
(Continued)

(52) U.S. Cl.
CPC .......... *H01S 5/18363* (2013.01); *H01S 5/028* (2013.01); *H01S 5/187* (2013.01);
(Continued)

(58) Field of Classification Search
CPC .. H01S 5/18302; H01S 5/028; H01S 5/18319; H01S 5/423; H01S 5/18327;
(Continued)

(56) References Cited

U.S. PATENT DOCUMENTS

2003/0010763 A1* 1/2003 Fukuchi ................. G02B 27/46
219/121.73
2004/0252741 A1 12/2004 Meyer et al.
(Continued)

FOREIGN PATENT DOCUMENTS

CN 1908764 A 2/2007
CN 101685941 A 3/2010
(Continued)

OTHER PUBLICATIONS

Kurosaka, Yoshitaka et al., "Effects of non-lasing band in two-dimensional photonic-crystal lasers clarified using ominidirectional band structure," Optics Express vol. 20, No. 19, 2012, pp. 21773-21783.
(Continued)

*Primary Examiner* — Kinam Park
(74) *Attorney, Agent, or Firm* — Faegre Drinker Biddle & Reath LLP

(57) ABSTRACT

The present embodiment relates to a semiconductor light emitting element having a structure that enables removal of zero-order light from output light of an S-iPM laser. The semiconductor light emitting element includes an active layer, a pair of cladding layers, and a phase modulation layer. The phase modulation layer has a base layer and a plurality of modified refractive index regions each of which is individually arranged at a specific position. One of the pair of cladding layers includes a distributed Bragg reflector layer which has a transmission characteristic with respect to a specific optical image outputted along an inclined direction
(Continued)

with respect to a light emission surface and has a reflection characteristic with respect to the zero-order light outputted along a normal direction of the light emission surface.

6 Claims, 36 Drawing Sheets

(51) Int. Cl.
    *H01S 5/42* (2006.01)
    *H01S 5/028* (2006.01)
    *H01S 5/187* (2006.01)
(52) U.S. Cl.
    CPC ...... *H01S 5/18302* (2013.01); *H01S 5/18319* (2013.01); *H01S 5/18327* (2013.01); *H01S 5/423* (2013.01); *H01S 5/0287* (2013.01); *H01S 2301/02* (2013.01); *H01S 2301/18* (2013.01)
(58) Field of Classification Search
    CPC .. H01S 5/18363; H01S 5/187; H01S 2301/02; H01S 2301/18
    See application file for complete search history.

(56) References Cited

U.S. PATENT DOCUMENTS

| | | | |
|---|---|---|---|
| 2007/0008998 | A1* | 1/2007 | Ohta ............... H01L 33/06 372/43.01 |
| 2007/0019099 | A1 | 1/2007 | Lieberman et al. |
| 2007/0030873 | A1 | 2/2007 | Deng |
| 2008/0175286 | A1 | 7/2008 | Kamijima |
| 2008/0240179 | A1 | 10/2008 | Otsuka et al. |
| 2008/0259981 | A1* | 10/2008 | Wang ............... B82Y 20/00 372/44.01 |
| 2009/0289266 | A1 | 11/2009 | Lee et al. |
| 2010/0220763 | A1* | 9/2010 | Ikuta ............... B82Y 20/00 372/50.124 |
| 2013/0163626 | A1* | 6/2013 | Seurin ............... F21V 29/56 372/35 |
| 2013/0343415 | A1* | 12/2013 | Hori ............... H01S 5/18 372/38.05 |
| 2014/0211822 | A1 | 7/2014 | Fattal et al. |
| 2014/0299742 | A1* | 10/2014 | Fujii ............... G02B 21/14 250/201.3 |
| 2014/0348195 | A1* | 11/2014 | Sakaguchi ............... H01S 5/105 372/45.01 |
| 2015/0185523 | A1* | 7/2015 | Matsumoto ............... G02F 1/1313 359/238 |
| 2016/0020580 | A1* | 1/2016 | Takiguchi ............... H01S 5/105 372/44.011 |
| 2016/0036201 | A1* | 2/2016 | Takiguchi ............... H01S 5/12 359/492.01 |
| 2016/0072258 | A1 | 3/2016 | Seurin et al. |
| 2016/0075258 | A1* | 3/2016 | Kim ............... B61L 29/00 191/41 |
| 2016/0248224 | A1* | 8/2016 | Noda ............... H01S 5/0425 |
| 2016/0257036 | A1* | 9/2016 | Fang ............... C08F 222/10 |
| 2016/0327906 | A1 | 11/2016 | Futterer |
| 2018/0006426 | A1* | 1/2018 | Takiguchi ............... G02B 27/1026 |
| 2018/0109075 | A1* | 4/2018 | Kurosaka ............... H01S 5/18358 |
| 2019/0165546 | A1* | 5/2019 | Hogg ............... H01S 5/0265 |
| 2019/0181613 | A1* | 6/2019 | Kurosaka ............... H01S 5/183 |

FOREIGN PATENT DOCUMENTS

| | | |
|---|---|---|
| CN | 102638003 A | 8/2012 |
| CN | 103038959 A | 4/2013 |
| CN | 104852278 A | 8/2015 |
| CN | 105191029 A | 12/2015 |
| JP | S49-024190 | 5/1972 |
| JP | S59-177282 | 10/1984 |
| JP | H7-297110 A | 11/1995 |
| JP | H9-139540 A | 5/1997 |
| JP | H9-282437 A | 10/1997 |
| JP | H9-311614 A | 12/1997 |
| JP | 2006-026726 A | 2/2006 |
| JP | 2007-019277 A | 1/2007 |
| JP | 2008-256823 A | 10/2008 |
| JP | 2009-111360 A | 5/2009 |
| JP | 2009-212359 A | 9/2009 |
| JP | 2009-540593 A | 11/2009 |
| JP | 2010-283335 A | 12/2010 |
| JP | 2012-195341 A | 10/2012 |
| JP | 2013-161965 A | 8/2013 |
| JP | 2014-026083 A | 2/2014 |
| JP | 2014-027264 A | 2/2014 |
| JP | 2014-197665 A | 10/2014 |
| JP | 2014-202867 A | 10/2014 |
| JP | 2014-236127 A | 12/2014 |
| JP | 2016/122711 A | 7/2016 |
| JP | 2016-129208 A | 7/2016 |
| WO | WO-01/53876 A1 | 7/2001 |
| WO | WO 2008/041138 A2 | 4/2008 |
| WO | WO 2012/035620 A1 | 3/2012 |
| WO | WO-2014/017289 A1 | 1/2014 |
| WO | WO-2014/136607 A1 | 9/2014 |
| WO | WO-2014/136955 A1 | 9/2014 |
| WO | WO-2014/136962 A1 | 9/2014 |
| WO | WO 2014/175447 A1 | 10/2014 |
| WO | WO 2015/008627 A1 | 1/2015 |
| WO | WO 2016/111332 A1 | 7/2016 |
| WO | WO-2016/148075 A1 | 9/2016 |
| WO | WO 2017-191320 A1 | 11/2017 |

OTHER PUBLICATIONS

Kurosaka, Yoshitaka et al., "Phase-modulating lasers toward on-chip integration," Scientific Reports, Jul. 26, 2016, vol. 6, Article No. 30138, 8 pages.
Peng, Chao et al., "Coupled-wave analysis for photonic-crystal surface-emitting lasers on air holes with arbitrary sidewalls," Optics Express vol. 19, No. 24, 2011, pp. 24672-24686.
Sakai, Kyosuke et al., "Coupled-Wave Theory for Square-Lattice Photonic Crystal Lasers With TE Polarization," IEEE Journal of Quantum Electronics, 2010.05, vol. 46, No. 5, pp. 788-795.
International Preliminary Report on Patentability dated Feb. 21, 2019 for PCT/JP2017/029152.
International Preliminary Report on Patentability dated Mar. 21, 2019 for PCT/JP2017/031466.
Lee, "Sampled Fourier Transform Hologram Generated by Computer", Applied Optics, Mar. 1970, vol. 9, No. 3, p. 639-p. 644.
International Preliminary Report on Patentability (IPRP) dated Oct. 10, 2019 that issued in WO Patent Application No. PCT/JP2018/012188.
International Preliminary Report on Patentability (IPRP) dated Oct. 10, 2019 that issued in WO Patent Application No. PCT/JP2018/012191.
International Preliminary Report on Patentability (IPRP) dated Dec. 26, 2019 that issued in WO Patent Application No. PCT/JP2018/022609.
English-language translation of International Preliminary Report on Patentability (IPRP) dated Jun. 18, 2020 that issued in WO Patent Application No. PCT/JP2018/043843.

\* cited by examiner

Fig.7A

| A2 | A1 |
|---|---|
| A3 | A4 |

ORIGINAL IMAGE

Fig.7B

| A4<br><br>A2 ROTATION | A3<br><br>A1 ROTATION |
|---|---|
| A1<br><br>A3 ROTATION | A2<br><br>A4 ROTATION |

OBTAINED BEAM PATTERN

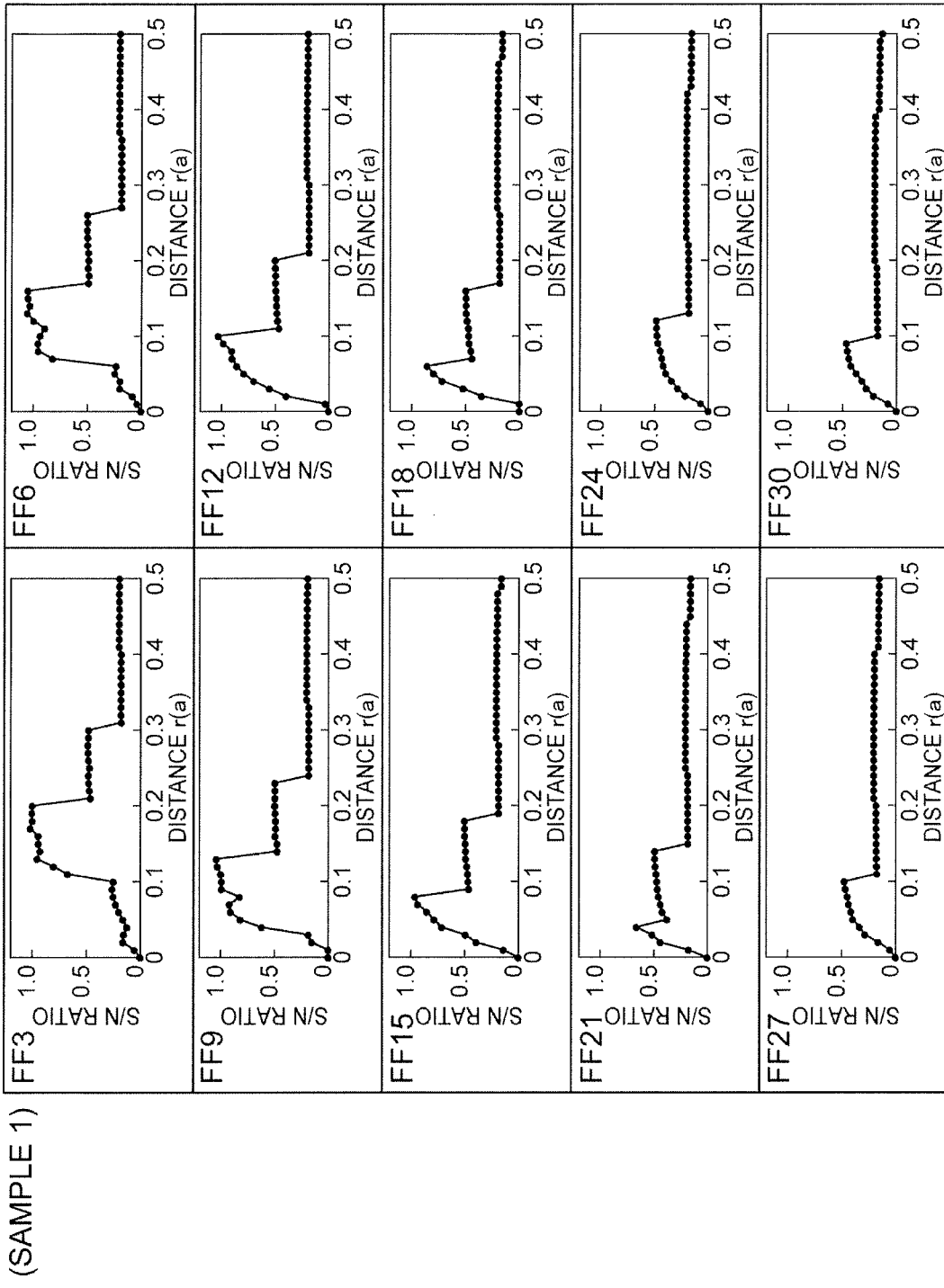
Fig. 11 (SAMPLE 1)

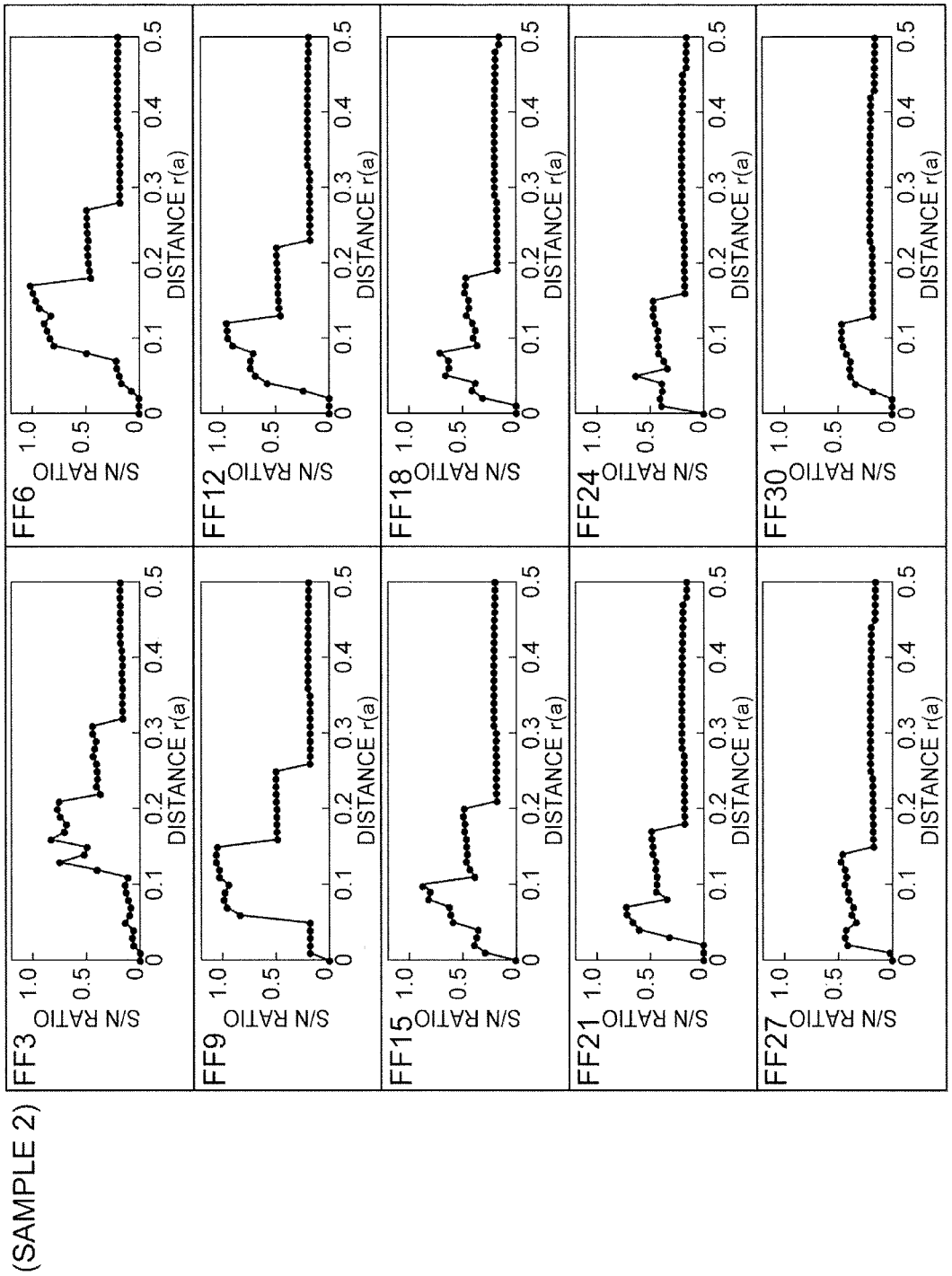
Fig. 14 (SAMPLE 2)

Fig.17 (SAMPLE 3)

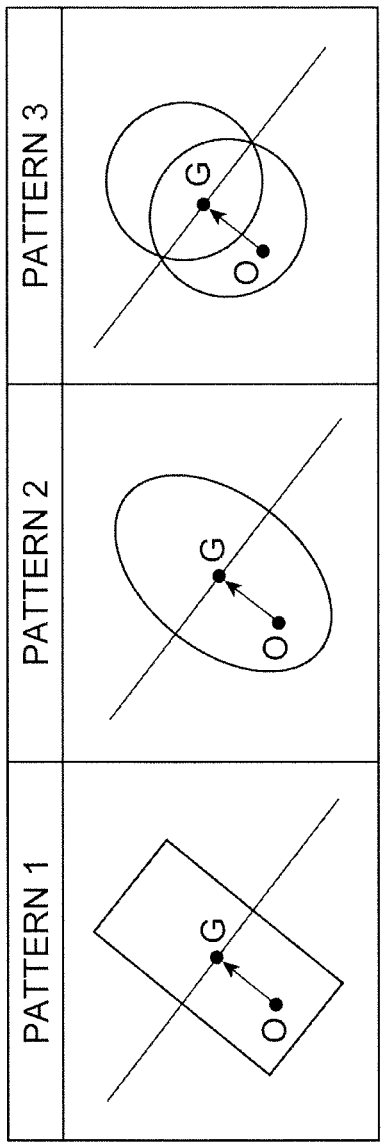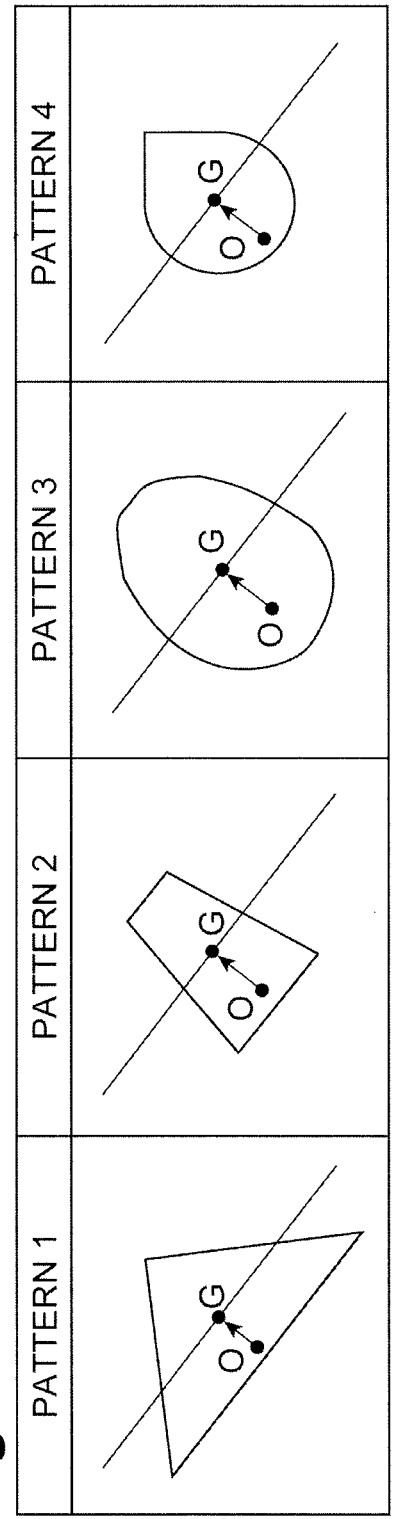

Fig.30

| |
|---|
| N-TYPE GaAs SUBSTRATE |
| N-TYPE AlGaAs (Al COMPOSITION: 40%) CLADDING LAYER 2.0 μm |
| I-TYPE InGaAs/AlGaAs ACTIVE LAYER 225nm |
| I-TYPE PHASE MODULATION LAYER (GaAs/HOLE, HOLE FF = 15%) 250nm |
| P-TYPE AlGaAs (Al COMPOSITION: 70%) CLADDING LAYER 200nm |
| P-TYPE GaAs/AlGaAs (Al COMPOSITION: 95%) DBR LAYER 11 PAIRS 1.59 μm |
| P-TYPE AlGaAs (Al COMPOSITION: 70%) CLADDING LAYER 200nm |
| P-TYPE GaAs CONTACT LAYER 100nm |

Fig.33

| N-TYPE GaAs SUBSTRATE |
|---|
| N-TYPE AlGaAs (Al COMPOSITION: 40%) CLADDING LAYER 200nm |
| N-TYPE GaAs/AlGaAs (Al COMPOSITION: 95%) DBR LAYER 11 PAIRS 1.59 $\mu$m |
| N-TYPE AlGaAs (Al COMPOSITION: 40%) CLADDING LAYER 200nm |
| I-TYPE InGaAs/AlGaAs ACTIVE LAYER 225nm |
| I-TYPE PHASE MODULATION LAYER (GaAs/HOLE, HOLE FF = 15%) 250nm |
| P-TYPE AlGaAs (Al COMPOSITION: 70%) CLADDING LAYER 2.0 $\mu$m |
| P-TYPE GaAs CONTACT LAYER 100nm |

SEMICONDUCTOR LIGHT EMITTING ELEMENT AND LIGHT EMITTING DEVICE INCLUDING SAME

CROSS-REFERENCE TO RELATED APPLICATIONS

This application is a Continuation-In-Part application of PCT/JP2017/031466 claiming the benefit of priority of the Japanese Patent Application No. 2016-174708 filed on Sep. 7, 2016 and further claims the benefit of priority of the Japanese Patent Application No. 2018-110112 filed on Jun. 8, 2018, the entire contents of which are incorporated herein by reference.

TECHNICAL FIELD

The present invention relates to a semiconductor light emitting element and a light emitting device including the same.

BACKGROUND ART

A semiconductor light emitting element described in Patent Document 1 includes an active layer, a pair of cladding layers sandwiching the active layer, and a phase modulation layer optically coupled to the active layer. The phase modulation layer has a base layer and a plurality of modified refractive index regions each of which has a refractive index different from a refractive index of the base layer. When a square lattice is set on the phase modulation layer, each of the modified refractive index regions (main holes) is arranged so as to coincide with a center point (lattice point) of a corresponding region (having a square shape) in the square lattice. An auxiliary modified refractive index region (sub hole) is provided around the modified refractive index region, and light having a predetermined beam pattern can be emitted.

CITATION LIST

Patent Literature

Patent Document 1: PCT International Application Publication No. 2014/136962

SUMMARY OF INVENTION

Technical Problem

As a result of examining the conventional semiconductor light emitting elements, the inventors have found out the following problems. That is, studies have been conducted regarding a semiconductor light emitting element, which outputs an arbitrary optical image by controlling a phase spectrum and an intensity spectrum of light emitted from a plurality of light emitting points two-dimensionally arranged. As one of structures of such a semiconductor light emitting element, there is a structure in which a lower cladding layer, an active layer and an upper cladding layer are provided on a semiconductor substrate, and a phase modulation layer is provided between the lower cladding layer and the active layer or between the active layer and the upper cladding layer. The phase modulation layer is constituted by a base layer and a plurality of modified refractive index regions each of which has a refractive index different from that of the base layer. When a virtual square lattice is set in a plane perpendicular to a thickness direction of the phase modulation layer, a position of center of gravity of the modified refractive index region allocated to each of a plurality of square regions constituting the square lattice is shifted from a lattice point position of the square region allocated in accordance with an optical image that needs to be generated. Such a semiconductor light emitting element is called a static-integrable phase modulating (S-iPM) laser, and outputs a beam to form an optical image of a two-dimensional arbitrary shape along a direction perpendicular to a main surface of the semiconductor substrate (normal direction) and a direction having a predetermined spread angle with respect to the normal direction.

However, not only signal light which is a desired output optical image but also zero-order light is outputted from the semiconductor light emitting element. This zero-order light is light outputted in the direction perpendicular to the main surface of the semiconductor substrate (that is, a direction perpendicular to light emission), and is not normally used in the S-iPM laser. Therefore, the zero-order light becomes noise light at the time of obtaining the desired output optical image, and thus, it is desirable to remove the zero-order light from the optical image.

The present invention has been made to solve the above-described problem, and an object thereof is to provide a semiconductor light emitting element having a structure capable of removing zero-order light from output light of an S-iPM laser and a light emitting device including the same.

Solution to Problem

In order to solve the above-described problem, a semiconductor light emitting element according to the present embodiment includes, as an example, an active layer, a pair of cladding layers constituted by first and second cladding layers, and a phase modulation layer. The semiconductor light emitting element has a light emission surface and a light reflection surface arranged to face the light emission surface, and outputs an optical image of an arbitrary shape along a normal direction of the light emission surface and an inclined direction having predetermined inclination and spread angle with respect to the normal direction. The active layer is arranged between the light emission surface and the light reflection surface. The first cladding layer is arranged between the light emission surface and the active layer. The second cladding layer is arranged between the light reflection surface and the active layer. The phase modulation layer is arranged between the first cladding layer and the active layer or between the second cladding layer and the active layer. In addition, any of the first and second cladding layers includes a distributed Bragg reflector layer which has a transmission characteristic with respect to the specific optical image outputted along the inclined direction and has a reflection characteristic with respect to zero-order light outputted along the normal direction. The phase modulation layer has a base layer and a plurality of modified refractive index regions each of which has a refractive index different from a refractive index of the base layer. Further, a method for manufacturing the semiconductor light emitting element and a light emitting device including the same includes: a first step of providing a lower cladding layer (a second cladding layer constituting a pair of cladding layers) on a substrate; a second step of providing an active layer on the second cladding layer; a third step of providing an upper cladding layer (a first cladding layer constituting a pair of cladding layers) on the active layer; and a fourth step of providing a phase modulation layer between the lower cladding layer and the active layer or between the active layer and the upper cladding layer, the fourth step being executed between the first step and the second step or between the second step and the third step.

In particular, in the method for manufacturing the semiconductor light emitting element according to the present embodiment and the light emitting device including the same, the phase modulation layer is configured such that each of the plurality of modified refractive index regions is individually arranged at a specific position. To be specific, where a virtual square lattice constituted by M1(an integer of one or more)×N1 (an integer of one or more) unit constituent regions R each having a square shape is set on an X-Y plane in an XYZ orthogonal coordinate system defined by a Z axis coinciding with the normal direction and the X-Y plane including X and Y axes orthogonal to each other and coinciding with one surface of the phase modulation layer including the plurality of modified refractive index regions, the phase modulation layer is configured such that a center of gravity G1 of the modified refractive index region positioned inside a unit constituent region R(x, y) is away from a lattice point O(x, y) which is the center of the unit constituent region R(x, y) and a vector is directed in a specific direction toward the center of gravity G1 from the lattice point O(x, y) in the unit constituent region R(x, y) on the X-Y plane specified by a coordinate component x (an integer between one and M1) in an X-axis direction and a coordinate component y (an integer between one and N1) in a Y-axis direction.

Advantageous Effects of Invention

According to the method for manufacturing the light emitting device and the semiconductor light emitting element of the present embodiment, the zero-order light can be removed from the output of the S-iPM laser.

BRIEF DESCRIPTION OF DRAWINGS

FIGS. 7A and 7B are views for describing points to be noted when the rotation angle distribution is obtained from a result of Fourier transform of the optical image and the arrangement of the modified refractive index regions is determined.

FIG. 11 is a graph illustrating a relationship between the distance r(a) and the S/N ratio in the first configuration of the phase modulation layer.

FIG. 14 is a graph illustrating a relationship between the distance r(a) and the S/N ratio in the second configuration of the phase modulation layer.

FIGS. 28A and 28B are plan views illustrating examples of the shape in the X-Y plane of the modified refractive index region.

FIG. 30 is a view illustrating a specific stacked structure of the laser element (an example of the semiconductor light emitting element according to the present embodiment) illustrated in FIG. 1.

FIG. 33 is a view illustrating a specific stacked structure of a laser element according to a first modification.

DESCRIPTION OF EMBODIMENTS

Figure 1:
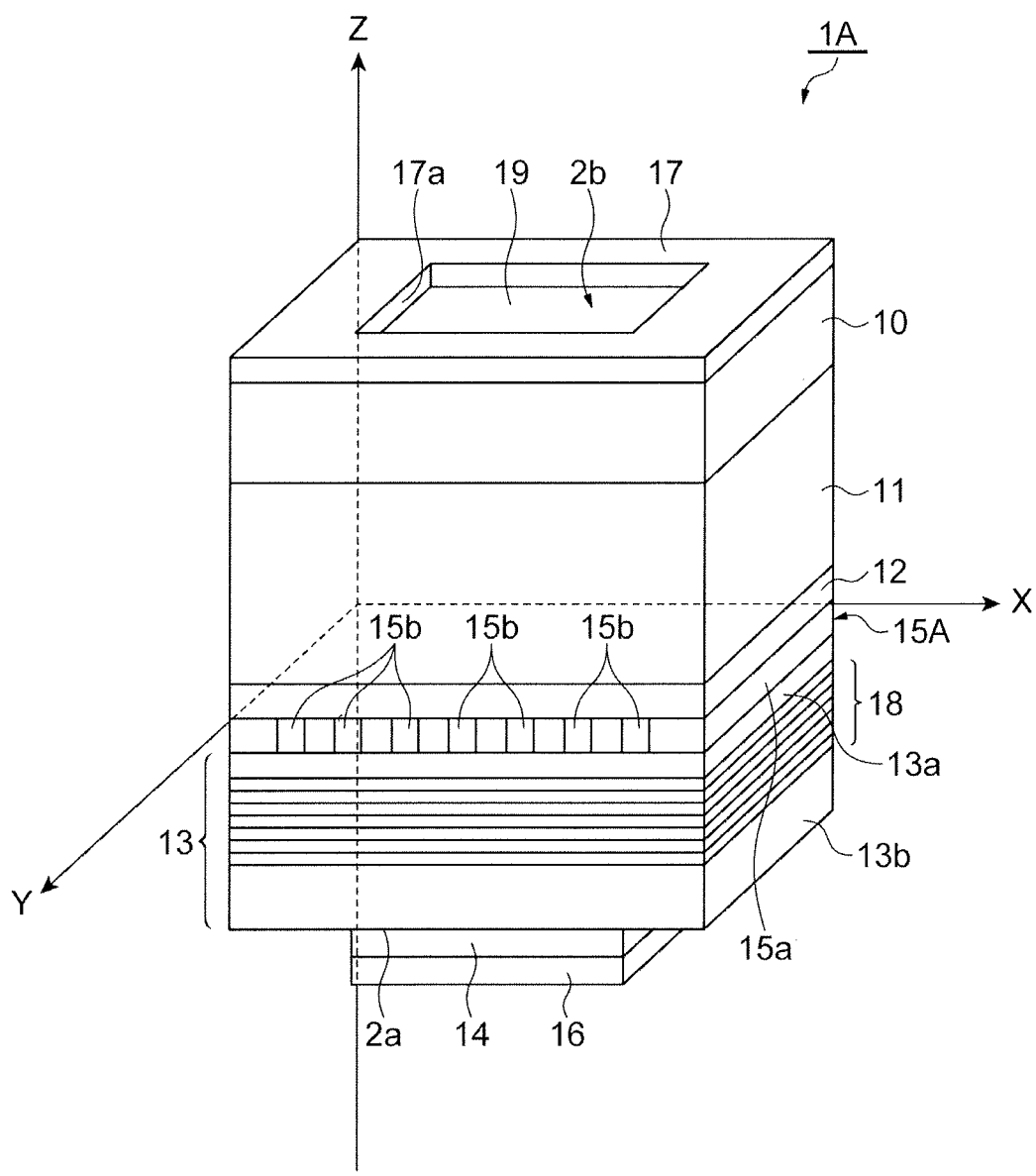
FIG. 1 is a perspective view illustrating a configuration of a laser element as an example of a semiconductor light emitting element according to the present embodiment.

[Description of Embodiments of Invention of Present Application]

First, the content of an embodiment of the invention of the present application will be individually listed and described.

(1) An aspect of a semiconductor light emitting element according to the present embodiment includes an active layer, a pair of cladding layers constituted by first and second cladding layers, and a phase modulation layer, has a light emission surface and a light reflection surface arranged to face the light emission surface, and outputs an optical image of an arbitrary shape along a normal direction of the light emission surface and an inclined direction having predetermined inclination and spread angle with respect to the normal direction. The active layer is arranged between the light emission surface and the light reflection surface. The first cladding layer is arranged between the light emission surface and the active layer. The second cladding layer is arranged between the light reflection surface and the active layer. The phase modulation layer is arranged between the first cladding layer and the active layer or between the second cladding layer and the active layer. In addition, any of the first and second cladding layers includes a distributed Bragg reflector layer which has a transmission characteristic with respect to the specific optical image outputted along the inclined direction and has a reflection characteristic with respect to zero-order light outputted along the normal direction. The phase modulation layer has a base layer and a plurality of modified refractive index regions each of which has a refractive index different from a refractive index of the base layer. Further, a method for manufacturing the semiconductor light emitting element and a light emitting device including the same includes: a first step of providing a lower cladding layer (a second cladding layer constituting a pair of cladding layers) on a substrate; a second step of providing an active layer on the second cladding layer; a third step of providing an upper cladding layer (a first cladding layer constituting a pair of cladding layers) on the active layer; and a fourth step of providing a phase modulation layer between the lower cladding layer and the active layer or between the active layer and the upper cladding layer, the fourth step being executed between the first step and the second step or between the second step and the third step.

In particular, in the method for manufacturing the semiconductor light emitting element according to the present embodiment and the light emitting device including the same, the phase modulation layer is configured such that each of the plurality of modified refractive index regions is individually arranged at a specific position. Specifically, as a first precondition, a virtual square lattice constituted by M1(an integer of one or more)×N1 (an integer of one or more) unit constituent regions R each having a square shape is set on an X-Y plane in an XYZ orthogonal coordinate system defined by a Z axis coinciding with the normal direction and the X-Y plane including X and Y axes orthogonal to each other and coinciding with one surface of the phase modulation layer including the plurality of modified refractive index regions. At this time, the phase modulation layer is configured such that a center of gravity G1 of the modified refractive index region positioned inside a unit constituent region R(x, y) is away from a lattice point O(x, y) which is the center of the unit constituent region R(x, y) and a vector is directed in a specific direction toward the center of gravity G1 from the lattice point O(x, y) in the unit constituent region R(x, y) on the X-Y plane specified by a coordinate component x (an integer between one and M1) in an X-axis direction and a coordinate component y (an integer between one and N1) in a Y-axis direction.

(2) As an aspect of the present embodiment, when the second cladding layer includes a distributed Bragg reflector layer, it is preferable that an interval between the distributed Bragg reflector layer and the phase modulation layer be appropriately set. Specifically, the interval between the distributed Bragg reflector layer and the phase modulation layer is set such that a component of zero-order light traveling toward the light emission surface after being reflected by the distributed Bragg reflector layer and a component of zero-order light directly traveling from the phase modulation layer toward the light emission surface weaken each other.

(3) In the semiconductor light emitting element having the above-described structure, the phase modulation layer optically coupled to the active layer includes the base layer and the plurality of modified refractive index regions each of which is embedded in the base layer and has a refractive index different from the refractive index of the base layer. In addition, in the unit constituent region R(x, y) constituting the virtual square lattice, the center of gravity G1 of the corresponding modified refractive index region is arranged to be away from the lattice point O(x, y). Further, the direction of the vector from the lattice point O to the center of gravity G1 is individually set for each of the unit constituent regions R. In such a configuration, a phase of a beam changes depending on the direction of the vector from the lattice point O to the center of gravity G1 of the corresponding modified refractive index region, that is, an angular position around a lattice point of the center of gravity G1 of the modified refractive index region. In this manner, it is possible to control the phase of the beam outputted from each of the modified refractive index regions only by changing a position of the center of gravity of the modified refractive index region and to control a beam pattern (a beam group forming an optical image) formed as a whole into a desired shape according to the present embodiment. At this time, the lattice point in the virtual square lattice may be positioned outside the modified refractive index region and the lattice point may be positioned inside the modified refractive index region.

That is, the semiconductor light emitting element applicable to the present embodiment is an S-iPM laser, and can output the optical image of the arbitrary shape along the normal direction of the light emission surface and the inclined direction having the predetermined inclination and spread angle with respect to the normal direction (for example, a beam pattern formed on a two-dimensional plane).

(4) In addition, the distributed Bragg reflector layer is a layer having the transmission characteristic with respect to the specific optical image outputted along the inclined direction and having the reflection characteristic with respect to the zero-order light outputted along the normal direction of the light emission surface as described above. In such a configuration in which the distributed Bragg layer is provided in the first cladding layer, that is, the configuration in which the distributed Bragg reflector layer is provided between a layer region constituted by the active layer and the phase modulation layer and the light emission surface, the specific optical image out of the light outputted from the phase modulation layer passes through the distributed Bragg reflector layer and easily reaches the light emission surface. On the other hand, the zero-order light is shielded by the distributed Bragg reflector layer and hardly reaches the light emission surface. Therefore, the zero-order light can be suitably removed from the output of the semiconductor light emitting element according to the semiconductor light emitting element of the present embodiment.

Conversely, the distributed Bragg layer may be provided in the second cladding layer. That is, the distributed Bragg layer is positioned between a layer region constituted by the active layer and the phase modulation layer and the light reflection surface. In this case, it is important to set an interval between the distributed Bragg reflector layer and the phase modulation layer. Specifically, the interval between the distributed Bragg reflector layer and the phase modulation layer is set such that a component of zero-order light traveling toward the light emission surface after being reflected by the distributed Bragg reflector layer and a component of zero-order light directly traveling from the phase modulation layer toward the light emission surface weaken each other. As a result, the specific optical image out of the light outputted from the phase modulation layer easily reaches the light emission surface. On the other hand, zero-order light components weaken each other due to the interference between a component reflected by the light reflection surface and a component reflected by the phase modulation layer and hardly reach the light emission surface. Therefore, the zero-order light can be suitably removed from the output of the semiconductor light emitting element according to the semiconductor light emitting element of the present embodiment.

(5) As an aspect of the present embodiment, where a lattice constant of the virtual square lattice (substantially corresponding to a lattice interval) is a, it is preferable that a distance r between the center of gravity G1 of the modified refractive index region positioned inside the unit constituent region R(x, y) and the lattice point O(x, y) satisfy 0≤r≤0.3a. In addition, an original image (an optical image before two-dimensional inverse Fourier transform) represented by the beam pattern emitted from the light emission surface of the semiconductor light emitting element preferably includes at least one of a spot, a straight line, a cross, a line drawing, a lattice pattern, a photograph, a stripe pattern, computer graphics, and a character, for example.

Figure 36:
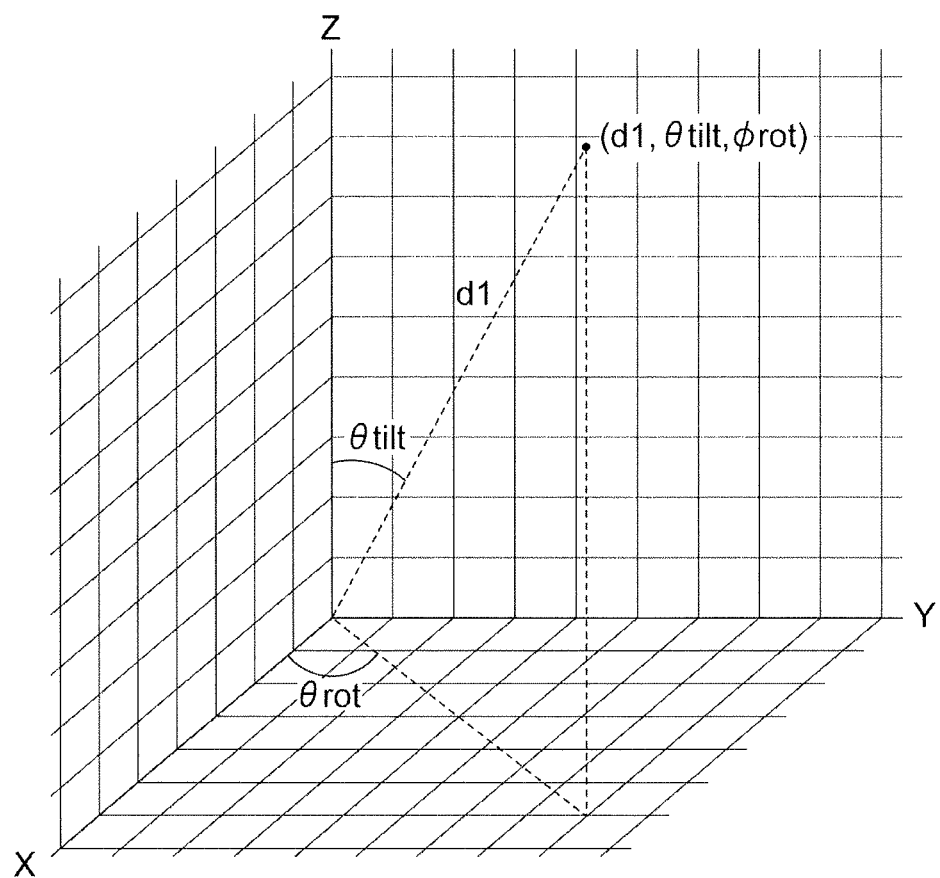
FIG. 36 is a graph for describing coordinate transformation from spherical coordinates (d1, $\theta_{tilt}$, $\theta_{rot}$) to coordinates (x, y, z) in an XYZ orthogonal coordinate system.

(6) In an aspect of the present embodiment, as a second precondition in addition to the first precondition, coordinates (x, y, z) in the XYZ orthogonal coordinate system are assumed to satisfy a relationship expressed by the following Formulas (1) to (3) with respect to spherical coordinates (d1, $\theta_{tilt}$, $\theta_{rot}$)) defined by a radius length d1, a tilt angle $\theta_{tilt}$ from the Z axis, and a rotation angle $\theta_{rot}$ from the X axis specified on the X-Y plane as illustrated in FIG. 36. Incidentally, FIG. 36 is a view for describing coordinate transformation from spherical coordinates (d1, $\theta_{tilt}$, $\theta_{rot}$) to coordinates (x, y, z) in the XYZ orthogonal coordinate system, and a designed optical image on a predetermined plane set in the XYZ orthogonal coordinate system, which is the real space, is expressed by the coordinates (x, y, z). When the beam pattern corresponding to the optical image outputted from the semiconductor light emitting element is a set of bright spots directed in directions defined by the angles $\theta_{tilt}$ and $\theta_{rot}$, the angles $\theta_{tilt}$ and $\theta_{rot}$ are converted to a coordinate value $k_x$, which is a normalized wave number defined by the following Formula (4), on a Kx axis corresponding to the X axis and a coordinate value $k_y$, which is a normalized wave number defined by the following Formula (5), on a Ky axis corresponds to the Y axis and orthogonal to the Kx axis. The normalized wave number means a wave number normalized assuming that a wave number corresponding to the lattice interval of the virtual square lattice is 1.0. At this time, in the wave number space defined by the Kx axis and the Ky axis, a specific wave number range including the beam pattern corresponding to the optical image is constituted by M2(an integer of one or more)×N2 (an integer of one or more) image regions FR each having a square shape. Incidentally, the integer M2 does not need to coincide with the integer M1. Likewise, the integer N2 does not need to coincide with the integer N1. In addition, Formulas (4) and (5) are disclosed in, for example, Y. Kurosaka et al., "Effects of non-lasing band in two-dimensional photonic-crystal lasers clarified using omnidirectional band structure," Opt. Express 20, 21773-21783 (2012).

$$x = d1 \sin \theta_{tilt} \cos \theta_{rot} \quad (1)$$

$$y = d1 \sin \theta_{tilt} \sin \theta_{rot} \quad (2)$$

$$z = d1 \cos \theta_{tilt} \quad (3)$$

$$k_x = \frac{a}{\lambda} \sin \theta_{tilt} \cos \theta_{rot} \quad (4)$$

$$k_y = \frac{a}{\lambda} \sin \theta_{tilt} \sin \theta_{rot} \quad (5)$$

a: Lattice constant of virtual square lattice
λ: Oscillation wavelength of semiconductor light emitting element As a third precondition, in the wave number space, a complex amplitude F(x, y), which is obtained by two-dimensional inverse Fourier transform of each image region FR($k_x$, $k_y$), specified by the coordinate component $k_x$ (an integer of from 0 to M2−1) in the Kx-axis direction and the coordinate component $k_y$ (an integer of from 0 to N2−1) in the Ky-axis direction to the unit constituent region R(x, y) on the X-Y plane specified by the coordinate component x (an integer of from one to M1) in the X-axis direction and the coordinate component y (an integer of from one to N1) in the Y-axis direction, is given by the following Formula (6)

with j as an imaginary unit. In addition, this complex amplitude F(x, y) is defined by the following Formula (7) where an amplitude term is A(x, y) and a phase term is P(x, y). Further, as a fourth precondition, the unit constituent region R(x, y) is defined by an s axis and a t axis which are parallel to the X axis and the Y axis, respectively, and orthogonal to each other in the lattice point O(x, y) that is the center of the unit constituent region R(x, y).

$$F(x, y) = \sum_{k_x=0}^{M2-1} \sum_{k_x=0}^{N2-1} FR(k_x, k_y) \exp\left[j2\pi\left(\frac{k_x}{M2}x + \frac{k_y}{N2}y\right)\right] \quad (6)$$

$$F(x, y) = A(x, y) \times \exp[jP(x, y)] \quad (7)$$

Under the above first to fourth preconditions, the phase modulation layer is configured to satisfy the following first and second conditions. That is, the first condition is that any corresponding modified refractive index region among the plurality of modified refractive index regions is arranged in a state where the center of gravity G1 is away from the lattice point O(x, y) inside the unit constituent region R(x, y). In addition, the second condition is that the corresponding modified refractive index region is arranged inside the unit constituent region R(x, y) such that an angle $\varphi(x, y)$ formed by a line segment connecting the lattice point O(x, y) and the center of gravity G1 of the corresponding modified refractive index region and the s axis satisfies $\varphi(x, y) = C \times P(x, y) + B$ (here, C is a proportional constant, for example, $180°/\pi$, and B is an arbitrary constant, for example, 0) in a state where a line segment length r(x, y) from the lattice point O(x, y) to the center of gravity G1 of the corresponding modified refractive index region is set to a common value in each of M1×N1 unit constituent regions R.

In the semiconductor light emitting element having the above-described structure, the distance r between the center (lattice point) of each unit constituent region constituting the virtual square lattice and the center of gravity G1 of the corresponding modified refractive index region is preferably a constant value over the entire phase modulation layer in the phase modulation layer. As a result, where phase distribution (distribution of the phase term P(x, y) in the complex amplitude F(x, y) allocated to the unit constituent region R(x, y)) in the entire phase modulation layer is evenly distributed from zero to $2\pi$ (rad), the center of gravity of the modified refractive index region coincides with the lattice point of the unit constituent region R in the square lattice on average. Therefore, a two-dimensional distributed Bragg diffraction effect in the above phase modulation layer approximates to a two-dimensional distribution Bragg diffraction effect in the case of arranging the modified refractive index region on each lattice point of the square lattice, and thus, it is easy to form a standing wave and it is possible to expect reduction in threshold current for oscillation.

(6) A light emitting device according to the present embodiment may include, as an aspect, a plurality of semiconductor light emitting elements each of which has a light emission surface and a drive circuit that individually drives the plurality of semiconductor light emitting elements. Each of the plurality of semiconductor light emitting elements has the above structure as the semiconductor light emitting element according to the present embodiment. Specifically, each of the plurality of semiconductor light emitting elements has the light emission surface and a light reflection surface arranged to face the light emission surface, and outputs an optical image of an arbitrary shape along a normal direction of the light emission surface and an inclined direction having predetermined inclination and spread angle with respect to the normal direction. Further, each of the plurality of semiconductor light emitting elements includes an active layer, a pair of cladding layers sandwiching the active layer, and a phase modulation layer provided between the active layer and one of the pair of cladding layers and optically coupled to the active layer. In each of the plurality of semiconductor light emitting elements, the pair of cladding layers is constituted by a first cladding layer provided between the active layer and the light emission surface and a second cladding layer provided between the active layer and the light reflection surface. The phase modulation layer has a base layer and a plurality of modified refractive index regions each of which has a refractive index different from a refractive index of the base layer. In addition, any of the first cladding layer and the second cladding layer includes a distributed Bragg reflector layer which has a transmission characteristic with respect to the specific optical image outputted along the inclined direction and has a reflection characteristic with respect to zero-order light outputted along the normal direction.

Further, the phase modulation layer of each of the plurality of semiconductor light emitting elements is configured as follows. That is, in each of the plurality of semiconductor light emitting elements, a virtual square lattice constituted by M1(an integer of one or more)×N1 (an integer of one or more) unit constituent regions R each having a square shape is set on an X-Y plane in an XYZ orthogonal coordinate system defined by a Z axis coinciding with the normal direction and the X-Y plane including X and Y axes orthogonal to each other and coinciding with one surface of the phase modulation layer including the plurality of modified refractive index regions. At this time, the phase modulation layer is configured such that a center of gravity G1 of the modified refractive index region positioned inside a unit constituent region R(x, y) is away from a lattice point O(x, y) which is the center of the unit constituent region R(x, y) and a vector is directed in a specific direction toward the center of gravity G1 from the lattice point O(x, y) in the unit constituent region R(x, y) on the X-Y plane specified by a coordinate component x (an integer between one and M1) in an X-axis direction and a coordinate component y (an integer between one and N1) in a Y-axis direction. In this manner, the light emitting device includes the plurality of semiconductor light emitting elements which is individually driven, and can extract only a desired optical image from each of the semiconductor light emitting elements. Accordingly, it is possible to suitably realize head-up display or the like by appropriately driving required elements regarding a module in which the semiconductor light emitting elements corresponding to a plurality of patterns are arranged in advance.

(7) As an aspect of the present embodiment, each of the plurality of semiconductor light emitting elements preferably includes any of a semiconductor light emitting element outputting an optical image of a red wavelength range, a semiconductor light emitting element outputting an optical image of a blue wavelength range, and a semiconductor light emitting element outputting an optical image of a green wavelength range. In this case, color head-up display or the like can be suitably realized.

As described above, each aspect listed in [Description of Embodiment of Invention of Present Application] can be applied to each of the remaining aspects or to all the combinations of these remaining aspects.

[Details of Embodiment of Invention of Present Application]

Hereinafter, specific structures of the semiconductor light emitting element and light emitting device according to the present embodiment will be described in detail with reference to the attached drawings. Incidentally, the invention is not limited to these various examples, but is illustrated by the claims, and equivalence of and any modification within the scope of the claims are intended to be included therein. In addition, the same elements in the description of the drawings will be denoted by the same reference signs, and redundant descriptions will be omitted.

FIG. 1 is a perspective view illustrating a configuration of a laser element 1A as an example of the semiconductor light emitting element according to the present embodiment. In FIG. 1, an XYZ orthogonal coordinate system is defined with an axis extending along a stacking direction (thickness direction) of layers constituting the laser element 1A as a Z axis. The laser element 1A has a light reflection surface 2a and a light emission surface 2b that face each other in the Z direction. Incidentally, the XYZ orthogonal coordinate system is defined by the Z axis and an X-Y plane which includes X and Y axes orthogonal to each other and coincides with one surface of a phase modulation layer 15A including modified refractive index regions 15b, which is a plane orthogonal to the Z axis. The laser element 1A is an S-iPM laser that forms a standing wave along the X-Y plane and outputs a phase-controlled plane wave in a Z-axis direction. As will be described later, the laser element 1A outputs a two-dimensional optical image of an arbitrary shape along an inclined direction having predetermined inclination and spread angle with respect to a direction perpendicular to the light emission surface 2b (that is, the Z-axis direction).

The laser element 1A includes an active layer 12 provided on a semiconductor substrate 10, a pair of cladding layers 11 and 13 provided on the semiconductor substrate 10 so as to sandwich the active layer 12, and a contact layer 14 provided on a central region of the cladding layer 13. The semiconductor substrate 10, the active layer 12, the cladding layers 11 and 13, and the contact layer 14 are comprised of a compound semiconductor, for example, a GaAs-based semiconductor, an InP-based semiconductor, or a nitride-based semiconductor. An energy band gap of the cladding layer 11 and an energy band gap of the cladding layer 13 are larger than an energy band gap of the active layer 12. A thickness direction (stacking direction) of the semiconductor substrate 10, the active layer 12, the cladding layers 11 and 13, and the contact layer 14 coincides with the Z-axis direction.

The laser element 1A further includes the phase modulation layer 15A. In the present, embodiment, the phase modulation layer 15A is provided between the active layer 12 and the cladding layer 13. Therefore, with a layer region constituted by the active layer 12 and the phase modulation layer 15A as a reference, the cladding layer (first cladding layer) 11 is positioned between the layer region and the light emission surface 2b, and the cladding layer (second cladding layer) 13 is positioned between a layer region and the light reflection surface 2a in the example of FIG. 1. Incidentally, a light guide layer may be provided at least one of between the active layer 12 and the cladding layer 13 and between the active layer 12 and the cladding layer 11 if necessary. When the light guide layer is provided between the active layer 12 and the cladding layer 13, the phase modulation layer 15A is provided between the cladding layer 13 and the light guide layer. The thickness direction of the phase modulation layer 15A coincides with the Z-axis direction.

Figure 2:
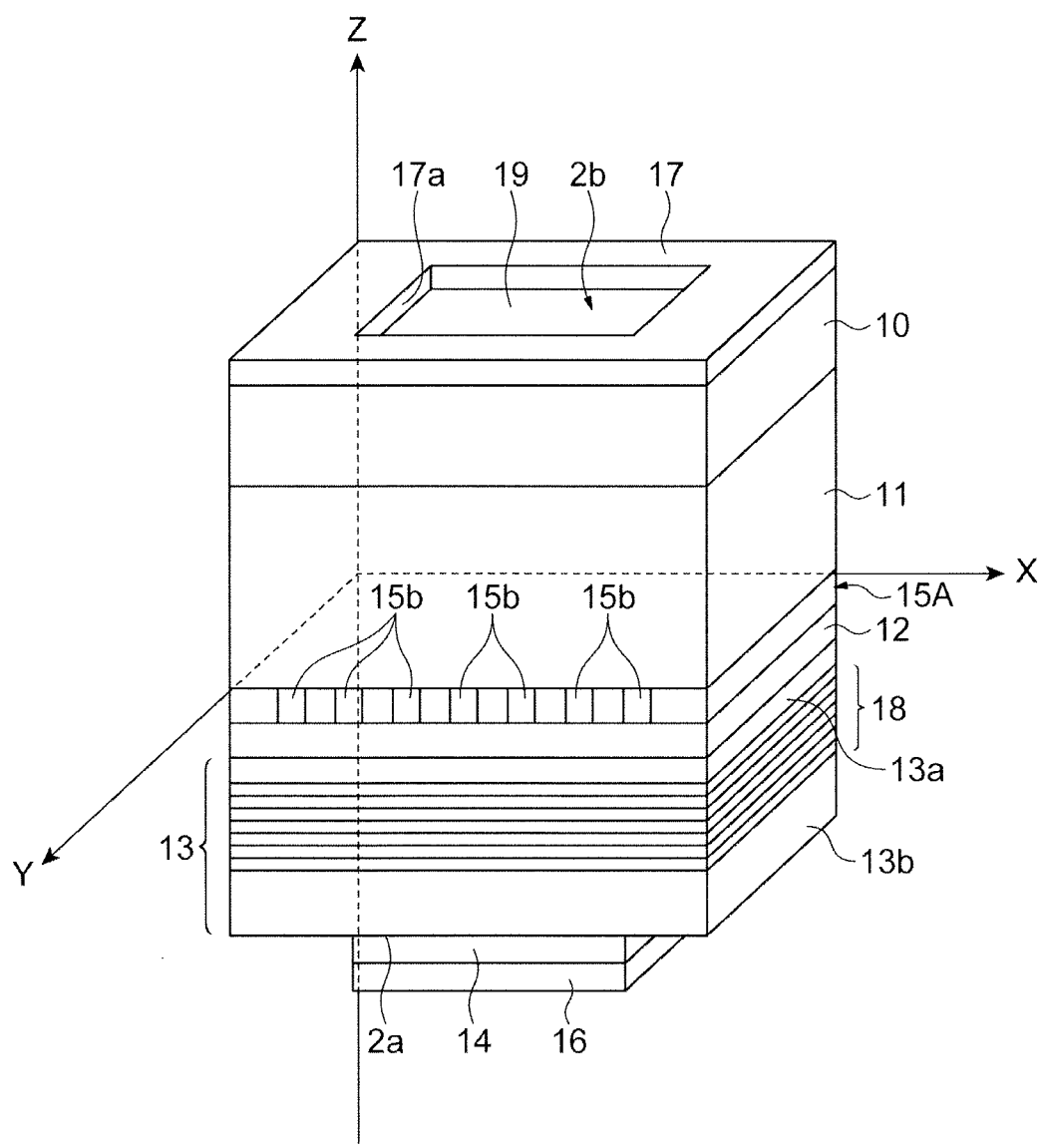
FIG. 2 is a view illustrating a modification relating to an arrangement of a phase modulation layer.

As illustrated in FIG. 2, the phase modulation layer 15A may be provided between the cladding layer 11 and the active layer 12. Further, when the light guide layer is provided between the active layer 12 and the cladding layer 11, the phase modulation layer 15A is provided between the cladding layer 11 and the light guide layer. Even in the example of FIG. 2, with a layer region constituted by the active layer 12 and the phase modulation layer 15A as a reference, the cladding layer (first cladding layer) 11 is positioned between the layer region and the light emission surface 2b, and the cladding layer (second cladding layer) 13 is positioned between a layer amount region and the light reflection surface 2a.

The phase modulation layer 15A is constituted by a base layer 15a comprised of a first refractive index medium and the plurality of modified refractive index regions 15b comprised of a second refractive index medium having a refractive index different from that of the first refractive index medium and existing inside the base layer 15a. The plurality of modified refractive index regions 15b include a structure in which a position of a center of gravity is shifted from a substantially periodic structure. Where an effective refractive index of the phase modulation layer 15A is n, a wavelength $\lambda_0$ (=a×n, a is a lattice interval) selected by the phase modulation layer 15A is included within an emission wavelength range of the active layer 12. The phase modulation layer (diffraction grating layer) 15A can select the wavelength $\lambda_0$ out of the emission wavelength of the active layer 12 and output light of the selected wavelength to the outside. The laser light incident into the phase modulation layer 15A forms a predetermined mode corresponding to the arrangement of the modified refractive index regions 15b in the phase modulation layer 15A, and is emitted to the outside from the surface (light emission surface 2b) of the laser element 1A as a laser beam having a desired pattern.

The laser element 1A further includes an electrode 16 provided on the contact layer 14 and an electrode 17 provided on a back surface of the semiconductor substrate 10. The electrode 16 is in ohmic contact with the contact layer 14, and the electrode 17 is in ohmic contact with the semiconductor substrate 10. Further, the electrode 17 has a rectangular opening 17a. A portion of the back surface of the semiconductor substrate 10 other than the electrode 17 (including the inside of the opening 17a) is covered with an anti-reflection film 19. The electrode 16 is comprised of, for example, Ti/Au, Ti/Pt/Au, or Cr/Au. The electrode 17 is comprised of, for example, AuGe/Au.

When a drive current is supplied between the electrode 16 and the electrode 17, recoupling between electrons and holes occurs in the active layer 12 (light emission). The electrons and holes contributing to the light emission and the generated light are efficiently confined between the lower cladding layer 11 and the upper cladding layer 13. The laser light emitted from the active layer 12 enters the inside of the phase modulation layer 15A and repeats scattering and diffraction to form the predetermined mode corresponding to a lattice structure inside the phase modulation layer 15A. A part of the laser light diffracted in the phase modulation layer 15A is reflected by the electrode 16 and emitted from the back surface of the semiconductor substrate 10 to the outside through the opening 17a. The remainder of the laser light that has entered the phase modulation layer 15A directly reaches the back surface of the semiconductor substrate 10 and is emitted from the back surface through the opening 17a to the outside. At this time, zero-order light included in the laser light is emitted along the Z axis (normal direction of the light emission surface 2b). On the other hand, signal light included in the laser light is emitted along the Z-axis direction (normal direction) and the direction having the predetermined spread angle with respect to the normal direction. The signal light forms the desired optical image (specific optical image), and the zero-order light is not used in the present embodiment.

As an example, the semiconductor substrate 10 is a GaAs substrate, and each of the cladding layer 11, the active layer 12, the phase modulation layer 15A, the cladding layer 13, and the contact layer 14 is a compound semiconductor layer constituted by elements contained in the group consisting of Ga, Al, and In of the group III element and As of the group V element. As a specific example, the cladding layer 11 is an AlGaAs layer, the active layer 12 has a multiple quantum well structure (barrier layer: AlGaAs/well layer: InGaAs), the base layer 15a of the phase modulation layer 15A is GaAs, the modified refractive index region 15b is a hole, the cladding layer 13 is an AlGaAs layer, and the contact layer 14 is a GaAs layer.

In AlGaAs, an energy band gap and a refractive index can be easily changed by changing a composition ratio of Al. In $AlXGa_{1-X}As$, where a composition ratio X of Al having a relatively small atomic radius is decreased (increased), the energy band gap having a positive correlation with the composition ratio decreases (increases). In addition, when In having a large atomic radius is mixed with GaAs to form InGaAs, the energy band gap decreases. That is, the Al composition ratio of the cladding layers 11 or 13 is larger than the Al composition ratio of the barrier layer (AlGaAs) of the active layer 12. The Al composition ratio of the cladding layer 11 is set to, for example, 0.2 to 1.0, and is 0.4 in one example. The Al composition ratio of the cladding layer 13 is set to be equal to or higher than the Al composition of the cladding layer 11, and is set to, for example, 0.2 to 1.0, for example, and is 0.7 in one example. The Al composition ratio of the barrier layer of the active layer 12 is set to be lower than the Al composition of the cladding layer, and is set to, for example, 0.1 to 0.4, and is 0.15 in one example.

In addition, as another example, the semiconductor substrate 10 is an InP substrate, and each of the cladding layer 11, the active layer 12, the phase modulation layer 15A, the cladding layer 13, and the contact layer 14 is configured using a compound semiconductor which is not made only of an element included in the group consisting of Ga, Al, and In of the group III element and As of the group V element, for example, an InP-based compound semiconductor. Specifically, the cladding layer 11 is an InP layer, the active layer 12 has a multiple quantum well structure (a barrier layer: GaInAsP/a well layer: GaInAsP), the base layer 15a of the phase modulation layer 15A is GaInAsP, the modified refractive index region 15b is a hole, the cladding layer 13 is an InP layer, and the contact layer 14 is a GaInAsP layer.

As still another example, the semiconductor substrate 10 is a GaN substrate, and each of the cladding layer 11, the active layer 12, the phase modulation layer 15A, the cladding layer 13, and the contact layer 14 is a compound semiconductor layer which is not made only of an element included in the group consisting of Ga, Al, and In of the group III element and As of the group V element, for example, an nitride-based compound semiconductor. As a specific example, the cladding layer 11 is an AlGaN layer, the active layer 12 has a multiple quantum well structure (a barrier layer: InGaN/a well layer: InGaN), the base layer 15a of the phase modulation layer 15A is GaN, the modified refractive index region 15b is a hole, the cladding layer 13 is an AlGaN layer, and the contact layer 14 is a GaN layer.

Incidentally, a conductivity type which is the same as that of the semiconductor substrate 10 is given to the cladding layer 11, and a conductivity type opposite to that of the semiconductor substrate 10 is given to the cladding layer 13 and the contact layer 14. In one example, the semiconductor substrate 10 and the cladding layer 11 are an n-type and the cladding layer 13 and the contact layer 14 are a p-type. Incidentally, an impurity concentration is, for example, $1\times10^{17}$ to $1\times10^{21}/cm^3$. The phase modulation layer 15A and the active layer 12 are intrinsic (i-type) which are not intentionally doped with any impurity, and an impurity concentration thereof is $1\times10^{15}/cm^3$ or less.

A thickness of the substrate 10 is 100 to 600 (µm), and is 150 (µm) in one example. A thickness of the cladding layer 11 is 1 to 3 (µm), and is 2 (µm) in one example. A thickness of the active layer 12 is 160 to 720 (nm), and is 225 (nm) in one example. A thickness of the phase modulation layer 15A is 100 to 300 (nm), and is 250 (nm) in one example. A thickness of the cladding layer 13 is 1 to 3 (µm), and is 2 (µm) in one example. A thickness of the contact layer 14 is 50 to 190 (nm), and is 100 (nm) in one example.

Although the modified refractive index region 15b is a hole in the above structure, the modified refractive index region 15b may be formed by embedding a semiconductor having a modified refractive index different from the base layer 15a in the hole. In such a case, for example, the hole of the base layer 15a may be formed by etching. The semiconductor may be embedded in the hole using a metal-organic chemical vapor deposition method, a sputtering method, or an epitaxial method. For example, when the base layer 15a is comprised of GaAs, the modified refractive index region 15b may be comprised of AlGaAs. In addition, the modified refractive index region 15b may be formed by embedding the semiconductor in the hole of the base layer 15a, and then, the same semiconductor as the modified refractive index region 15b may be further deposited thereon. Incidentally, when the modified refractive index region 15b is the hole, the hole may be filled with an inert gas such as argon, nitrogen, and hydrogen or air.

The anti-reflection film 19 is comprised of a dielectric single layer film such as silicon nitride (for example, SiN) and silicon oxide (for example, $SiO_2$), or a dielectric multilayer film. For example, it is possible to apply a layer, obtained by stacking two or more types of dielectric layers selected from a dielectric layer group consisting of titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), zirconium oxide ($ZrO_2$), and the like, as the dielectric multilayer film. For example, a film having a thickness of λ/4 as an optical film thickness for light of a wavelength λ is stacked.

Incidentally, it is also possible to deform an electrode shape and emit laser light from a surface of the contact layer 14. That is, when the opening 17a of the electrode 17 is not provided and the electrode 16 is open on the surface of the contact layer 14, the laser beam is emitted to the outside from the surface of the contact layer 14. In this case, the surface of the contact layer 14 serves as a light emission surface and the back surface of the semiconductor substrate 10 serves as a light reflection surface. The anti-reflection film is provided inside and around the opening of the electrode 16.

Figure 3:
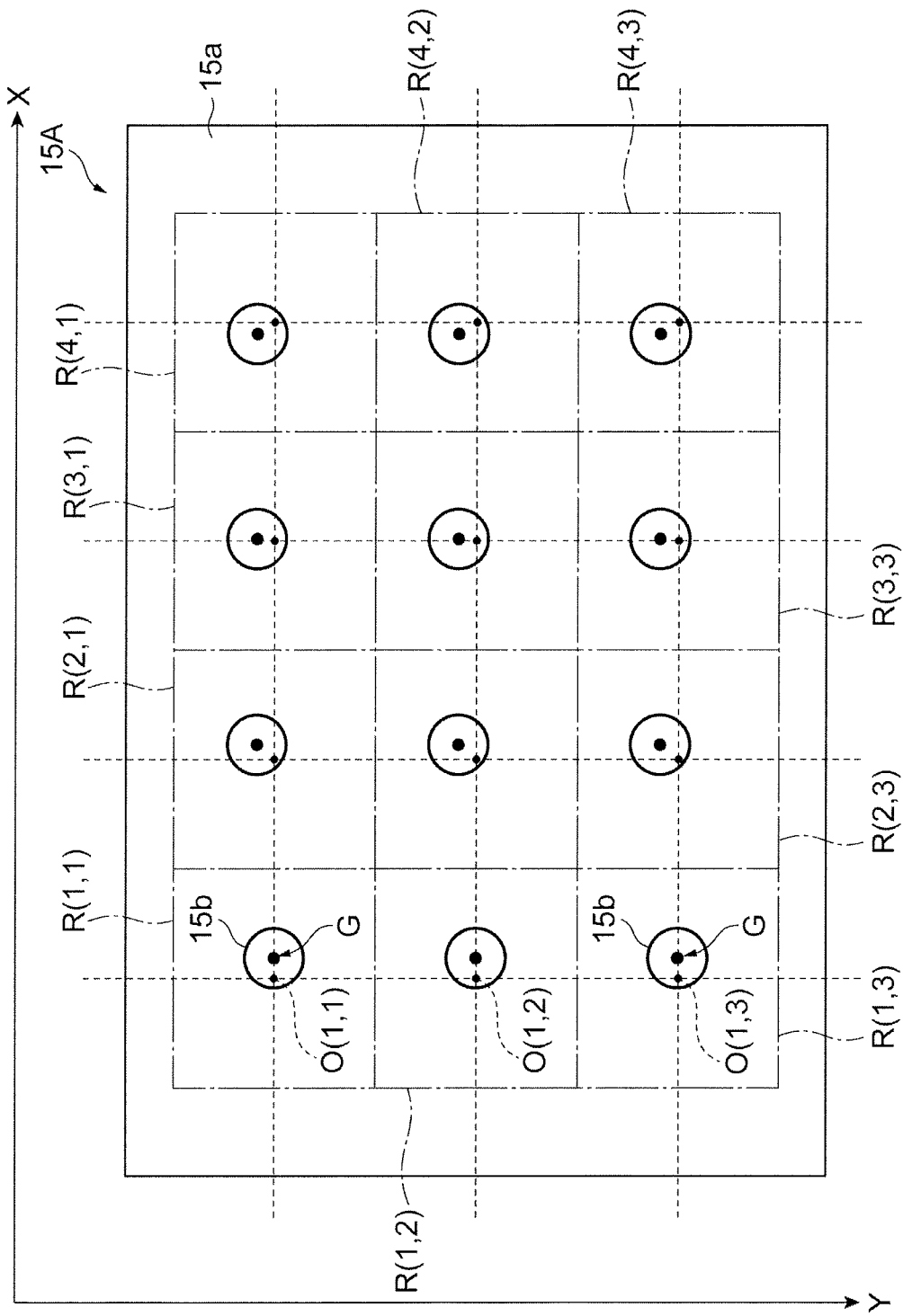
FIG. 3 is a plan view of the phase modulation layer.

FIG. 3 is a plan view of the phase modulation layer 15A. The phase modulation layer 15A includes the base layer 15a comprised of the first refractive index medium and the plurality of modified refractive index regions 15b comprised of the second refractive index medium having the refractive index different from that of the first refractive index medium. Here, a virtual square lattice in the X-Y plane is set in the phase modulation layer 15A. One side of the square lattice is parallel to the X axis and the other side is parallel to the Y axis. At this time, unit constituent regions R each of which has a square shape with a lattice point O of the square lattice as the center thereof can be set two-dimensionally over a plurality of columns along the X axis and a plurality of rows along the Y axis. A plurality of modified refractive index regions 15b is provided one by one in each of the unit constituent regions R. A planar shape of the modified refractive index region 15b is, for example, a circular shape. In each of the unit constituent regions R, a center of gravity G1 of the modified refractive index region 15b is arranged away from a lattice point O closest to the center of gravity G1. Specifically, the X-Y plane is a plane orthogonal to the thickness direction (Z axis) of the laser element 1A illustrated in FIGS. 1 and 2, and coincides with one surface of the phase modulation layer 15A including the modified refractive index region 15b. Each of the unit constituent regions R constituting the square lattice is specified by a coordinate component x (an integer of one or more) in an X-axis direction and a coordinate component y (an integer of one or more) in a Y-axis direction, and is expressed as a unit constituent region R(x, y). At this time, the center of the unit constituent region R(x, y), that is, a lattice point is represented by O(x, y). Incidentally, the lattice point O may be positioned outside the modified refractive index region 15b or may be included in the modified refractive index region 15b.

In the case where the modified refractive index region 15b is circular, area $S=\pi(D/2)^2$ where D is a diameter thereof. A ratio of the area S of the modified refractive index region 15b occupying within one unit constituent region R is defined as a filling factor (FF). The area of one unit constituent region R is equal to the area within one unit lattice of the virtual square lattice.

Figure 4:
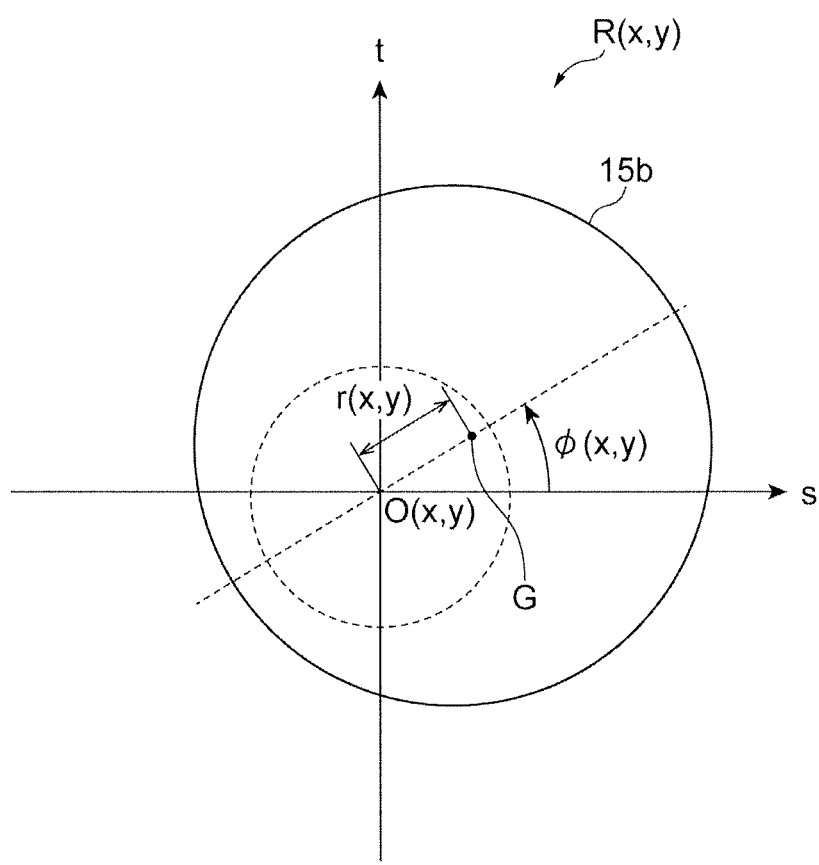
FIG. 4 is a view illustrating a positional relationship of modified refractive index regions in the phase modulation layer.

As illustrated in FIG. 4, the unit constituent region R(x, y) constituting the square lattice is defined by an s axis and a t axis orthogonal to each other at the lattice point O(x, y). Incidentally, the s axis is an axis parallel to the X axis and the t axis is an axis parallel to the Y axis. In this manner, an angle formed between a direction from the lattice point O(x, y) to the center of gravity G1 and the s axis is given as $\varphi(x, y)$ in the s-t plane defining the unit constituent region R(x, y). When the rotation angle $\varphi(x, y)$ is 0°, a direction of a vector connecting the lattice point O(x, y) and the center of gravity G1 coincides with a positive direction of the s axis. In addition, a length of the vector connecting the lattice point O(x, y) and the center of gravity G1 is given as r(x, y). As an example, r(x, y) is constant (over the entire phase modulation layer 15A) in the entire unit constituent region.

As illustrated in FIG. 3, in the phase modulation layer 15A, the rotation angle $\varphi(x, y)$ around the lattice point O(x, y) of the center of gravity G1 of the modified refractive index region 15b is independently set for each of the unit constituent regions R according to a desired optical image. The rotation angle $\varphi(x, y)$ has a specific value in the unit constituent region R(x, y), but is not necessarily expressed by a specific function. That is, the rotation angle $\varphi(x, y)$ is determined based on a phase term of a complex amplitude obtained by converting the desired optical image into a wave number space and performing two-dimensional inverse Fourier transform of a constant wave number range of the wave number space. Incidentally, reproducibility of the beam pattern is improved by applying an iterative algorithm such as the Gerchberg-Saxton (GS) method which is generally used in hologram generation calculation at the time of obtaining complex amplitude distribution (complex amplitude of each of the unit constituent regions R) from the desired optical image.

Figure 5:
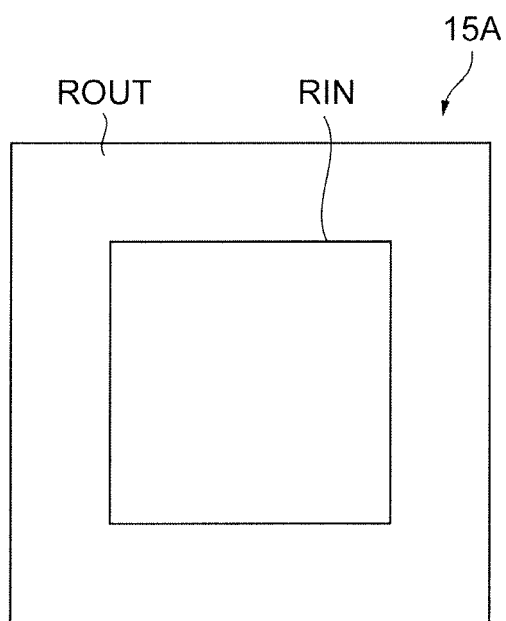
FIG. 5 is a plan view illustrating an example in which a refractive index substantially periodic structure of FIG. 3 is applied only within a specific region of the phase modulation layer.

FIG. 5 is a plan view illustrating an example in which a refractive index substantially periodic structure of FIG. 3 is applied only within a specific region of the phase modulation layer. In the example illustrated in FIG. 5, a substantially periodic structure (for example, the structure of FIG. 3) configured to emit a target beam pattern is formed inside a square inner region RIN. On the other hand, a perfect circular modified refractive index region whose position of center of gravity coincides with a lattice point position of the square lattice is arranged in an outer region ROUT surrounding the inner region RIN. For example, the filling factor FF in the outer region ROUT is set to 12%. In addition, a lattice interval of the square lattice that is virtually set is the same (=a) both within the inner region RIN and inside the outer region ROUT. Alternatively, a one-dimensional diffraction grating periodically arranged in a direction perpendicular to a side surrounding the inner region RIN may be provided in the outer region ROUT. Incidentally, a current is supplied to the inner region RIN and is not supplied to the outer region ROUT. In this structure, light is distributed also in the outer region ROUT so that there is an advantage that it is possible to suppress the occurrence of high-frequency noise (so-called window function noise) caused by an abrupt change in light intensity in the peripheral portion of the inner region RIN. In addition, light leakage in an in-plane direction can be suppressed, and reduction in threshold current can be expected.

Figure 6:
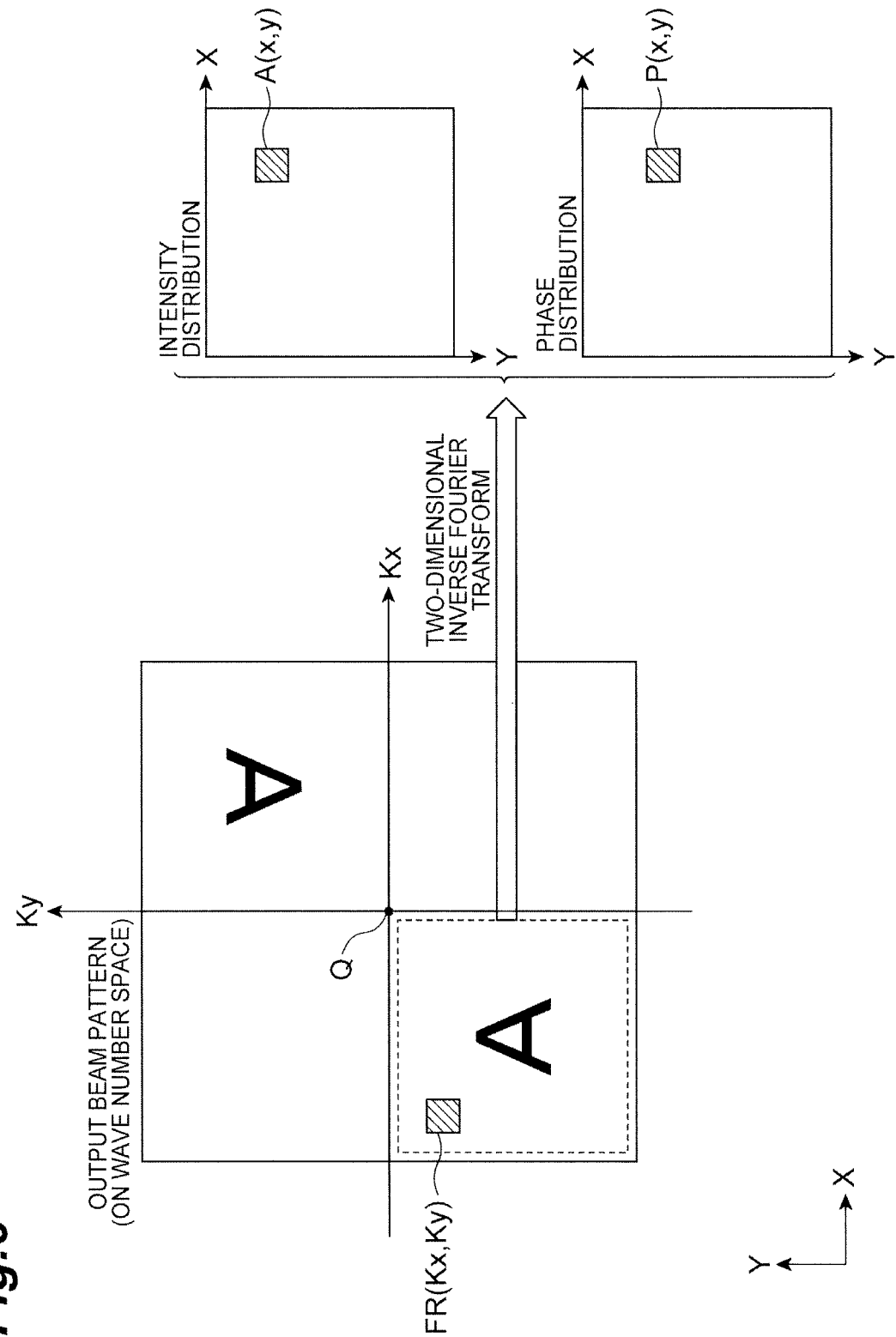
FIG. 6 is a view for describing a relationship between an optical image obtained by forming an output beam pattern of a laser element and a rotation angle distribution in the phase modulation layer.

FIG. 6 is a view for describing a relationship between an optical image corresponding to a beam pattern outputted from the laser element 1A and distribution of the rotation angle $\varphi(x, y)$ in the phase modulation layer 15A. Specifically, a Kx-Ky plane, obtained by converting plane on which an optical image is formed by a beam emitted from the laser element 1A (an installation plane of a designed optical image expressed by coordinates (x, y, z) in the XYZ orthogonal coordinate system) onto the wave number space, is considered. A Kx axis and a Ky axis defining the Kx-Ky plane are orthogonal to each other, each of which is associated with an angle with respect to the normal direction when a beam emission direction is swung from the Z-axis direction to the horizontal direction orthogonal to the Z-axis direction by the above Formulas (1) to (5). It is assumed that a specific region including a beam pattern corresponding to an optical image is constituted b y M2(an integer of one or more)×N2 (an integer of one or more) image regions FR each having a square shape on the Kx-Ky plane. In addition, it is assumed that the virtual square lattice set on the X-Y plane on the phase modulation layer 15A is constituted by M1 (an integer of one or more)×N1 (an integer of one or more) unit constituent regions R. Incidentally, the integer M2 does not need to coincide with the integer M1. Likewise, the integer N2 does not need to coincide with the integer N1. At this time, a complex amplitude F(x, y) in the unit constituent region R(x, y), which is obtained by two-dimensional inverse Fourier transform of each image region FR($k_x$, $k_y$) on the Kx-Ky plane, specified by the coordinate component $k_x$ (an integer of from 0 to M2−1) in the Kx-axis direction and the coordinate component $k_y$ (an integer of from 0 to N2−1) in the Ky-axis direction, to the unit constituent region R(x, y) specified by the coordinate component x (an integer of from one to M1) in the X-axis direction and the coordinate component y (an integer of from one to N1) in the Y-axis direction, is given by the following Formula (8) with j as an imaginary unit.

$$F(x, y) = \sum_{k_x=0}^{M2-1} \sum_{k_x=0}^{N2-1} FR(k_x, k_y) \exp\left[j2\pi\left(\frac{k_x}{M2}x + \frac{k_y}{N2}y\right)\right] \quad (8)$$

In addition, where an amplitude term is A(x, y) and a phase term is P(x, y) in the unit constituent region R(x, y), the complex amplitude F(x, y) is defined by the following Formula (9).

$$F(x,y)=A(x,y)\times\exp[jP(x,y)] \quad (9)$$

As illustrated in FIG. 6, the distribution of the amplitude term A(x, y) at the complex amplitude F(x, y) of the unit constituent region R(x, y) corresponds to intensity distribution on the X-Y plane in a range of coordinate components of x=1 to M1 and y=1 to N1. In addition, the distribution of the phase term P(x, y) at the complex amplitude F(x, y) in the unit constituent region R(x, y) corresponds to phase distribution on the X-Y plane in the range of x=1 to M1 and y=1 to N1. The rotation angle φ(x, y) in the unit constituent region R(x, y) is obtained from P(x, y) as will be described later, and the distribution of the rotation angle φ(x, y) of the unit constituent region R(x, y) corresponds to rotation angle distribution on the X-Y plane in the range of coordinate components of x=1 to M1 and y=1 to N1.

Incidentally, a center Q of an output beam pattern on the Kx-Ky plane is positioned on an axis perpendicular to the main surface (light emission surface 2b) of the semiconductor substrate 10, and four quadrants with the center Q as the origin are illustrated in FIG. 6. Although a case where an optical image is obtained in the first quadrant and the third quadrant is illustrated in FIG. 6 as an example, it is also possible to obtain images in the second quadrant and the fourth quadrant, or in all the quadrants. In the present embodiment, optical images point-symmetric with respect to the origin can be obtained as illustrated in FIG. 6. FIG. 6 illustrates a case where, for example, a character "A" in the third quadrant and a pattern obtained by rotating the character "A" by 180° in the first quadrant are obtained. Incidentally, rotationally-symmetric optical images (for example, a cross, a circle, a double circle, or the like) are observed as one optical image in an overlapping manner.

The beam pattern (optical image) outputted from the laser element 1A becomes an optical image corresponding to the designed optical image (original image) expressed by at least one of a spot, a straight line, a cross, a line drawing, a lattice pattern, a photograph, a stripe pattern, computer graphics (CG), and a character. Here, the rotation angle φ(x, y) of the modified refractive index region 15b in the unit constituent region R(x, y) is determined by the following procedure in order to obtain a desired optical image.

As described above, the center of gravity G1 of the modified refractive index region 15b is arranged inside the unit constituent region R(x, y) in the state of being away from the lattice point O(x, y) by r(x, y). At this time, the modified refractive index region 15b is arranged inside the unit constituent region R(x, y) such that the rotation angle φ(x, y) satisfies the following relationship.

$$\varphi(x,y)=C\times P(x,y)+B$$

C: a proportional constant, for example, 180°/π
B: an arbitrary constant, for example, 0

Incidentally, the proportional constant C and the arbitrary constant B are the same for all the unit constituent regions R.

That is, when it is desired to obtain the desired optical image, the optical image formed on the Kx-Ky plane projected onto the wave number space may be subjected to two-dimensional inverse Fourier transform to the unit constituent region R(x, y) on the X-Y plane on the phase modulation layer 15A and the rotation angle φ(x, y) corresponding to the phase term P(x, y) of the complex amplitude F(x, y) may be applied to the modified refractive index region 15b arranged inside the unit constituent region R(x, y). Incidentally, a far-field image after two-dimensional inverse Fourier transform of the laser beam can take various shapes such as a single spot shape or a plurality of spot shapes, an annular shape, a linear shape, a character shape, a double annular shape, and a Laguerre Gaussian beam shape. Incidentally, the beam pattern is represented by wave number information in the wave number space (on the Kx-Ky plane), and thus, the two-dimensional inverse Fourier transform may be performed after being once converted the wave number information in the case of a bit map image or the like in which a target beam pattern is represented by two-dimensional position information.

As a method for obtaining the intensity distribution and the phase distribution from the complex amplitude distribution on the X-Y plane obtained by the two-dimensional inverse Fourier transform, for example, the intensity distribution (distribution of the amplitude term A(x, y) on the X-Y plane) can be calculated by using the abs function of numerical analysis software "MATLAB" of MathWorks, Inc., and the phase distribution (distribution of the phase terms P(x, y) on the X-Y plane) can be calculated by using the angle function of MATLAB.

Here, a description will be given regarding points to be noted in the case of calculation using general discrete two-dimensional inverse Fourier transform or fast two-dimensional inverse Fourier transform when the rotation angle distribution (distribution of the rotation angle φ(x, y) on the X-Y plane) is obtained from a result of the two-dimensional inverse Fourier transform of the optical image to determine the arrangement of the modified refractive index regions 15b in each of the unit constituent regions R. When an optical image (designed optical image on a predetermined plane represented by coordinates (x, y, z) in the XYZ orthogonal coordinate system) not subjected to the two-dimensional inverse Fourier transform is divided into four quadrants such as A1, A2, A3, and A4 as in the original image illustrated in FIG. 7A, the obtained beam pattern becomes a pattern illustrated in FIG. 7B. That is, a pattern in which a pattern obtained by rotating the first quadrant by 180° and a pattern of the third quadrant of FIG. 7A overlap each other appears in the first quadrant of the beam pattern of FIG. 7B. A pattern in which a pattern obtained by rotating the second quadrant by 180° of FIG. 7A and a pattern in the fourth quadrant in FIG. 7A overlap each other appears in the second quadrant of the beam pattern of FIG. 7B. A pattern in which a pattern obtained by rotating the third quadrant by 180° of FIG. 7A and a pattern in the first quadrant in FIG. 7A overlap each other appears in the third quadrant of the beam pattern of FIG. 7B. A pattern in which a pattern obtained by rotating the fourth quadrant by 180° of FIG. 7A and a pattern in the second quadrant in FIG. 7A overlap each other appears in the fourth quadrant of the beam pattern of FIG. 7B.

Therefore, when a pattern having a value only in the first quadrant is used as the optical image (original optical image)

not subjected to the two-dimensional inverse Fourier transform, the pattern in the first quadrants of the original optical image appears in the third quadrant of the obtained beam pattern. On the other hand, a pattern obtained by rotating the first quadrant of the original optical image by 180° appears in the first quadrant of the obtained beam pattern.

Next, a preferable distance between the center of gravity G1 of the modified refractive index region 15b and the lattice point O of the virtual square lattice will be described. When the lattice interval of the square lattice is a, the filling factor FF of the modified refractive index region 15b is given as $S/a^2$. Here, S is the area of the modified refractive index region 15b on the X-Y plane, and is given as $S=\pi \times (D/2)^2$ using a diameter D of a perfect circle in the case of the perfect circular shape, for example. In addition, in the case of a square shape, $S=LA^2$ is given using a length LA of one side of the square.

Figure 8A:
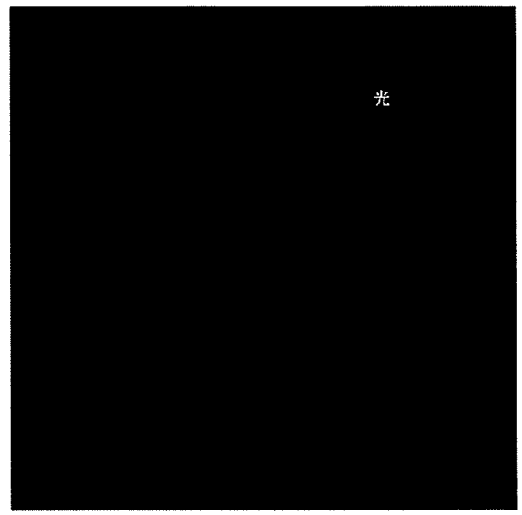
FIG. 8A is an image of an original pattern common to three specific configurations of the phase modulation layer.
Figure 8B:
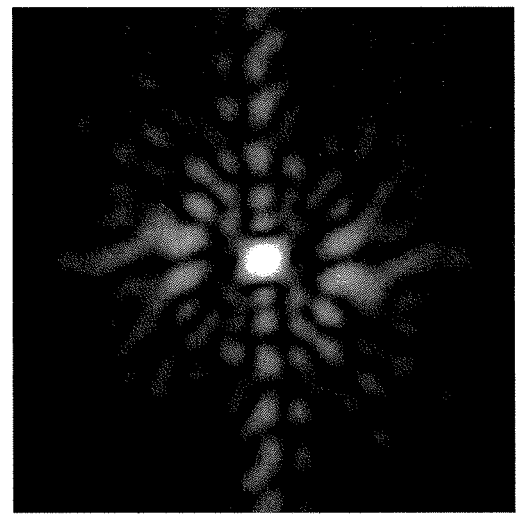
FIG. 8B is an intensity distribution extracted by two-dimensional Fourier transform of FIG. 8A.
Figure 8C:
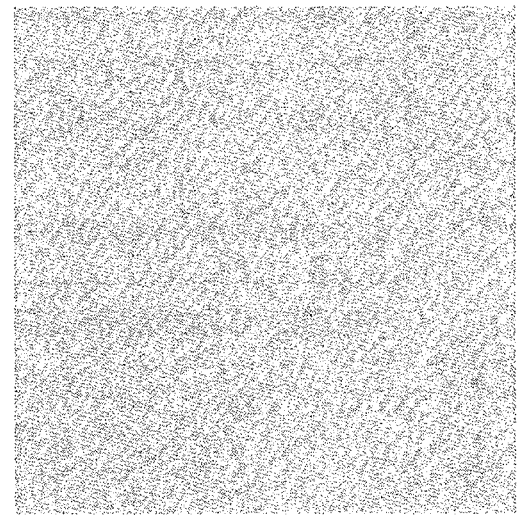
FIG. 8C is a phase distribution extracted by two-dimensional Fourier transform of FIG. 8A.

Hereinafter, specific three configurations of the phase modulation layer 15A will be described. FIG. 8A is an image of an original pattern common to each configuration, and is a character of "light" constituted by 704×704 pixels. At this time, the character "light" exists in the first quadrant, and there is no pattern in the second quadrant to the fourth quadrant. FIG. 8B is an image obtained by performing two-dimensional Fourier transform of FIG. 8A and extracting the intensity distribution, is constituted by 704×704 elements. FIG. 8C is an image obtained by performing two-dimensional Fourier transform of FIG. 8A and extracting the phase distribution, is constituted by 704×704 elements. This also corresponds to the angular distribution at the same time, and FIG. 8C illustrates the distribution of phases from 0 to $2\pi$ (rad) depending on the light and shade of the color. A part with a black color represents a phase of 0 (rad).

Figure 9A:
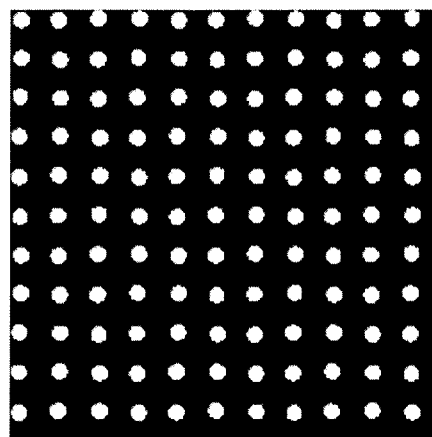
FIG. 9A is an image illustrating an arrangement of modified refractive index regions in a phase modulation layer of a first configuration so as to realize the phase distribution illustrated in FIG. 8C.
Figure 9B:
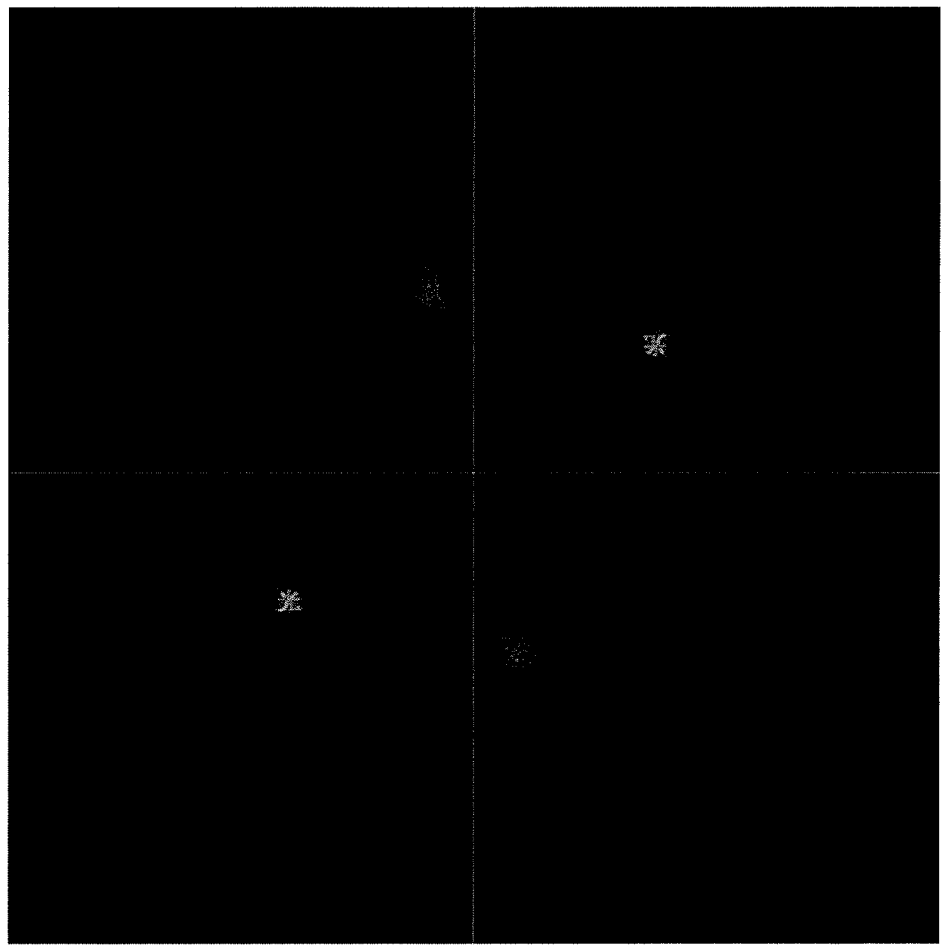
FIG. 9B is a predicted beam pattern obtained by Fourier transform of the entire modified refractive index region.

FIG. 9A is an image illustrating the arrangement of the modified refractive index regions 15b in the phase modulation layer 15A of a first configuration so as to realize the phase distribution illustrated in FIG. 8C, and the base layer 15a is illustrated in black and the modified refractive index region 15b is illustrated in white. In this first configuration, 704×704 modified refractive index regions 15b exist, a planar shape of the modified refractive index region 15b is a perfect circle, and the lattice interval a of the square lattice is 284 nm. FIG. 9A illustrates a case where the diameter D of the modified refractive index region 15b is 111 nm and the distance r between the lattice point O of the virtual square lattice and the center of gravity G1 of the modified refractive index region 15b is 8.52 nm. At this time, the filling factor FF of the modified refractive index region 15b is 12%, and the distance r is 0.03a. FIG. 9B illustrates a predicted beam pattern obtained by Fourier transform of the entire modified refractive index region.

Figure 10:
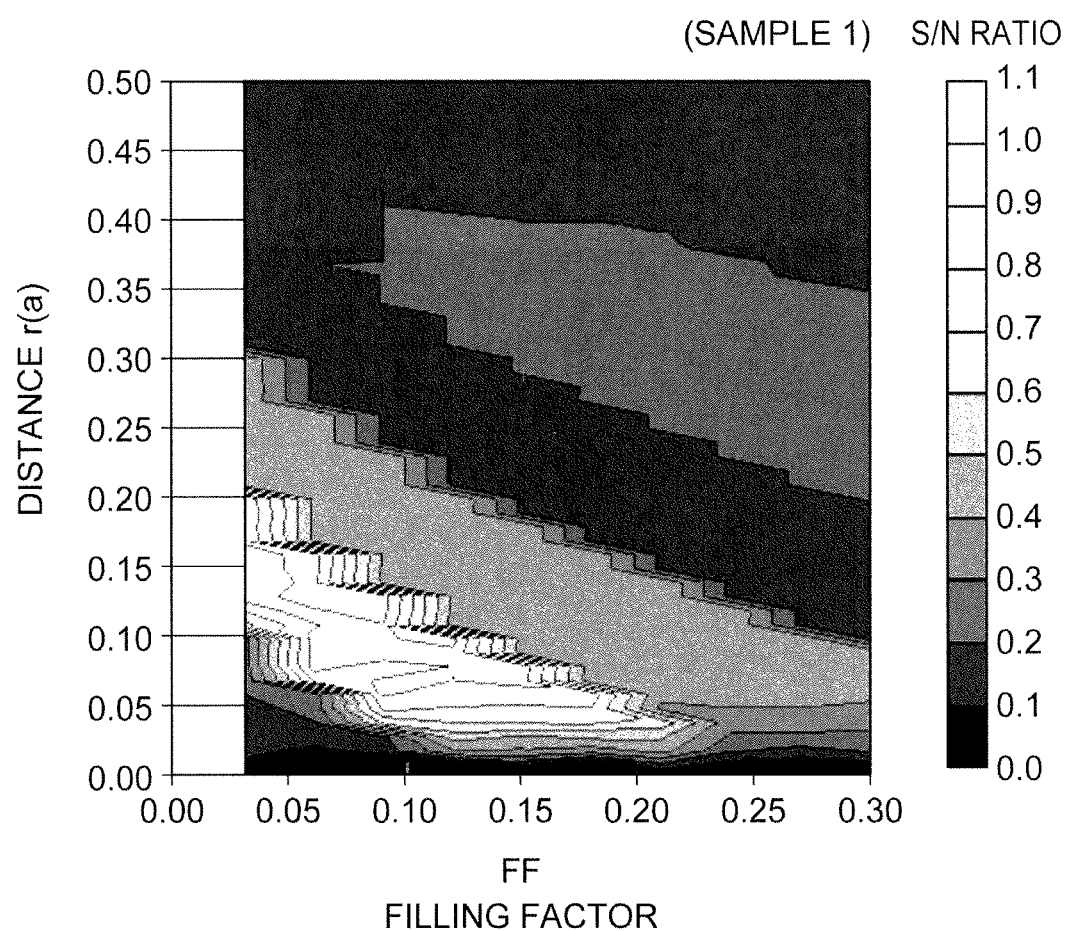
FIG. 10 is a graph illustrating an S/N ratio of an output beam pattern according to a relationship between a filling factor and a distance r(a) in the first configuration of the phase modulation layer.

FIG. 10 is a graph illustrating an S/N ratio of an output beam attern according to a relationship between the filling factor FF and a distance r(a) in the first configuration (Sample 1) of the phase modulation layer 15A, that is, an intensity ratio of a desired beam pattern and noise. FIG. 11 is a graph illustrating a relationship between the distance r(a) and the S/N ratio in the case of FIG. 10 (Sample 1 of the first configuration). In the case of this structure, it is understood that S/N is higher when the distance r is 0.3a or smaller than that of the case where the distance r exceeds 0.3a, and S/N is higher when the distance r is 0.01a or longer than that of the case where the distance r is zero. In particular, there is a peak of the S/N ratio within these numerical ranges with reference to FIG. 11. That is, the distance r is preferably 0<r≤0.3a, more preferably 0.01a≤r≤0.3a, and still more preferably 0.03a≤r≤0.25a from the viewpoint of improving the S/N ratio. Meanwhile, a beam pattern can be obtained even when r is smaller than 0.01a although the S/N ratio is small.

Figure 12A:
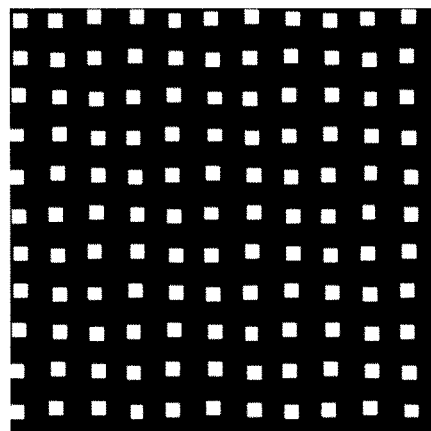
FIG. 12A is an image illustrating an arrangement of modified refractive index regions in a phase modulation layer of a second configuration so as to realize the phase distribution illustrated in FIG. 8C.
Figure 12B:
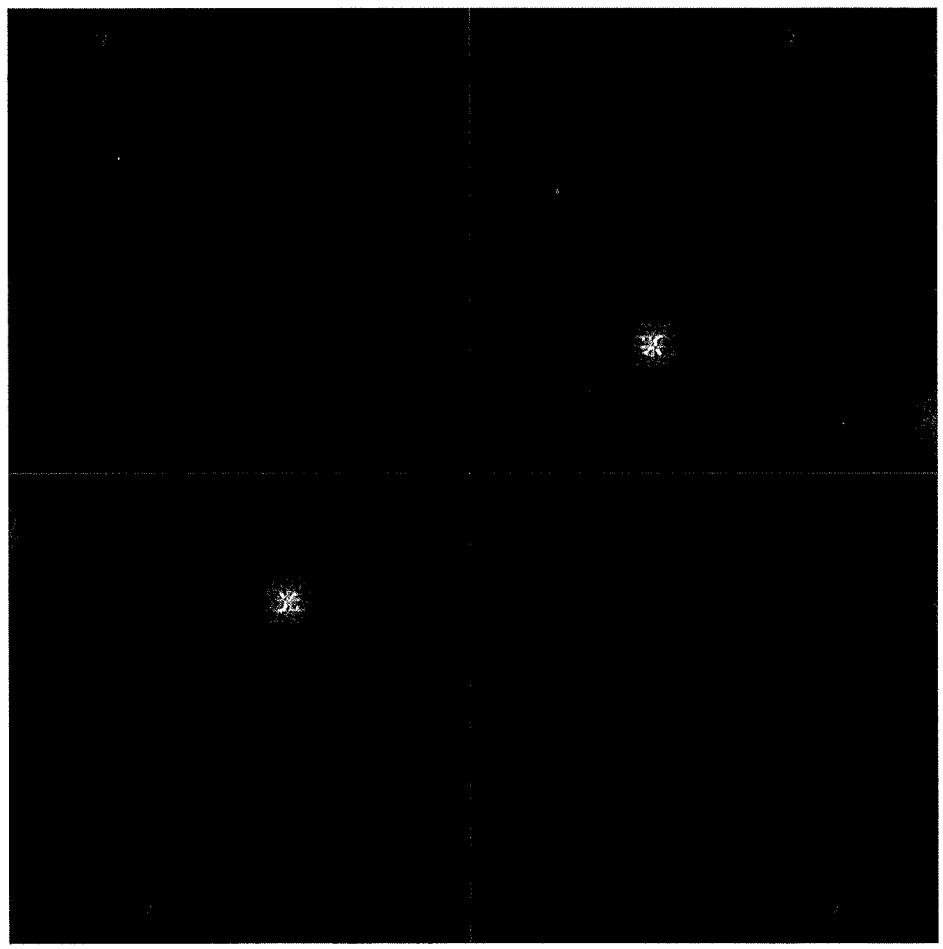
FIG. 12B is a predicted beam pattern obtained by Fourier transform of the entire modified refractive index region.

FIG. 12A is an image (a second configuration of the phase modulation layer 15A) illustrating the arrangement of the modified refractive index regions 15b so as to realize the phase distribution illustrated in FIG. 8C, and the base layer 15a is illustrated in black and the modified refractive index region 15b is illustrated in white. In this second configuration, a planar shape of the modified refractive index region 15b is a square, the number of the modified refractive index regions 15b, and the lattice interval a of the square lattice are set to be the same as those in the first configuration. FIG. 12A illustrates a case where the length L of one side of the modified refractive index region 15b is 98.4 nm, and the distance r between the lattice point O of the virtual square lattice and the center of gravity G1 of the modified refractive index region 15b is 8.52 nm. At this time, the filling factor FF of the modified refractive index region 15b is 12%, and the distance r is 0.03a. FIG. 12B illustrates a predicted beam pattern obtained by Fourier transform of the entire modified refractive index region.

Figure 13:
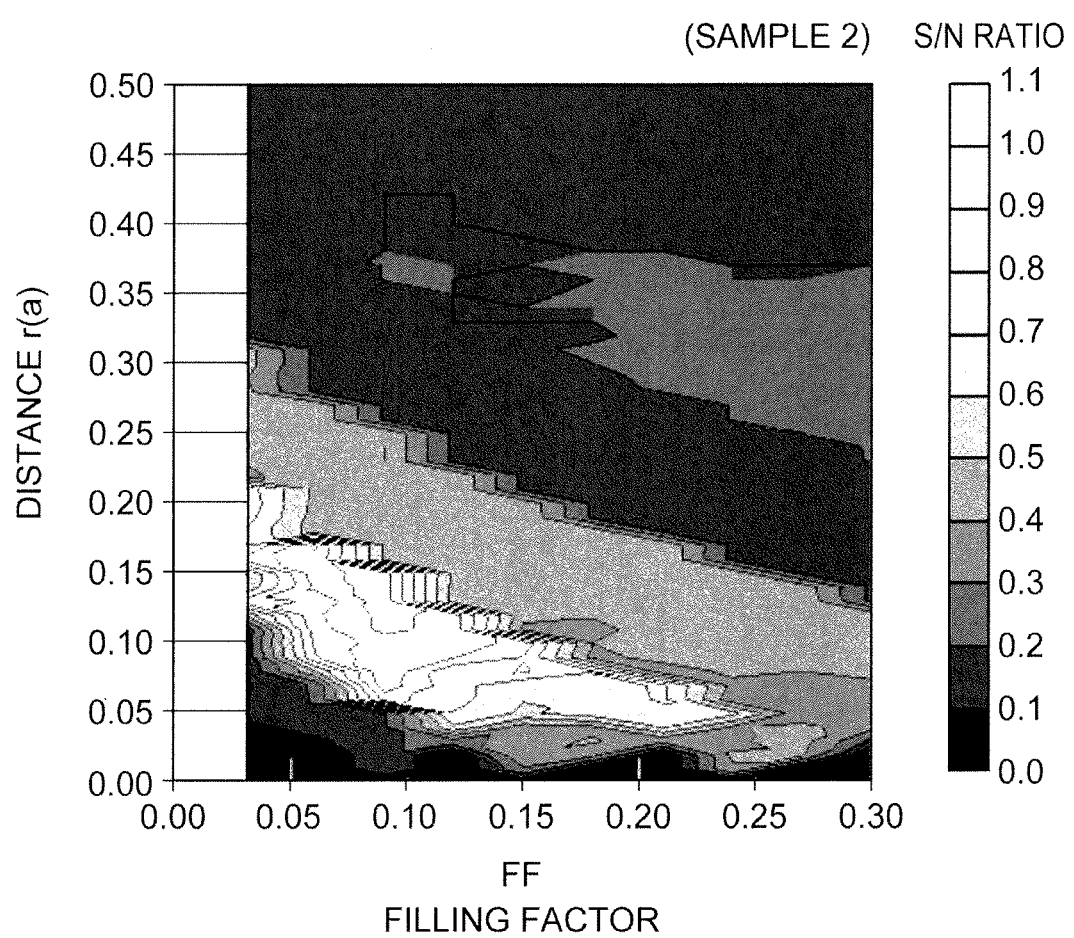
FIG. 13 is a graph illustrating an S/N ratio of an output beam pattern according to a relationship between a filling factor and a distance r(a) in the second configuration of the phase modulation layer.

FIG. 13 is a graph illustrating an S/N ratio of an output beam pattern according to a relationship between the filling factor FF and a distance r(a) in the second configuration (Sample 2) of the phase modulation layer, that is, an intensity ratio of a desired beam pattern and noise. FIG. 14 is a graph illustrating a relationship between the distance r(a) and the S/N ratio in the case of FIG. 13 (Sample 2 of the second configuration). Even in the case of this structure, it is understood that S/N is higher when the distance r is 0.3a or smaller than that of the case where the distance r exceeds 0.3a, and S/N is higher when the distance r is 0.01a or longer than that of the case where the distance r is zero. In particular, there is a peak of the S/N ratio within these numerical ranges with reference to FIG. 14. That is, the distance r is preferably 0<r≤0.3a, more preferably 0.01a≤r≤0.3a, and still more preferably 0.03a≤r≤0.25a from the viewpoint of improving the S/N ratio. Meanwhile, a beam pattern can be obtained even when r is smaller than 0.01a although the S/N ratio is small.

Figure 15A:
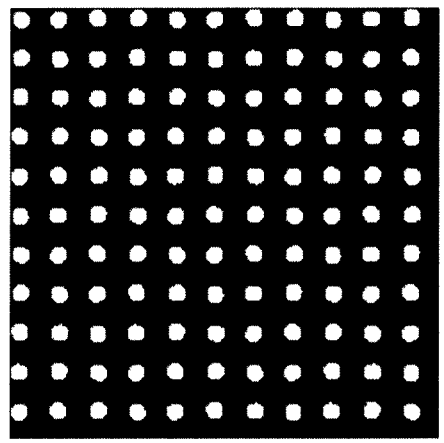
FIG. 15A is an image illustrating an arrangement of modified refractive index regions in a phase modulation layer of a third configuration so as to realize the phase distribution illustrated in FIG. 8C.
Figure 15B:
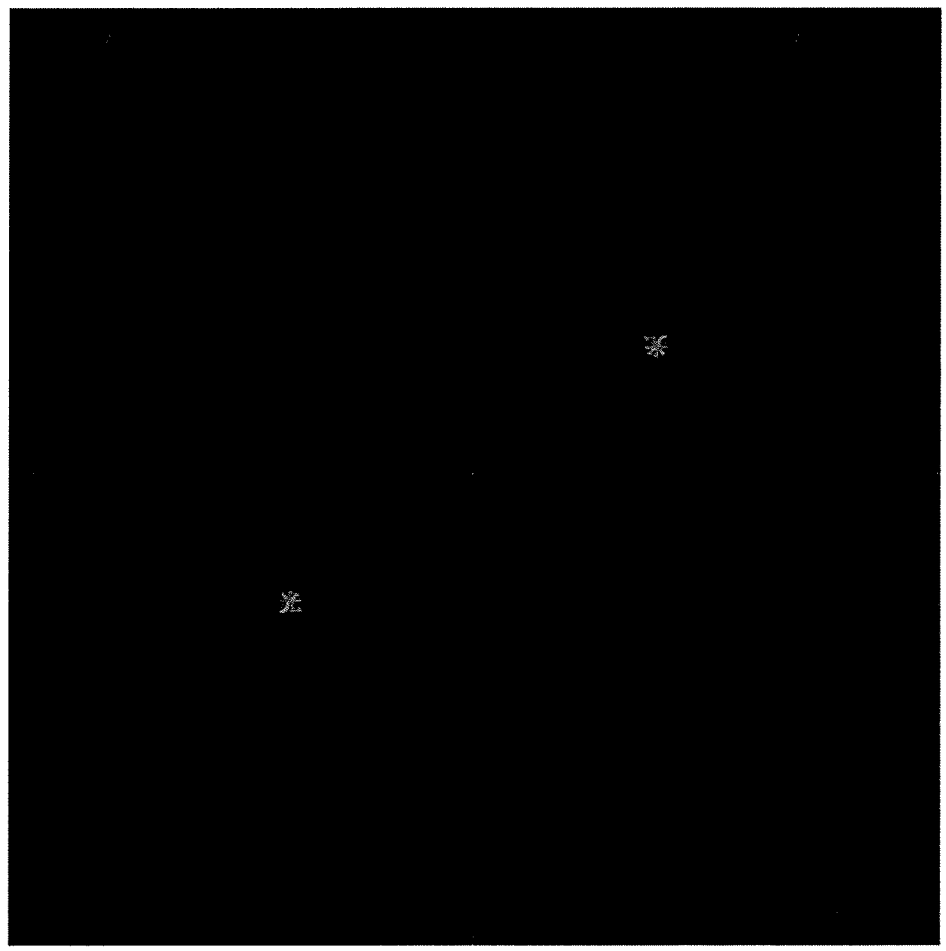
FIG. 15B a predicted beam pattern obtained by Fourier transform of the entire modified refractive index region.

FIG. 15A is an image (a third configuration of the phase modulation layer 15A) illustrating the arrangement of the modified refractive index regions 15b so as to realize the phase distribution illustrated in FIG. 8C, and the base layer 15a is illustrated in black and the modified refractive index region 15b is illustrated in white. In the third configuration, a planar shape of the modified refractive index region 15b is a shape obtained by overlapping two perfect circles in the state of being shifted from each other, and the center of gravity of one perfect circle is made to coincide with the lattice point O. The number of the modified refractive index regions 15b and the lattice interval a of the square lattice are set to be the same as those in the first configuration. FIG. 15A illustrates a case where diameters of the two perfect circles are both 111 nm and the distance r between the center of gravity of the other perfect circle and the lattice point O is 14.20 nm. At this time, the filling factor FF of the modified refractive index region 15b is 12%, and the distance r is 0.05a. FIG. 15B illustrates a predicted beam pattern obtained by Fourier transform of the entire modified refractive index region.

Figure 16:
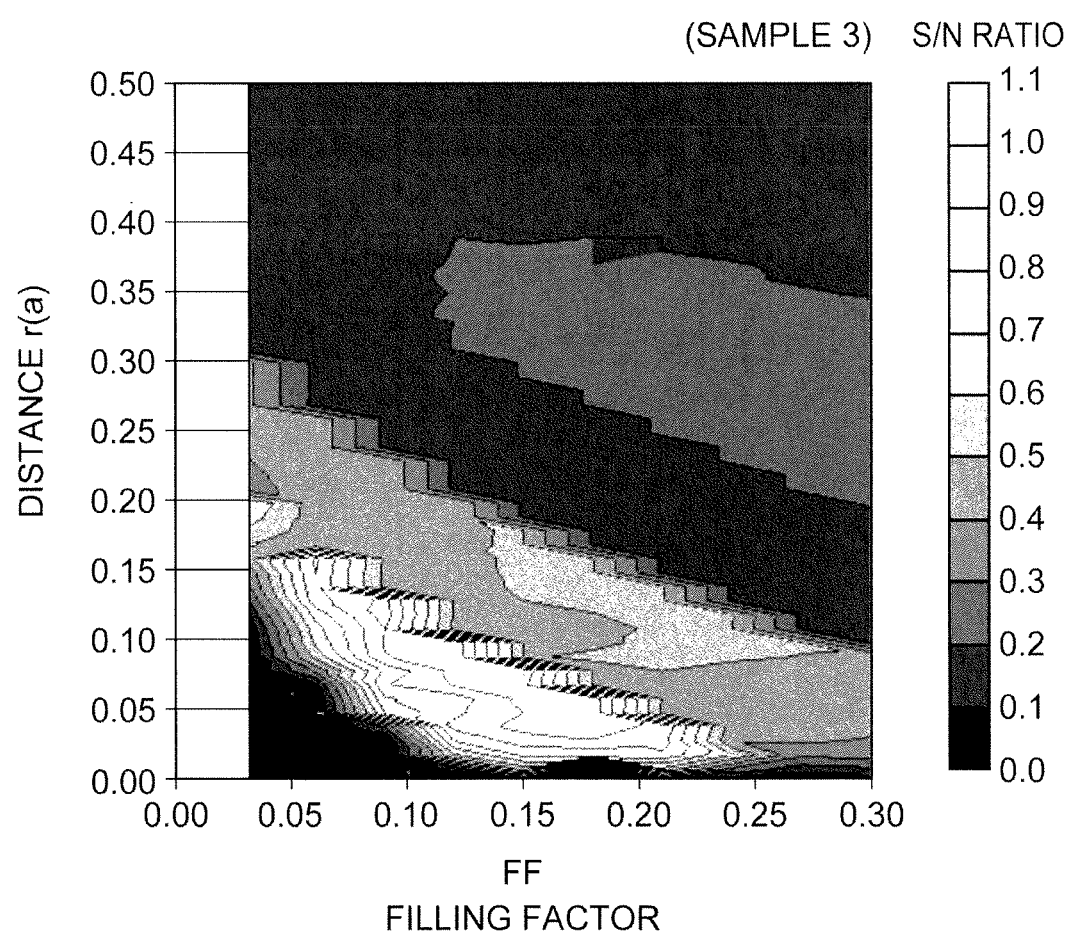
FIG. 16 is a graph illustrating an S/N ratio of an output beam pattern according to a relationship between a filling factor and a distance r(a) in the third configuration of the phase modulation layer.
Figure 17:
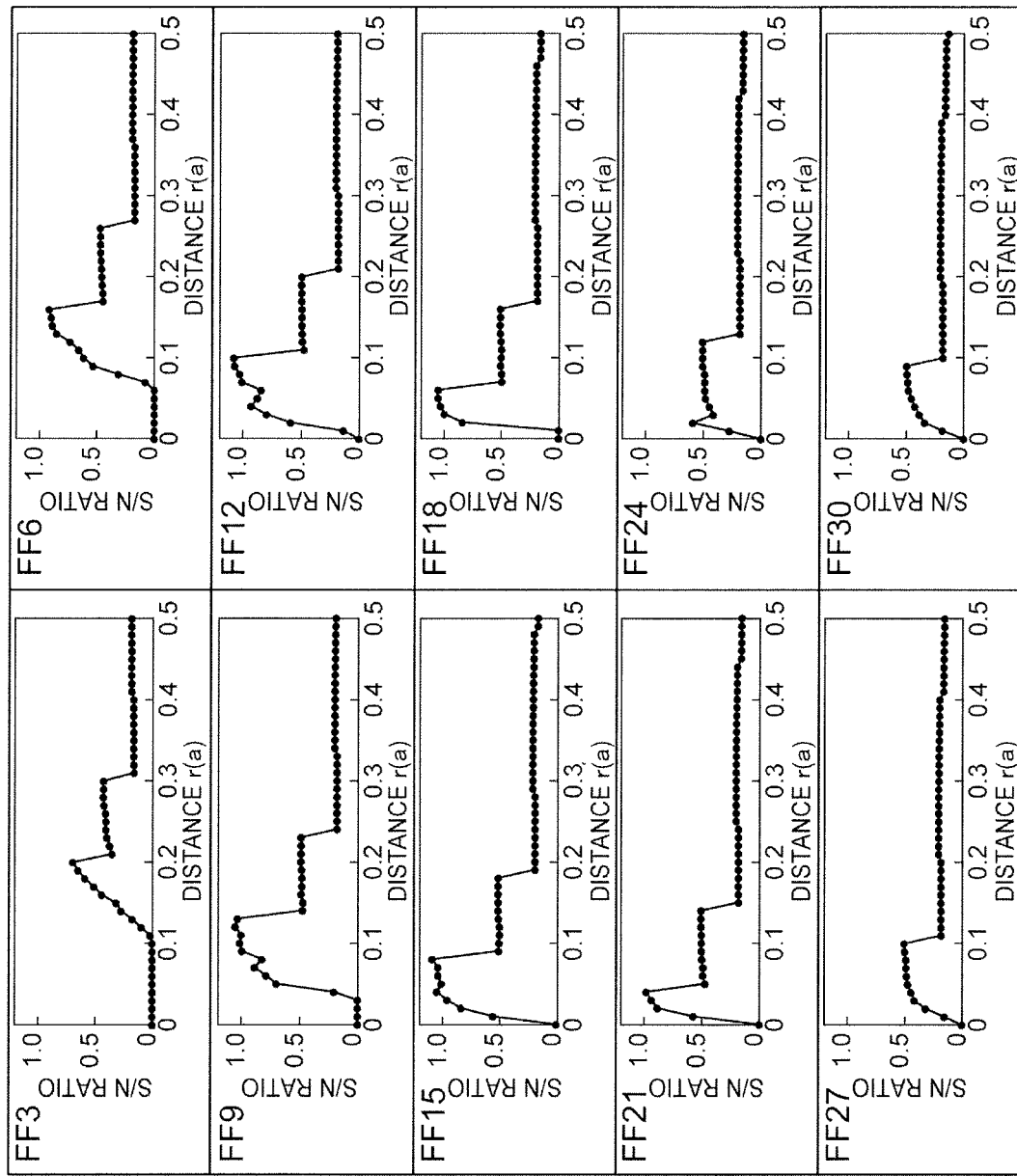
FIG. 17 is a graph illustrating a relationship between the distance r(a) and the S/N ratio in the third configuration of the phase modulation layer.

FIG. 16 is a graph illustrating an S/N ratio of an output beam pattern according to a relationship between the filling factor FF and a distance r(a) in the third configuration (Sample 3) of the phase modulation layer 15A, that is, an intensity ratio of a desired beam pattern and noise. FIG. 17 is a graph illustrating a relationship between the distance r(a) and the S/N ratio in the case of FIG. 16 (Sample 3 of the third configuration). Even in the case of this structure, it is understood that S/N is higher when the distance r is 0.3a or smaller than that of the case where the distance r exceeds 0.3a, and S/N is higher when the distance r is 0.01a or longer than that of the case where the distance r is zero. In particular, there is a peak of the S/N ratio within these numerical ranges with reference to FIG. 17. That is, the distance r is preferably 0<r≤0.3a, more preferably 0.01a≤r≤0.3a, and still more preferably 0.03a≤r≤0.25a from the viewpoint of improving the S/N ratio. Meanwhile, a beam pattern can be obtained even when r is smaller than 0.01a although the S/N ratio is small.

Incidentally, the regions where the S/N ratio exceeds 0.9, 0.6, and 0.3 in FIG. 10 (Sample 1), FIG. 13 (Sample 2), and FIG. 16 (Sample 3) are given by the following functions. Incidentally, FF3, FF6, FF9, FF12, FF15, FF18, FF21, FF24, FF27, and FF30 in FIG. 11 (Sample 1), FIG. 14 (Sample 2) and FIG. 17 (Sample 3) represent FF=3%, FF=6%, FF=9%, FF=12%, FF=15%, FF=18%, FF=21%, FF=24%, FF=27%, and FF=30%, respectively.

(S/N is 0.9 or more in FIG. 10)

$FF > 0.03$, $r > 0.06$, $r < -FF + 0.23$, and $r > -FF + 0.13$ (S/N is 0.6 or more in FIG. 10)

$FF > 0.03$, $r > 0.03$, $r < -FF + 0.25$, $r > -FF + 0.12$ (S/N is 0.3 or more in FIG. 10)

$FF > 0.03$, $r > 0.02$, $r < -(2/3)FF + 0.30$, and $r > -(2/3)FF + 0.083$ (S/N is 0.9 or more in FIG. 13)

$r > -2FF + 0.25$, $r < -FF + 0.25$, $r > FF - 0.05$ (S/N is 0.6 or more in FIG. 13)

$FF > 0.03$, $r > 0.04$, $r < -(3/4)FF + 0.2375$, $r > -FF + 0.15$ (S/N is 0.3 or more in FIG. 13)

$FF > 0.03$, $r > 0.01$, $r < -(2/3)FF + 1/3$, and $r > -(2/3)FF + 0.10$ (S/N is 0.9 or more in FIG. 16)

$r > 0.025$, $r > -(4/3)FF + 0.20$, and $r < -(20/27)FF + 0.20$ (S/N is 0.6 or more in FIG. 16)

$FF > 0.03$, $r > 0.02$, $r > -(5/4)FF + 0.1625$, $r < -(13/18)FF + 0.222$ (S/N is 0.3 or more in FIG. 16)

$FF > 0.03$, $r > 0.01$, $r < -(2/3)FF + 0.30$, $r > -(10/7)FF + 1/7$

Incidentally, a material system, a film thickness, and a layer configuration can be variously changed as long as it is configured to include the active layer 12 and the phase modulation layer 15A in the above structure. Here, a scaling rule holds regarding a so-called square lattice photonic crystal laser in which perturbation from the virtual square lattice is zero. That is, when a wavelength becomes constant α times, the same standing wave state can be obtained by multiplying the entire square lattice structure by α. Similarly, it is possible to determine the structure of the phase modulation layer 15A according to the scaling rule depending on the wavelength even in the present embodiment. Therefore, it is also possible to realize the laser element 1A that outputs visible light by using the active layer 12 that emits light such as blue, green, and red, and applying the scaling rule depending on the wavelength.

When manufacturing the laser element 1A, each compound semiconductor layer is obtained by a metal-organic chemical vapor deposition (MOCVD) method. Although crystal growth is performed on a (001) plane of the semiconductor substrate 10, the crystal growth is not limited thereto. In addition, in the manufacture of the laser element 1A using AlGaN, the growth temperature of AlGaAs is 500° C. to 850° C., and 550° C. to 700° C. was adopted in the experiment. Trimethylaluminium (TMA) is used as an Al raw material at the time of growth, trimethyl gallium (TMG) and triethyl gallium (TEG) are used as gallium raw materials, $AsH_3$ (arsine) is used as an As raw material, disilane ($Si_2H_6$) is used as a raw material of an N-type impurity, and diethylzinc (DEZn) is used as a raw material of a P-type impurity. In the growth of GaAs, TMG and arsine are used, but TMA is not used. InGaAs is manufactured using TMG, trimethylindium (TMI), and arsine. An insulating film may be formed by sputtering a target with a constituent material thereof as a raw material or by a plasma CVD (PCVD) method.

That is, in the above laser element 1A, first, an AlGaAs layer serving as the n-type cladding layer 11, an InGaAs/AlGaAs multiple quantum well structure serving as the active layer 12, and a GaAs layer serving as the base layer 15a of the phase modulation layer 15A are epitaxially grown sequentially on a GaAs substrate serving as the N-type semiconductor substrate 10 using the metal-organic chemical vapor deposition (MOCVD) method. Next, a SiN layer is formed on the base layer 15a by a plasma CVD (PCVD) method in order to perform alignment after the epitaxial growth, and then, a resist is formed on the SiN layer. Further, the resist is exposed and developed, the SiN layer is etched using the resist as a mask, and an alignment mark is formed in a state where a part of the SiN layer is left. The remaining resist is removed.

Next, another resist is applied to the base layer 15a, and a two-dimensional fine pattern is drawn on the resist by an electron beam drawing apparatus with reference to the alignment mark. The two-dimensional fine pattern is formed on the resist by developing the resist after drawing. Thereafter, the two-dimensional fine pattern is transferred onto the base layer 15a by dry etching using the resist as a mask, and the resist is removed after the formation of holes (pores). A depth of the hole is, for example, 100 to 300 nm. These holes are used as the modified refractive index regions 15b, or compound semiconductors (AlGaAs), which are to serve as the modified refractive index regions 15b, are grown again in these holes to be deeper than the depth of the hole. When the hole is the modified refractive index region 15b, the hole may be sealed with a gas such as air, nitrogen and argon. Next, an AlGaAs layer serving as the cladding layer 13 and a GaAs layer serving as the contact layer 14 are sequentially formed by MOCVD, and the electrodes 16 and 17 are formed by a vapor deposition method or a sputtering method. In addition, the anti-reflection film 19 is formed by sputtering or the like if necessary.

Incidentally, the phase modulation layer 15A may be formed on the cladding layer 11 before the formation of the active layer 12 in the case where the phase modulation layer 15A is provided between the active layer 12 and the cladding layer 11. In addition, the lattice interval a of the virtual square lattice is a degree obtained by dividing a wavelength by an equivalent refractive index, and is set to about 300 nm, for example.

Incidentally, if unit vectors of orthogonal coordinates are x and y in the case of the square lattice with the lattice interval a, basic translation vectors are $a_1=ax$ and $a_2=ay$, and basic reciprocal lattice vectors are $b_1=(2\pi/a)y$, and $b_2=(2\pi/a)x$ for the translation vectors $a_1$ and $a_2$. When a wave number vector of a wave existing in the lattice is $k=nb_1+mb_2$ (n and m are arbitrary integers), the wave number k exists at a Γ point. In particular, when the magnitude of the wave number vector is equal to the magnitude of the basic reciprocal lattice vector, a resonance mode (standing wave in the X-Y plane) where the lattice interval a is equal to the wavelength λ is obtained. In the present embodiment, oscillation in such a resonance mode (standing wave state) is obtained. Considering a TE mode in which an electric field is present in a plane parallel to the square lattice at this time, there are four modes of the standing wave state where the lattice interval and the wavelength are equal as described above due to the symmetry of the square lattice. In the present embodiment, a desired beam pattern can be similarly obtained in any mode of oscillation in any of these four standing wave states.

Incidentally, the desired beam pattern can be obtained as the standing wave in the phase modulation layer 15A is scattered by the hole shape and wavefront obtained in the vertical direction of the plane is phase-modulated. Thus, the desired beam pattern can be obtained even without a polarizing plate. This beam pattern can be not only a pair of single peak beams (spots) but also a character shape or two or more spot groups having the same shape as described above or a vector beam or the like in which phase or intensity distribution is spatially non-uniform.

It is preferable that the refractive index of the base layer 15a be 3.0 to 3.5 and the refractive index of the modified refractive index region 15b be 1.0 to 3.4. An average diameter of the respective modified refractive index regions 15b in the holes of the base layer 15a is, for example, 38 nm to 76 nm. As a size of this hole changes, the diffraction intensity in the Z-axis direction changes. This diffraction efficiency is proportional to an optical coupling coefficient κ1 represented by a first-order coefficient at the time of Fourier transform of the shape of the modified refractive index region 15b. The optical coupling coefficient is described in, for example, K. Sakai et al., "Coupled-Wave Theory for Square-Lattice Photonic Crystal Lasers With TE Polarization, IEEE J. Q. E. 46, 788-795 (2010)".

FIG. 1 will be referred to again. The laser element 1A of the present embodiment includes the distributed Bragg reflector (DBR) layer 18. The DBR layer 18 has a structure in which two types of layers having modified refractive indices are alternately stacked. The DBR layer 18 has a transmission characteristic with respect to a desired optical image (specific optical image) outputted in the direction inclined with respect to the Z axis (normal direction of the light emission surface 2b) among optical images generated by the phase modulation layer 15A. On the other hand, the DBR layer 18 has a reflection characteristic with respect to zero-order light outputted along the Z axis. The DBR layer 18 of the present embodiment is included in the cladding layer 13 provided between the layer region constituted by the active layer 12 and the phase modulation layer 15A and the light reflection surface 2a, between the pair of cladding layers 11 and 13. Specifically, the cladding layer 13 includes a portion 13a formed on the phase modulation layer 15A (or the active layer 12), the DBR layer 18 formed on the portion 13a, and a portion 13b formed on the DBR layer 18. Incidentally, any one of the portions 13a and 13b may be omitted (even if a film thickness is 0 nm) as necessary. Further, the DBR layer 18 functions as cladding for light generated in the active layer 12 together with the cladding layer 13.

Figure 18:
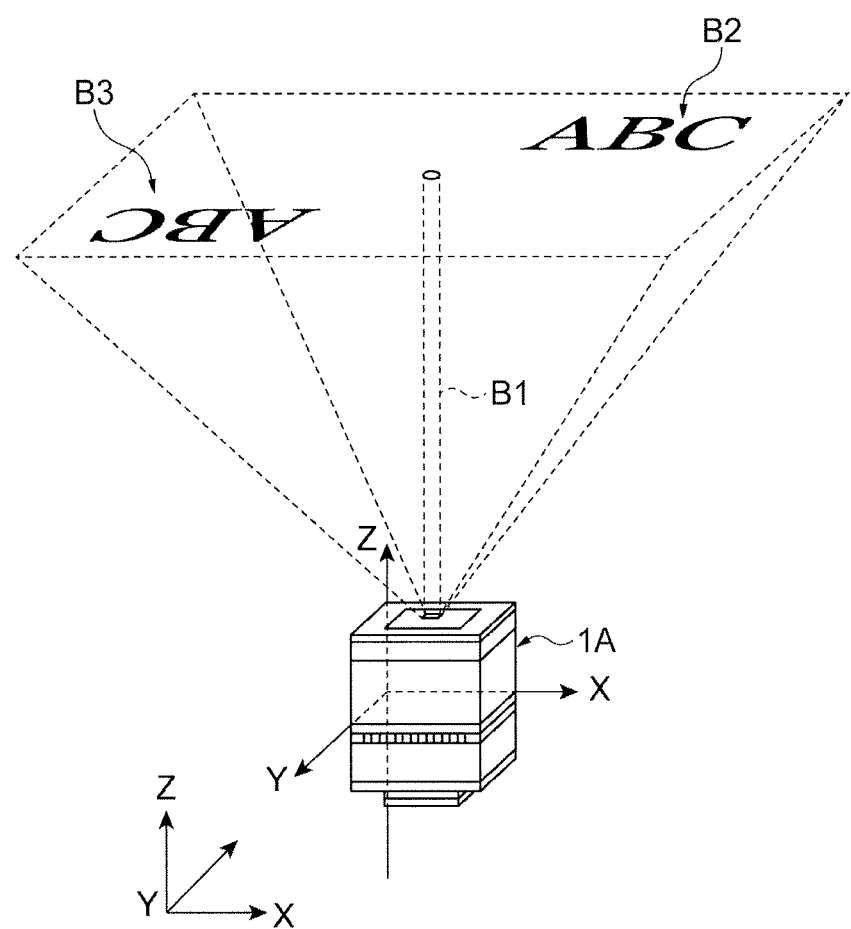
FIG. 18 is a perspective view illustrating an example of a beam pattern (optical image) outputted from a laser element when it is assumed that there is no DBR layer.
Figure 19A:
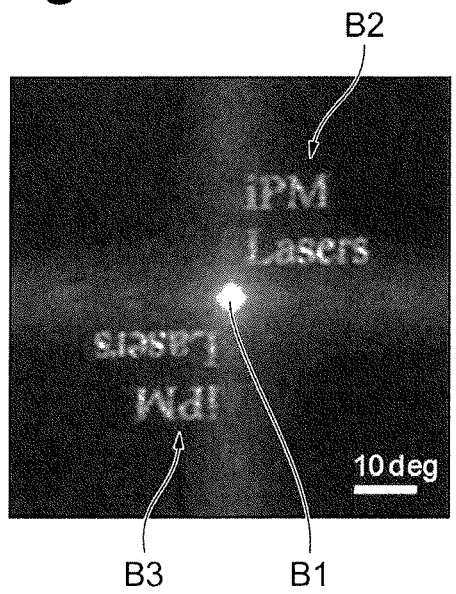
FIGS. 19A to 19C are images illustrating examples of a beam pattern outputted from the laser element when it is assumed that there is no DBR layer.
Figure 19B:
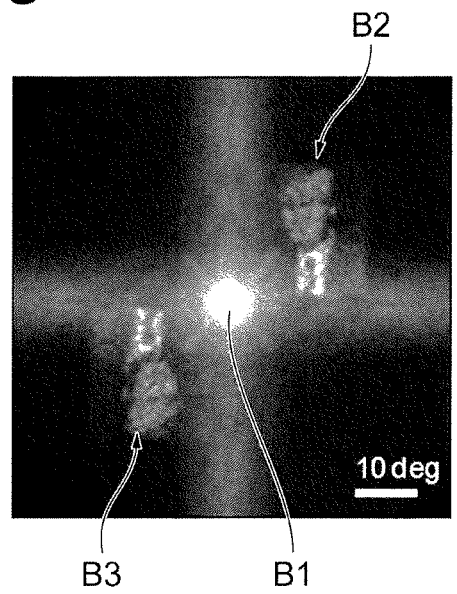
Figure 19C:
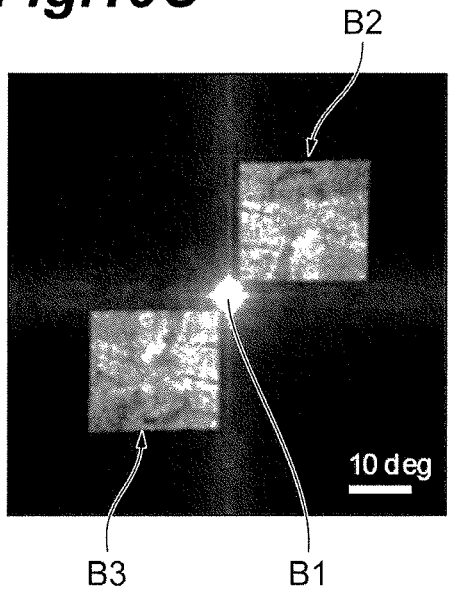

Here, FIG. 18 is a perspective view illustrating an example of a beam pattern (optical image) outputted from the laser element 1A when it is assumed that the DBR layer 18 is not present. In addition, FIGS. 19A to 19C are images illustrating examples of the beam pattern outputted from the laser element 1A when it is assumed that the DBR layer 18 is not present. As illustrated in FIGS. 18 and 19A to 19C), when the DBR layer 18 is not present, optical images outputted from the light emission surface 2b include zero-order light B1 appearing as a bright spot on the Z axis from the laser element 1A, first-order light B2 outputted in a first direction inclined with respect to the Z axis, and negative first-order light B3 outputted in a second direction that is symmetric with the first direction with respect to the Z axis and rotationally symmetric with the first-order light B2 with respect to the Z axis. Typically, the first-order light B2 is outputted in the first quadrant within a display plane (plane parallel to the X-Y plane) orthogonal to the Z axis, and the negative first-order light B3 is outputted in the third quadrant within the display plane. The maximum angle of an emission angle of the zero-order light B1 is, for example, in the range of 80° to 85°, and the minimum angles of emission angles of the first-order light B2 and the negative first-order light B3 are in the range of 25° to 30°, for example.

Figure 20:
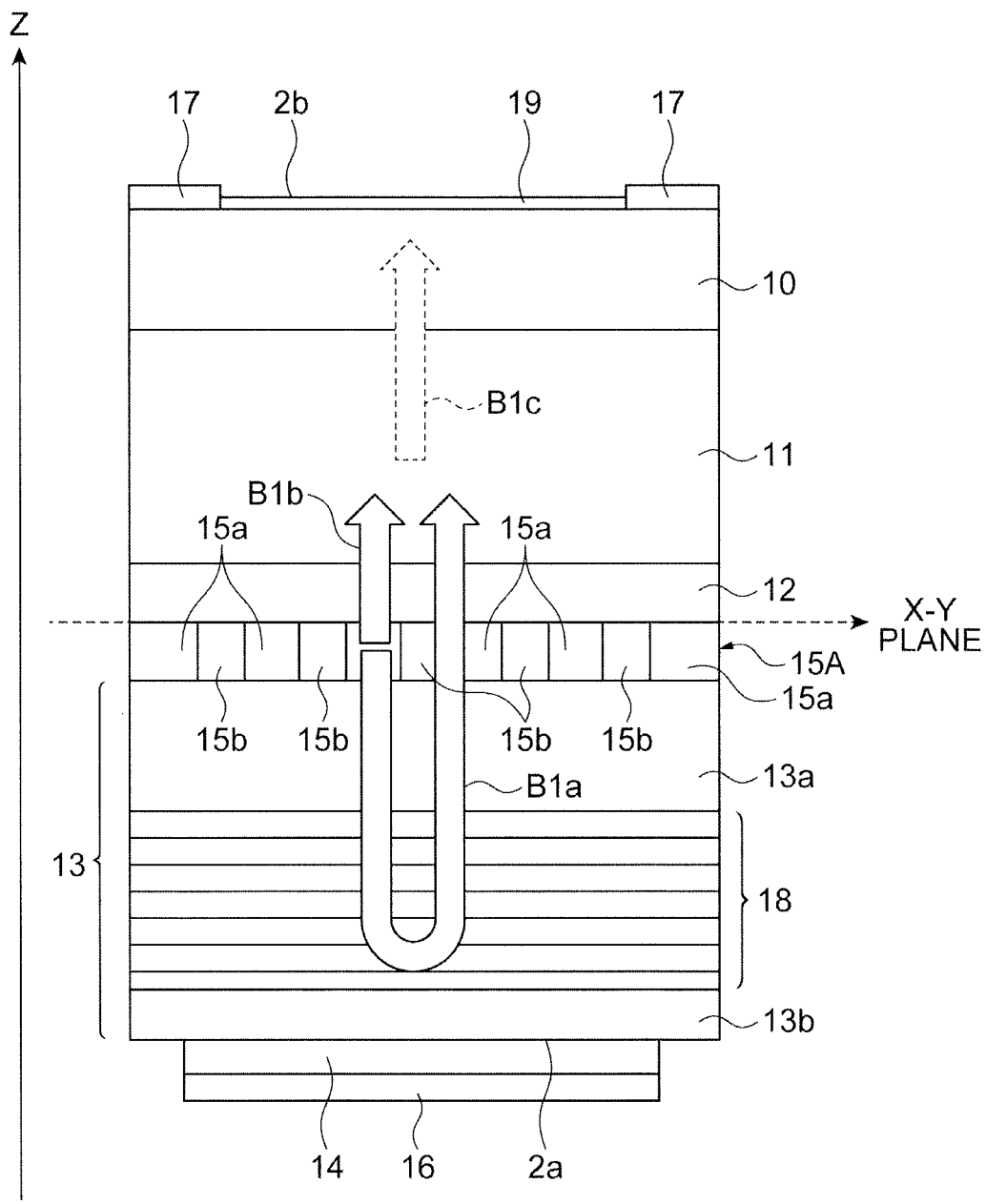
FIG. 20 is a view schematically illustrating a cross-sectional structure of the laser element.

The DBR layer 18 of the present embodiment passes the desired optical image (for example, the first-order light B2 and the negative first-order light B3) out of the optical images and reflects the zero-order light B1. FIG. 20 is a view schematically illustrating a cross-sectional structure of the laser element 1A. As illustrated in the drawing, a part B1a of the zero-order light outputted from the phase modulation layer 15A advances toward the light reflection surface 2a. Then, zero-order light B1a reverses its traveling direction by being reflected by the DBR layer 18 and advances toward the light emission surface 2b. On the other hand, the remnant B1b of the zero-order light outputted from the phase modulation layer 15A is directly directed to the light emission surface 2b. At this time, since the zero-order light B1a and the zero-order light B1b which have passed through different optical paths advance in the same direction, the zero-order light B1a and the zero-order light B1b interfere with each other. In the present embodiment, an interval between the DBR layer 18 and the phase modulation layer 15A is set such that the zero-order light B1a and the zero-order light B1b weaken each other (an arrow B1c in FIG. 20). Incidentally, the interval between the DBR layer 18 and the phase modulation layer 15A substantially corresponds to a thickness of the portion 13a in the cladding layer 13 in the example of FIG. 20.

Figure 21:
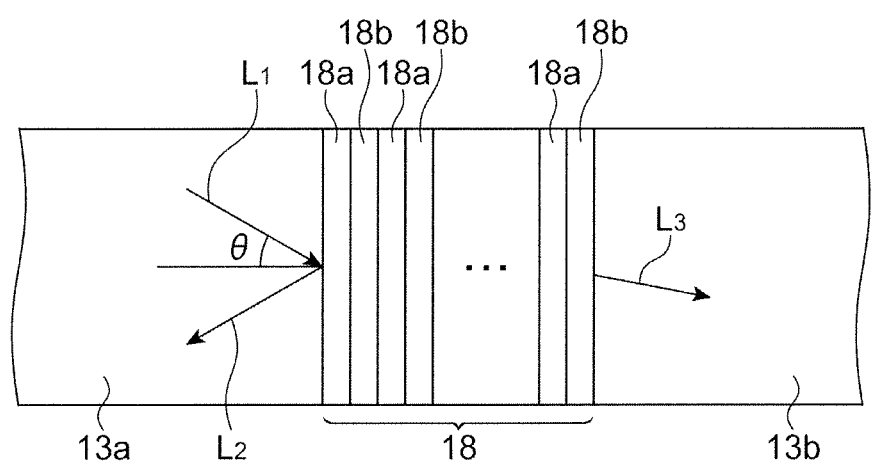
FIG. 21 is a view illustrating a specific structure of the DBR layer.

FIG. 21 is a view illustrating a specific structure of the DBR layer 18. The DBR layer 18 is a periodic multilayer film in which layers 18a and 18b having modified refractive indices are alternately stacked. Each thickness of these layers 18a and 18b is a quarter of an emission wavelength of the active layer 12. When the laser element 1A is comprised of a GaAs-based semiconductor, the layers 18a and 18b are comprised of, for example, p-type AlGaAs having different Al compositions from each other (p-type GaAs when the Al composition is zero). In addition, when the laser element 1A is comprised of a nitride-based compound semiconductor, the layers 18a and 18b are comprised of, for example, p-type AlGaN (p-type GaN when the Al composition is zero) having different Al compositions from each other.

The DBR layer 18 has high reflectance with respect to light incident from the stacking direction (that is, a direction perpendicular to an interface between the layers 18a and 18b). Specifically, when an incidence angle $\theta$ of light $L_1$ with a predetermined wavelength (emission wavelength of the active layer 12) to the interface between the DBR layer 18 and the portion 13a of the cladding layer 13 is changed, a light intensity of reflected light $L_2$ becomes remarkably larger than a light intensity of transmitted light $L_3$ in a predetermined range where the incidence angle $\theta$ is close to 0°. Further, refractive indices of the respective layers 18a and 18b are determined such that an emission angle of the zero-order light B1 is included in the predetermined range and the emission angles of the first-order light B2 and the negative first-order light B3 deviate from the predetermined range.

Incidentally, when the layer 18a positioned at an end on the phase modulation layer 15A side is a low refractive index layer, a phase of light reflected at the interface between the layers 18a and 18b becomes an even multiple of $\pi$ (rad) so that no phase shift occurs in the reflected light. On the other hand, when the layer 18a positioned at the end on the phase modulation layer 15A side is a high refractive index layer, a phase of light reflected at the interface between the layers 18a and 18b becomes an odd multiple of $\pi$ (rad) so that a phase shift of $\pi$ (rad) occurs in the reflected light. Taking this into consideration, the interval between the DBR layer 18 and the phase modulation layer 15A is determined.

Figure 22:
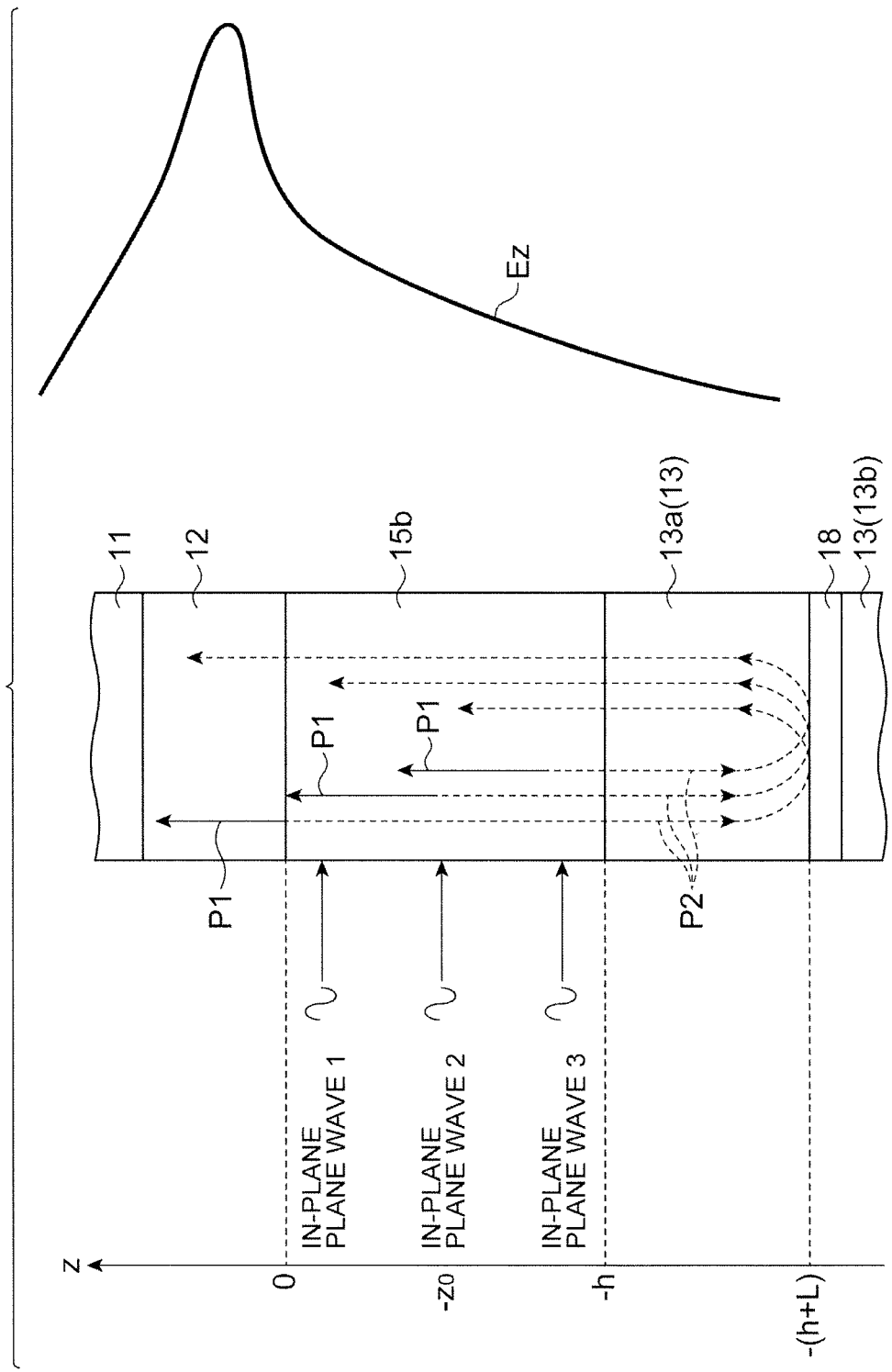
FIG. 22 is a view illustrating a structure model in the vicinity of the phase modulation layer and the DBR layer.

A method for determining the interval between the DBR layer 18 and the phase modulation layer 15A will be described in more detail with reference to FIG. 22. FIG. 22 is a view illustrating a structure model in the vicinity of the phase modulation layer 15A and the DBR layer 18. FIG. 22 illustrates the Z axis indicating a position in the thickness direction, the modified refractive index region 15b (for example, a hole), the active layer 12 and the cladding layer 11 positioned on the modified refractive index region 15b, the portion 13a of the cladding layer 13 positioned below the modified refractive index region 15b, the DBR layer 18, and an electric field mode distribution Ez. The electric field mode distribution Ez is a function of a thickness direction position z.

A first diffracted wave P1 advancing in a positive direction of the Z axis passes through from the modified refractive index region (diffractive portion) 15b to the active layer 12 and the cladding layer 11. In addition, a second diffracted wave P2 advancing in a negative direction of the Z axis passes through from the modified refractive index region 15b to the portion 13a. After being reflected by the DBR layer 18, the second diffracted wave P2 advances in the positive direction of the Z axis and is incident onto the modified refractive index region 15b again. In this model, the diffraction in the vertical direction is represented by the sum of diffraction of in-plane plane waves (for example, in-plane plane waves 1 to 3 in FIG. 22) for each position in the thickness direction in the modified refractive index region 15b. Specifically, an intensity $\Delta Ey(z)$ of a vertically diffracted wave of a fundamental wave in the three-dimensional coupled wave theory illustrated in C. Peng, et al., "Coupled-wave analysis for photonic-crystal surface-emitting lasers on air holes with arbitrary sidewalls," Optics. Express 19, 24672-24686 (2011) is expressed by the following formula (10).

$$\Delta E_y(z) \approx k_0^2 R_x \int_{PC} \xi_{-1,0}(z) G(z,z') \Theta_0(z') dz' - k_0^2 S_x \int_{PC} \xi_{1,0}(z) G(z,z') \Theta_0(z') dz' \quad (10)$$

Here, $k_0$ is a wave number, $\xi(z)$ is a Fourier coefficient of the modified refractive index region 15b at the thickness direction position z, $G(z, z')$ is the Green function, $\Theta(z)$ is an electric field mode distribution in the z direction, and Rx and Sx are electric field intensities in the plane direction. In this manner, the intensity of the vertically diffracted wave is given in the form of an integral of a product of the Fourier coefficient and the electric field mode distribution at the thickness direction position z, and is calculated based on the vertically diffracted wave according to the above formula (10) and the sum of reflected waves of the DBR layer 18.

In the present embodiment, the reflection in the thickness direction in the modified refractive index region 15b can be substantially ignored, and thus, the first diffracted wave P1 directed upward from the modified refractive index region 15b and the second diffracted wave P2 directed downward from the modified refractive index region 15b have the same phase. The thickness direction position z of an in-plane plane wave diffracted in the vertical direction with the same phase as this phase is defined as $z_0$. Further, the above-described phase shift in the DBR layer 18 is defined as $\varphi$. When the refractive index of the first layer 18a of the DBR layer 18 is higher than that of the portion 13a of the cladding layer 13, $\varphi=\pi$ (rad). When the refractive index of the first layer 18a of the DBR layer 18 is lower than that of the portion 13a of the cladding layer 13, $\varphi=0$ (rad). In addition, an emission wavelength of the active layer 12 is defined as λ. At this time, it is preferable that a distance L with the phase modulation layer 15A satisfies the following Formula (11). Here, $n_D$ is a refractive index of the modified refractive index region 15b, $n_L$ is a refractive index of the portion 13a of the cladding layer 13, h is a thickness of the phase modulation layer 15A, and m is an integer.

$$2\{n_D(h-z_0)+n_L L\}+\frac{\phi\lambda}{2\pi}=\frac{(2m+1)\lambda}{2} \quad (11)$$

(Interval Adjustment)

Incidentally, when actually fabricating the laser element 1A, it is preferable that the interval between the DBR layer 18 and the phase modulation layer 15A be experimentally adjusted such that the intensity of the zero-order light B1 to be outputted decreases. In addition, there is a case where a propagation mode in the thickness direction occurs in the cladding layer 13 due to the presence of the DBR layer 18. In such a case, it is preferable to make the interval between the DBR layer 18 and the active layer 12 longer. However, no propagation mode occurred in the cladding layer 13 even when the DBR layer 18 and the phase modulation layer 15A were adjacent to each other as a result of the inventors' structural analysis of the laser element 1A in a band of 940 nm.

Effect that can be obtained by the laser element 1A of the embodiment described above will be described. In the laser element 1A, the phase modulation layer 15A includes the base layer 15a and the plurality of modified refractive index regions 15b having modified refractive indices from the base layer 15a, the center of gravity G1 of each of the modified refractive index regions 15b is arranged to be away from the lattice point O of the virtual square lattice, and the direction of the vector from the lattice point O to the center of gravity G1 is individually set for each of the modified refractive index regions 15b. In such a case, the phase of the beam changes in accordance with the direction of the vector from the lattice point O to the center of gravity G1, that is, the angular position of the center of gravity G1 around the lattice point O as described above. That is, it is possible to control the phase of the beam to be emitted from each of the modified refractive index regions 15b by only changing the position of the center of gravity G1, and to make the beam pattern to be formed as a whole in a desired shape. That is, this laser element 1A is the S-iPM laser, and can output the optical image having the two-dimensional arbitrary shape along the direction (normal direction) perpendicular to the light emission surface 2b and the direction inclined with respect to the normal direction.

In the laser element 1A of the present embodiment, the DBR layer 18 is provided between the active layer 12 and the phase modulation layer 15A, and the light reflection surface 2a. Further, the distance between the DBR layer 18 and the phase modulation layer 15A is set such that the zero-order light B1a which is reflected by the DBR layer 18 toward the light emission surface 2b and the zero-order light B1b directly directed to the light emission surface 2b from the phase modulation layer 15A weaken each other. In this manner, desired optical images (the first-order light B2 and the negative first-order light B3) out of the light outputted from the phase modulation layer 15A easily reach the light emission surface 2b, but components of the zero-order light B1 interfere with each other and weaken each other and hardly reach the light emission surface 2b. Therefore, it is possible to suitably remove the zero-order light B1 from the output of the laser element 1A according to the laser element 1A of the present embodiment.

(First Modification)

Figure 23:
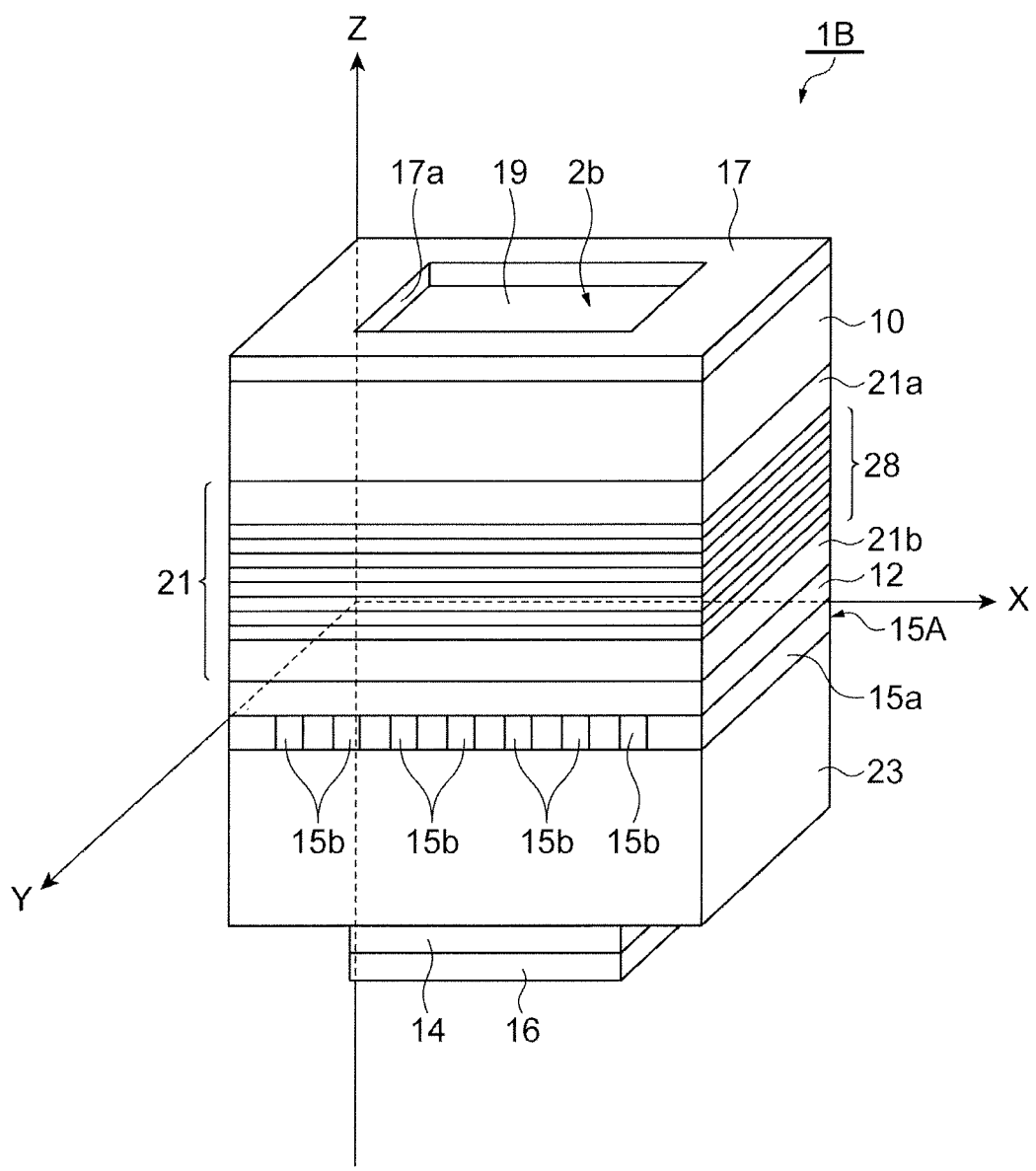
FIG. 23 is a perspective view illustrating a configuration of a laser element according to a first modification.

FIG. 23 is a perspective view illustrating a configuration of a laser element 1B according to a first modification as an example of the semiconductor light emitting element according to the present embodiment. The laser element 1B is an S-iPM laser which forms a standing wave along the X-Y plane and outputs a phase-controlled plane wave in the Z-axis direction. The laser element 1B outputs an optical image of an arbitrary shape along a direction inclined with respect to the normal direction of the light emission surface 2b (that is, the Z-axis direction), which is similar to the above embodiment.

Figure 24:
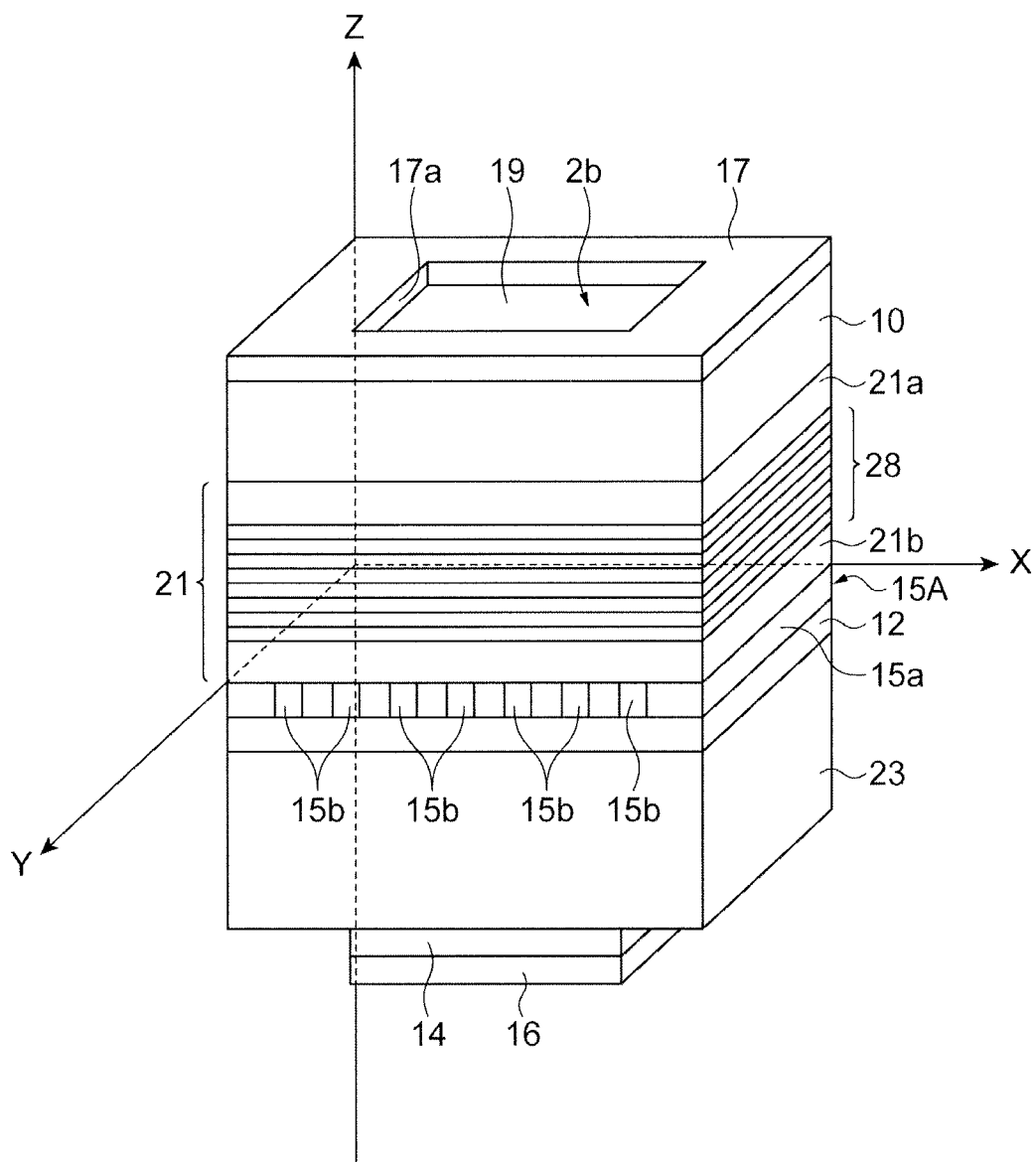
FIG. 24 is a view illustrating a modification relating to an arrangement of a phase modulation layer.

The laser element 1B includes the active layer 12 provided on the semiconductor substrate 10, a pair of cladding layers 21 and 23 provided on the semiconductor substrate 10 and sandwiching the active layer 12, the contact layer 14 provided on a central region of the cladding layer 23, and the phase modulation layer 15A provided between the active layer 12 and the cladding layer 23. Among them, configurations of the semiconductor substrate 10, the active layer 12, the contact layer 14, and the phase modulation layer 15A are the same as those of the example illustrated in FIGS. 1 and 2 described above. As illustrated in FIG. 24, the phase modulation layer 15A may be provided between the cladding layer 21 and the active layer 12.

The cladding layer 23 has the same configuration as the cladding layer 13 of the example illustrated in FIGS. 1 and 2 except that no DBR layer is provided. The cladding layer 21 has the same configuration as the cladding layer 11 of the example illustrated in FIGS. 1 and 2 except that a DBR layer 28 is provided. The DBR layer 28 has the same configuration as the DBR layer 18 of the example illustrated in FIGS. 1 and 2. That is, the DBR layer 28 is formed by alternately stacking two types of layers having modified refractive indices, and has a transmission characteristic with respect to a specific optical image (the first-order light B2 and the negative first-order light B3) outputted in the direction inclined with respect to the Z axis and has a reflection characteristic with respect to the zero-order light B1 outputted along the Z axis among optical images generated by the phase modulation layer 15A. The DBR layer 28 of the first modification is included in the cladding layer 21 provided between the active layer 12 and the phase modulation layer 15A, and the light emission surface 2b between the pair of cladding layers 21 and 23. Specifically, the cladding layer 21 includes a portion 21b formed on the phase modulation layer 15A (or the active layer 12), the DBR layer 28 formed on the portion 21b, and a portion 21a formed on the DBR layer 28. Incidentally, any one of the portions 21a and 21b may be omitted as necessary. Further, the DBR layer 28 functions as cladding for light generated in the active layer 12 together with the cladding layer 21.

Figure 25:
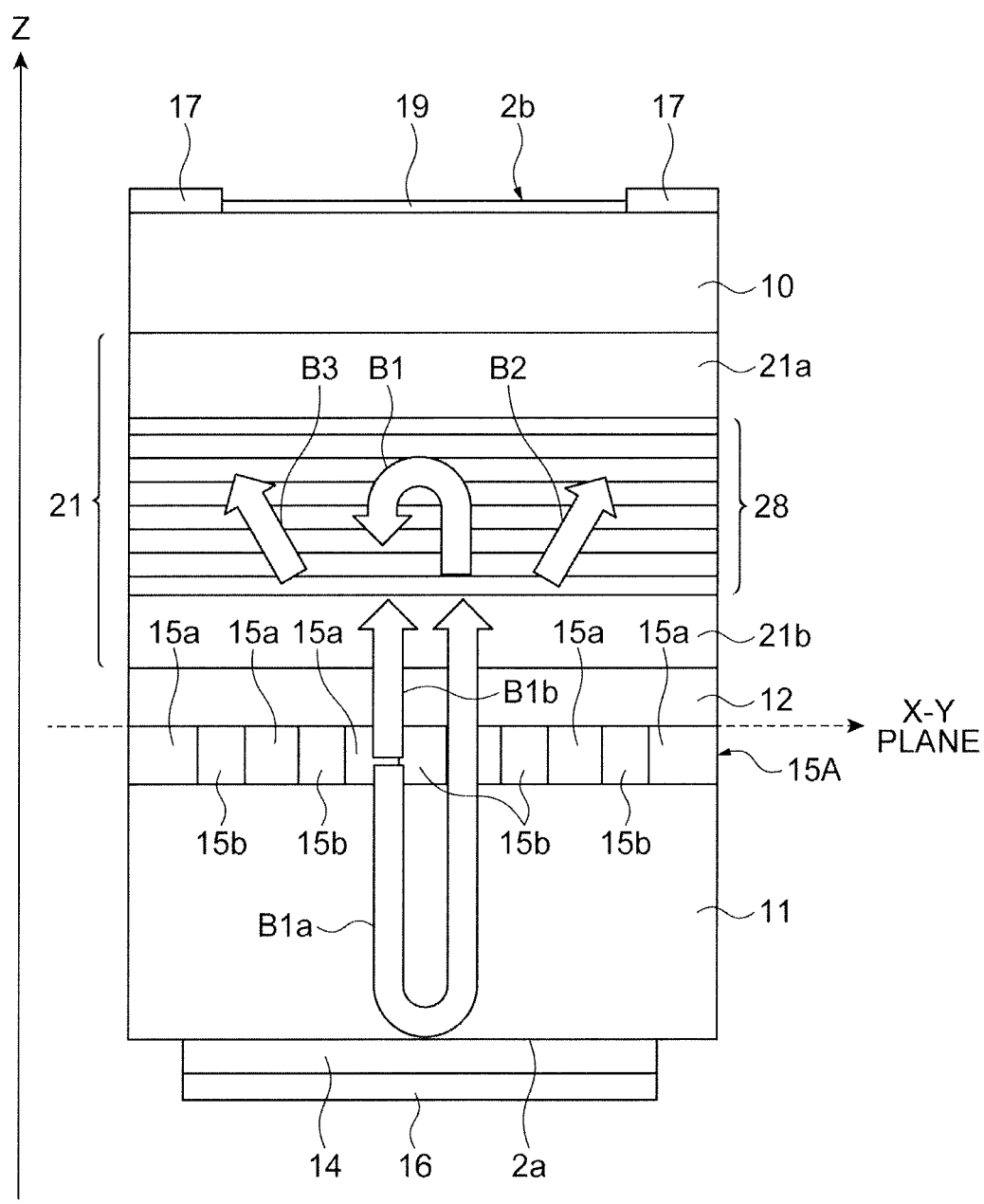
FIG. 25 is a view schematically illustrating a cross-sectional structure of the laser element.

FIG. 25 is a view schematically illustrating a cross-sectional structure of the laser element 1B. As illustrated in the drawing, a part B1a of the zero-order light outputted from the phase modulation layer 15A advances toward the light reflection surface 2a. Then, the zero-order light B1a reverses its traveling direction by being reflected by the light reflection surface 2a and advances toward the light emission surface 2b. On the other hand, the remnant B1b of the zero-order light outputted from the phase modulation layer 15A is directly directed to the light emission surface 2b. Then, the zero-order light beams B1a and B1b (that is, the zero-order light beam B1) reach the DBR layer 28. At this time, since the DBR layer 28 has the characteristic of reflecting the zero-order light B1, a light intensity of the zero-order light B1 passing through the DBR layer 28 decreases. On the other hand, most of the first-order light B2 and the negative first-order light B3, which are specific optical images, pass through the DBR layer 28. Incidentally, the interval between the DBR layer 18 and the phase modulation layer 15A is defined in the examples illustrated in FIGS. 1 and 2, but an interval between the DBR layer 28 and the phase modulation layer 15A is not particularly limited in the first modification.

In this first modification, the DBR layer 28 having the transmission characteristic with respect to the specific optical images (the first-order light B2 and the negative first-order light B3) and the reflection characteristic with respect to the zero-order light B1 is provided between the active layer 12 and the phase modulation layer 15A, and the light emission surface 2b. In this manner, the specific optical images (the first-order light B2 and the negative first-order light B3) out of the light outputted from the phase modulation layer 15A pass through the DBR layer 28 and easily reach the light emission surface 2b, but the zero-order light B1 is shielded by the DBR layer 28 and hardly reaches the light emission surface 2b. Therefore, the zero-order light B1 can be suitably removed from the output of the laser element 1B according to the laser element 1B of the first modification.

(Second Modification)

Figure 26:
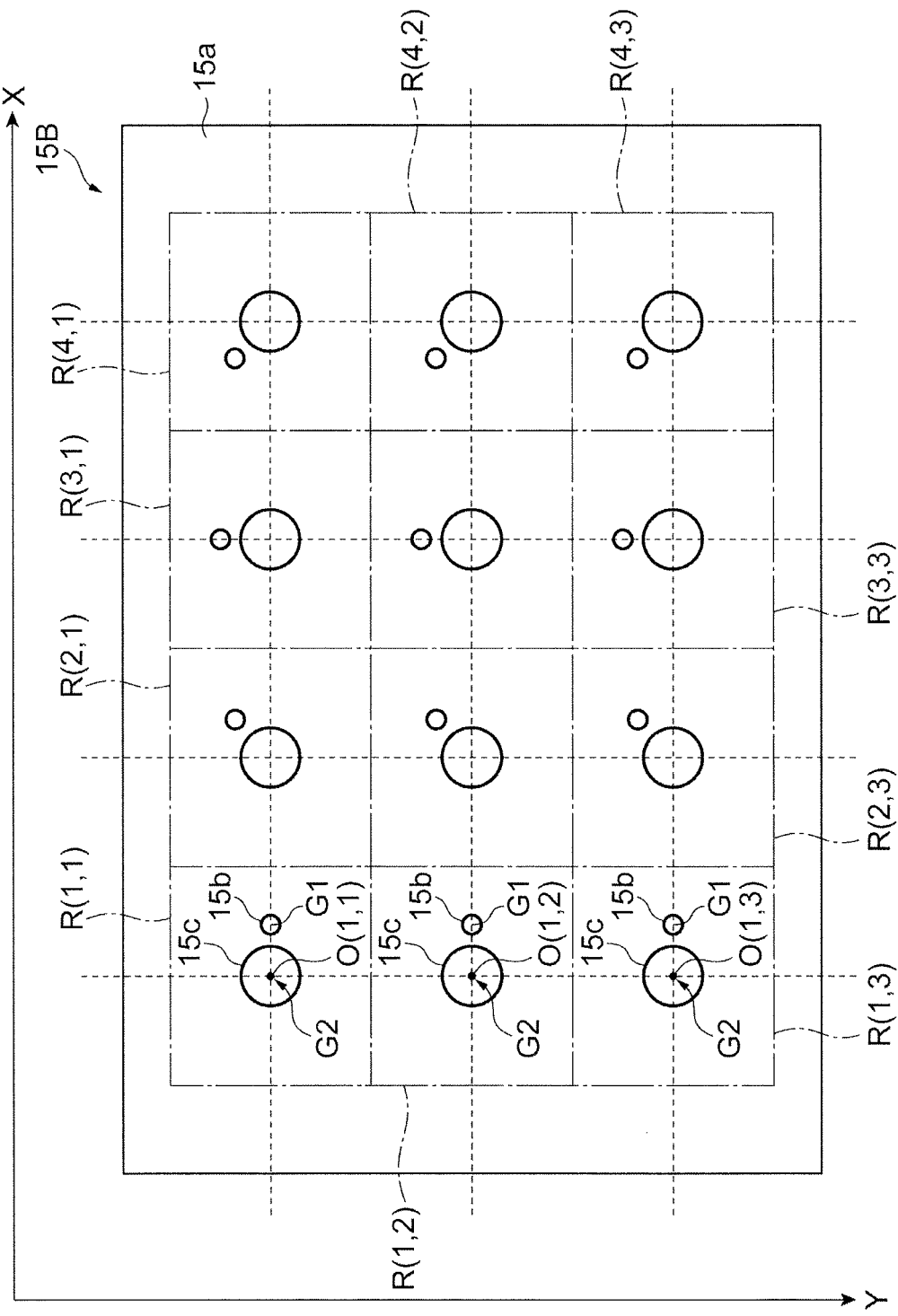
FIG. 26 is a plan view of a phase modulation layer of a second modification.

FIG. 26 is a plan view of a phase modulation layer 15B in a laser element according to a second modification as an example of the semiconductor light emitting element according to the present embodiment. A structure of the laser element according to the second modification is the same as that in the examples illustrated in FIGS. 1, 2, 23, and 24 except for the phase modulation layer 15B. The phase modulation layer 15B of the second modification further includes a plurality of modified refractive index regions 15c in addition to the configuration of the phase modulation layer 15A of the above-described embodiment. Each of the modified refractive index regions 15c includes a periodic structure and is comprised of a second refractive index medium having a refractive index different from that of the first refractive index medium of the base layer 15a. Each of the modified refractive index regions 15c is provided in each of the modified refractive index regions 15b with one-to-one correspondence. A center of gravity G2 of each of the modified refractive index regions 15c coincides with a lattice point O (the center of each of the unit constituent regions R) of a virtual square lattice. A planar shape of the modified refractive index region 15c is, for example, circular. Similarly to the modified refractive index region 15b, the modified refractive index region 15c may be a hole, or may be formed by embedding a compound semiconductor in the hole. For example, it is possible to suitably exhibit the effects of the above embodiment even with the configuration of the phase modulation layer as in the second modification.

(Third Modification)

FIGS. 27A to 27C, 28A, and 28B are plan views illustrating examples of a shape of the modified refractive index region 15b in the X-Y plane. In the examples (Patterns 1 to 5) illustrated in FIG. 27A, the shape of the modified refractive index region 15b in the X-Y plane has rotational symmetry. That is, the shape of each of the modified refractive index regions in the X-Y plane is a perfect circle (Pattern 1), a square (Pattern 2), a regular hexagon (Pattern 3), a regular octagon (Pattern 4) or a regular hexadecagon (Pattern 5). Compared to a rotationally asymmetric figure, the figure in FIG. 27A has less influence even if the pattern is shifted in the rotation direction, and thus, it is possible to perform patterning with high accuracy.

Figure 27A:
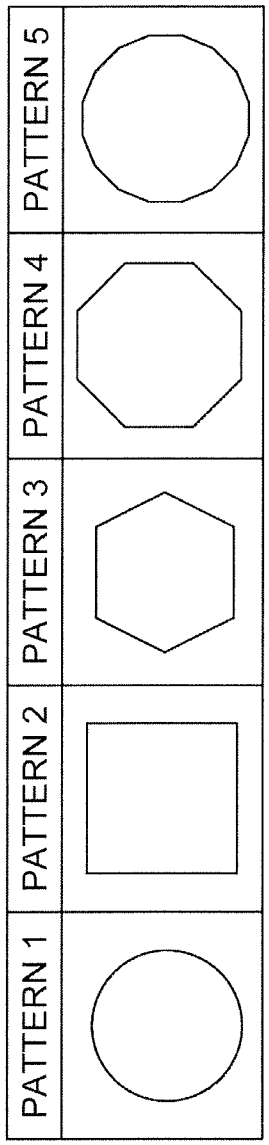
FIGS. 27A to 27C are plan views illustrating examples of a shape in the X-Y plane of the modified refractive index region.
Figure 27B:
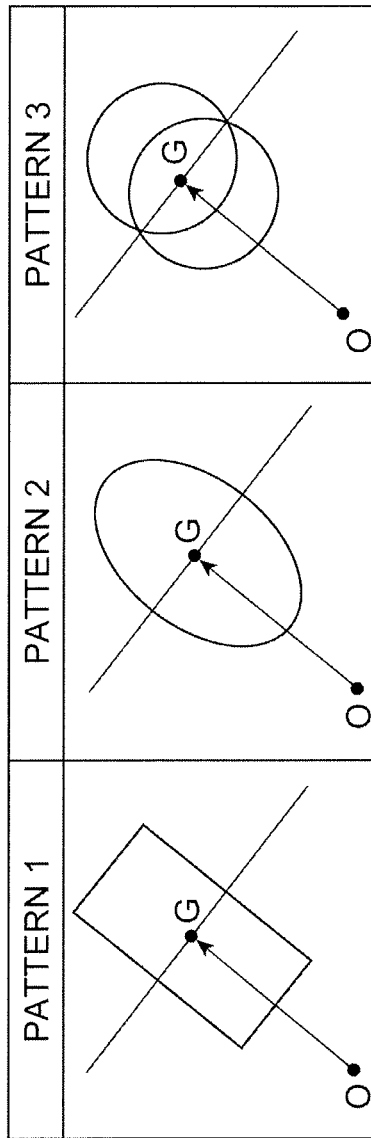

In the examples (Patterns 1 to 3) illustrated in FIG. 27B, the shape of each of the modified refractive index regions in the X-Y plane has mirror image symmetry (line symmetry). That is, the shape of each of the modified refractive index regions in the X-Y plane is a rectangle (Pattern 1), an ellipse (Pattern 2), a shape in which two circles or ellipses partially overlap each other (Pattern 3). The lattice point O of the virtual square lattice is present outside these modified refractive index regions. Compared to the rotationally asymmetric figure, it is possible to clearly know a position of a line segment serving as a reference of the line symmetry with the figure in FIG. 27B, and thus, it is possible to perform patterning with high accuracy.

Figure 27C:
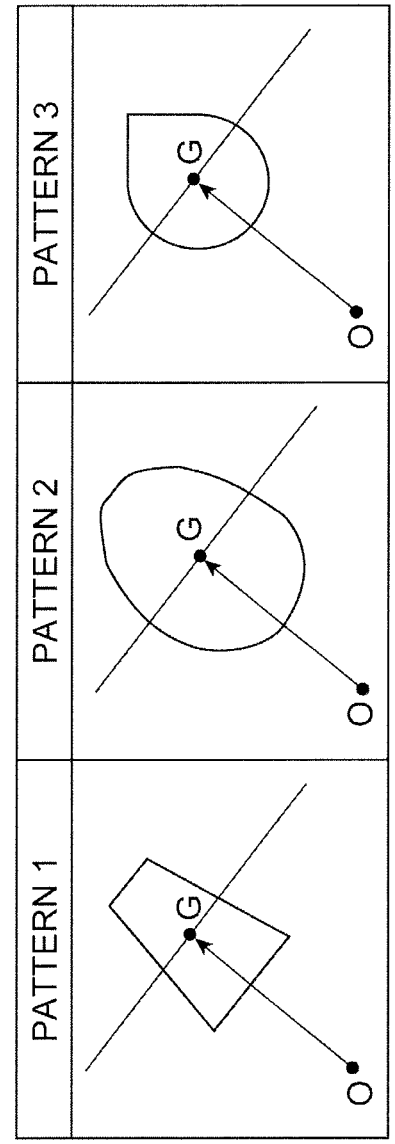

In the examples (Patterns 1 to 3) illustrated in FIG. 27C, the shape of each of the modified refractive index regions in the X-Y plane is a trapezoid (Pattern 1), a shape deformed such that a dimension in the short-axis direction in the vicinity of one end portion along a long axis of an ellipse is smaller than a dimension in the short-axis direction in the vicinity of the other end portion (an egg form: Pattern 2), or a shape (a tear form: Pattern 3) in which one end portion along the long axis of an ellipse is deformed to a sharpened end portion protruding along the long-axis direction. The lattice point O of the virtual square lattice is present outside these modified refractive index regions. Even with the figure of FIG. 27C, a phase of a beam can be changed by shifting a position of the center of gravity of the modified refractive index region by the distance r from the lattice point O of the virtual square lattice.

In the examples (Patterns 1 to 3) illustrated in FIG. 28A, the shape of each of the modified refractive index regions in the X-Y plane has mirror image symmetry (line symmetry). That is, the shape of each of the modified refractive index regions in the X-Y plane is a rectangle (Pattern 1), an ellipse (Pattern 2), a shape in which two circles or ellipses partially overlap each other (Pattern 3). The lattice point O of the virtual square lattice is present inside these modified refractive index regions. Compared to the rotationally asymmetric figure, it is possible to clearly know a position of a line segment serving as a reference of the line symmetry with the figure in FIG. 28A, and thus, it is possible to perform patterning with high accuracy. In addition, since the distance r between the lattice point O of the virtual square lattice and the position of the center of gravity of the modified refractive index region is small, it is possible to reduce the occurrence of noise of a beam pattern.

In the examples (Samples 1 to 4) illustrated in FIG. 28B, the shape of each of the modified refractive index regions in the X-Y plane is a rectangular isosceles triangle (Pattern 1), a trapezoid (Pattern 2), a shape deformed such that a dimension in the short-axis direction in the vicinity of one end portion along a long axis of an ellipse is smaller than a dimension in the short-axis direction in the vicinity of the other end portion (an egg form: Pattern 3), or a shape (a tear form: Pattern 4) in which one end portion along the long axis of an ellipse is deformed to a sharpened end portion protruding along the long-axis direction. The lattice point O of the virtual square lattice is present inside these modified refractive index regions. Even with the figure of FIG. 28B, a phase of a beam can be changed by shifting a position of the center of gravity of the modified refractive index region by the distance r from the lattice point O of the virtual square lattice. In addition, since the distance r between the lattice point O of the virtual square lattice and the position of the center of gravity of the modified refractive index region is small, it is possible to reduce the occurrence of noise of a beam pattern.

(Fourth Modification)

Figure 29:
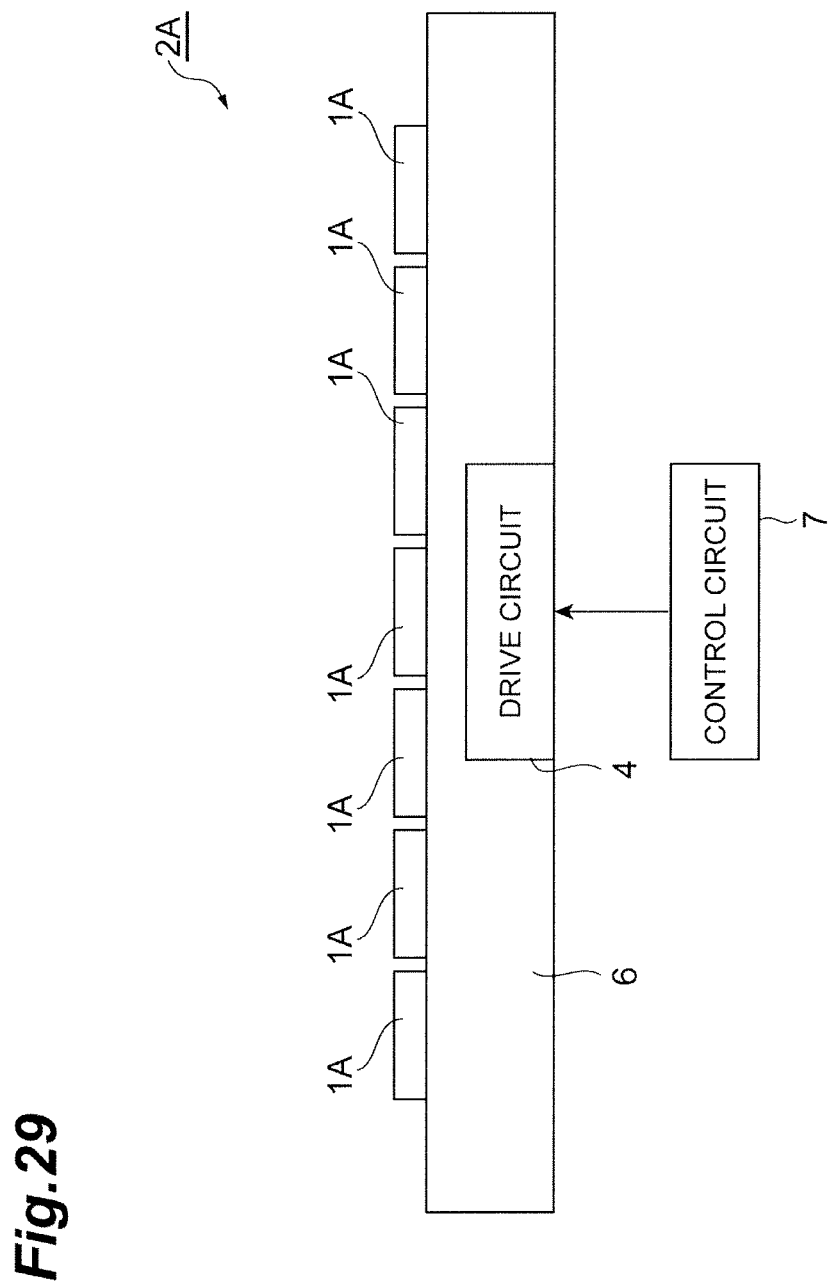
FIG. 29 is a view illustrating a configuration of a light emitting device including a plurality of semiconductor light emitting elements as a fourth modification of the semiconductor light emitting element according to the present embodiment.

FIG. 29 is a view illustrating a configuration of a light emitting device 2A including a plurality of semiconductor light emitting elements as a fourth modification of the semiconductor light emitting element according to the present embodiment. This light emitting device 2A includes a support substrate 6, a plurality of laser elements 1A arranged one-dimensionally or two-dimensionally on the support substrate 6, and a drive circuit 4 individually driving the plurality of laser elements 1A. As an example, the configuration of each of the laser elements 1A is the same as that in the example illustrated in FIGS. 1 and 2 described above. However, each of the plurality of laser elements 1A includes any of a laser element outputting an optical image of a red wavelength range, a laser element outputting an optical image of a blue wavelength range, and a laser element outputting an optical image of a green wavelength range. The laser element outputting the optical image of the red wavelength range is constituted by, for example, a GaAs-based semiconductor. Each of the laser element that outputs the optical image of the blue wavelength range and the laser element that outputs the optical image of the green wavelength range is constituted by, for example, a nitride-based semiconductor. The drive circuit 4 is provided on a back surface or the inside of the support substrate 6 and individually drives each of the laser elements 1A. The drive circuit 4 supplies a drive current to each of the laser elements 1A according to an instruction from a control circuit 7.

Since only a specific optical image is extracted from the plurality of individually driven laser elements 1A as in the fourth modification, it is possible to suitably realize head-up display or the like by appropriately driving required elements regarding a module in which the laser elements corresponding to a plurality of patterns are arranged in advance. In addition, each of the plurality of laser elements 1A includes any of the laser element outputting the optical image of the red wavelength range, the laser element outputting the optical image of the blue wavelength range, and the laser element outputting the optical image of the green wavelength range as in the fourth modification, it is possible to suitably realize color head-up display and the like.

FIRST SPECIFIC EXAMPLE

FIG. 30 is a view illustrating a specific stacked structure of a laser element as an example of the present embodiment (the example illustrated in FIGS. 1 and 2). This laser element is comprised of a GaAs-based compound semiconductor, and includes: an n-type GaAs substrate serving as the semiconductor substrate 10; an n-type AlGaAs layer (Al composition: 40%, thickness: 2.0 μm) serving as the cladding layer 11; an i-type InGaAs/AlGaAs layer (thickness: 225 nm) serving as the active layer 12; an i-type GaAs layer (the modified refractive index region 15b is a hole, thickness: 250 nm, FF=15%) serving as the phase modulation layer 15A; a p-type AlGaAs layer (Al composition: 70%, thickness: 200 nm) serving as the portion 13a of the cladding layer 13; a p-type GaAs/AlGaAs layer serving as the DBR layer 18; a p-type AlGaAs layer (Al composition: 70%, thickness: 200 nm) serving as the portion 13b of the cladding layer 13; and a p-type GaAs layer (thickness: 100 nm) serving as the contact layer 14.

Figure 31:
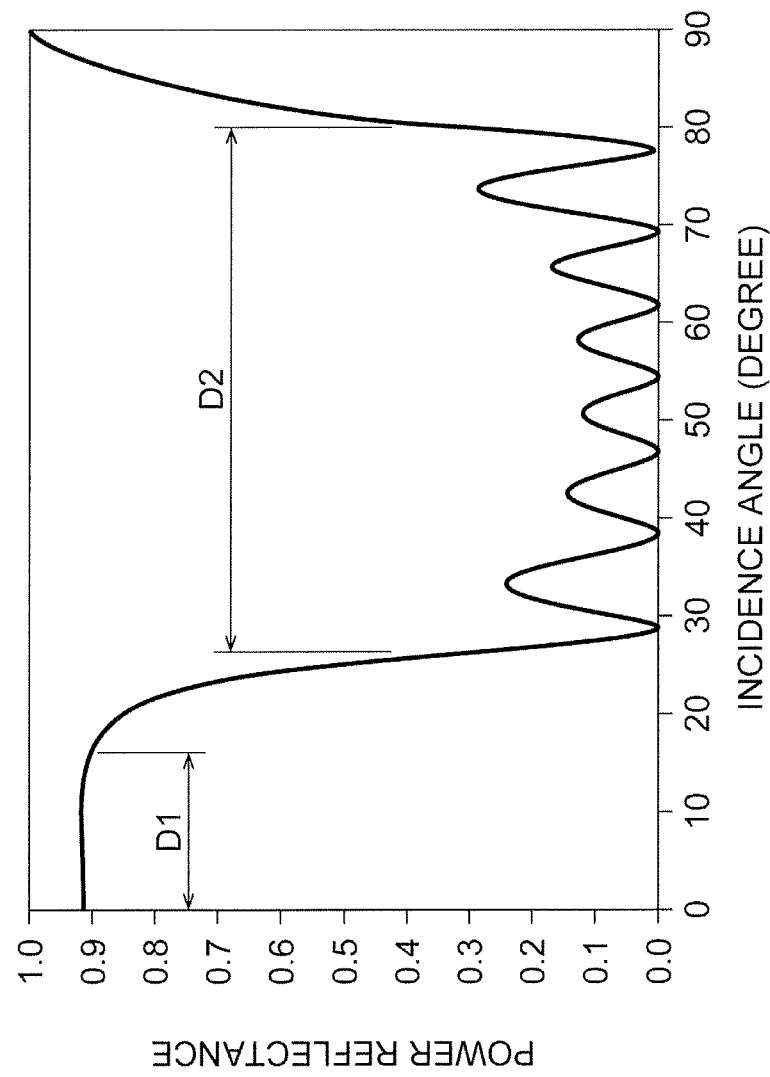
FIG. 31 is a graph illustrating a change of a reflectance in accordance with a change of an incidence angle in a p-type GaAs/AlGaAs layer of FIG. 30.

The p-type GaAs/AlGaAs layer serving as the DBR layer 18 is configured as eleven pairs, the pair of a GaAs layer (refractive index: 3.55) serving as the layer 18a (see FIG. 21) and an AlGaAs layer (Al composition: 95%, refractive index: 2.99) serving as the layer 18b (22 layers in total) are stacked on each other. As a result, a thickness of the p-type GaAs/AlGaAs layer was 1592 nm. An emission wavelength λ of the i-type InGaAs/AlGaAs layer serving as the active layer 12 was set to 940 nm, and film thicknesses of the layers 18a and 18b with respect to the TE mode (S wave) of the emission wavelength were 66.1 nm and 78.6 nm, respectively. FIG. 31 is a graph illustrating a change of a reflectance in accordance with a change of an incidence angle in the p-type GaAs/AlGaAs layer of FIG. 30. As illustrated in this graph, the reflectance is high and substantially exceeds 90% in a predetermined range D1 in which an incidence angle is close to 0°. On the other hand, the reflectance is low and substantially below 20% in a predetermined range D2 where the incidence angle is far from 0°. Therefore, the zero-order light B1 is reflected, but the first-order light B2 and the negative first-order light B3 can be suitably transmitted according to the DBR layer 18. At this time, the part B1a of the zero-order light outputted from the phase modulation layer 15A advances toward the DBR layer 18 as stated in the description of FIG. 20. Then, zero-order light B1a reverses its traveling direction by being reflected by the DBR layer 18 and is directed toward the light emission surface 2b. On the other hand, the remnant B1b of the zero-order light emitted from the phase modulation layer 15A is directly directed to the light emission surface 2b. At this time, since the zero-order light B1a and the zero-order light B1b which have passed through different optical paths advance in the same direction, the zero-order light B1a and the zero-order light B1b interfere with each other. In the present embodiment, the zero-order light B1a and the zero-order light B1b weaken each other as the interval between the phase modulation layer 15A and the DBR layer 18 is set to be defined by Formula (11) or the above "interval adjustment", and thus, it is possible to suppress the emission of the zero-order light as a whole. At this time, a reflectance of the zero-order light B1a incident on the DBR layer 18 at an incidence angle of 0° is higher than 90%, and thus, the zero-order light of 90% or more can be weakened by weakening interference with the zero-order light B1b.

Figure 32:
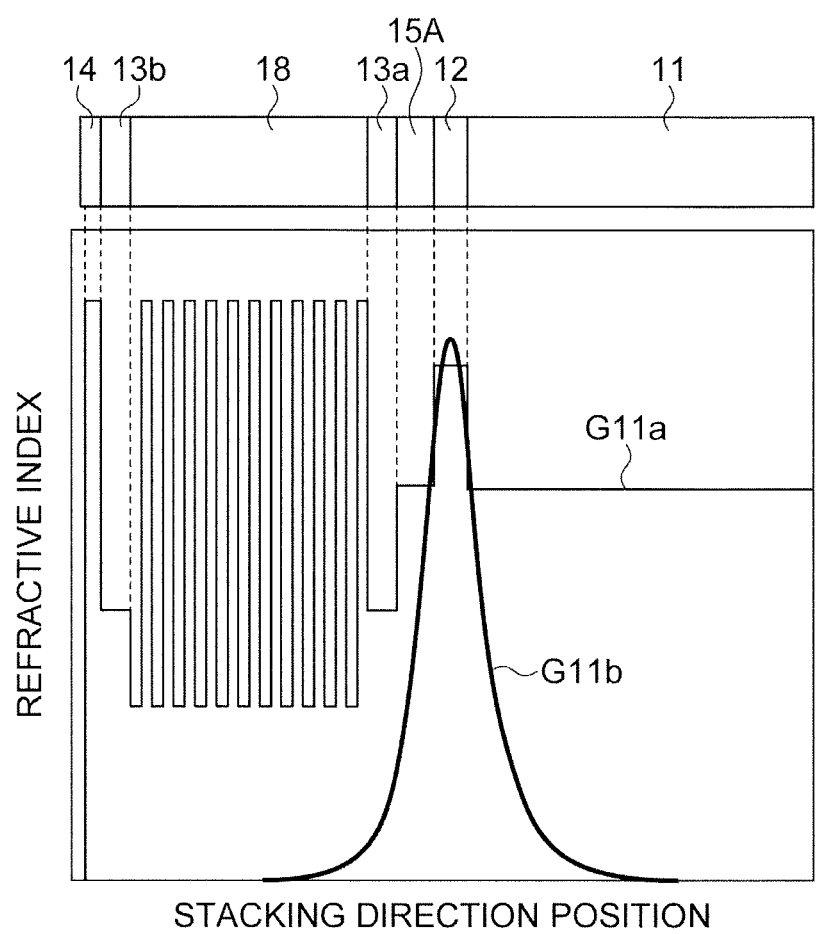
FIG. 32 is a graph illustrating a refractive index distribution and an electric field mode distribution of a laser element used at the time of determining a structure of the p-type GaAs/AlGaAs layer which is the DBR layer.

FIG. 32 illustrates a refractive index distribution G11a and an electric field mode distribution G11b of a laser element used at the time of determining a structure of the p-type GaAs/AlGaAs layer serving as the DBR layer 18. The horizontal axis represents a position in the stacking direction, and a range thereof is 5.0 μm. In the first specific example, the active layer 12 is regarded as a single layer having an average dielectric constant and a total film thickness, and the phase modulation layer 15A is regarded as a single layer having an average dielectric constant in order to simplify the calculation.

A calculation formula of an average dielectric constant $N_{Active}$ and a total film thickness $D_{Active}$ of the active layer 12 is given by the following Formula (12). Incidentally, i is a layer number (i=is1, ..., ie1), Ni is a refractive index of an i-th layer, and di is a film thickness of the i-th layer.

$$N_{Active} = \sqrt{\frac{\sum_{i=is1}^{ie1} d_i \cdot N_i^2}{\sum_{i=is1}^{ie1} d_i}} \quad (12)$$

$$D_{Active} = \sum_{i=is1}^{ie1} d_i$$

In the fabricated laser element according to the first specific example, the average dielectric constant $N_{Active}$=3.46 and the total film thickness $D_{Active}$=225 nm.

A calculation formula of an average dielectric constant $N_{PM}$ of the phase modulation layer 15A is given by the following Formula (13). FF is a filling factor, $N_{GaAs}$ is a refractive index of the base layer 15a, and $N_{Air}$ is a refractive index of the modified refractive index region 15b.

$$N_{PM} = \sqrt{FF \cdot N_{Air}^2 + (1-FF) \cdot N_{GaAs}^2} \quad (13)$$

In the fabricated laser element according to the first specific example, the filling factor FF=15%, $N_{GaAs}$=3.55, $N_{Air}$=1, and the average dielectric constant $N_{PM}$=3.30.

SECOND SPECIFIC EXAMPLE

FIG. 33 is a view illustrating a specific stacked structure of a laser element according to a first modification. This laser element is comprised of a GaAs-based compound semiconductor, and includes: an n-type GaAs substrate serving as the semiconductor substrate 10; an n-type AlGaAs layer (Al composition: 40%, thickness: 200 nm) serving as the portion 21a of the cladding layer 21; an n-type GaAs/AlGaAs layer serving as the DBR layer 28; an n-type AlGaAs layer (Al composition: 40%, thickness: 200 nm) serving as the portion 21b of the cladding layer 21; an i-type InGaAs/AlGaAs layer (thickness: 225 nm) serving as the active layer 12; an i-type GaAs layer (the modified refractive index region 15b is a hole, thickness: 250 nm, FF=15%) serving as the phase modulation layer 15A; a p-type AlGaAs layer (Al composition: 70%, thickness: 2.0 μm) serving as the cladding layer 23; and a p-type GaAs layer (thickness 100 nm) serving as the contact layer 14. Incidentally, a configuration of the n-type GaAs/AlGaAs layer as the DBR layer 28 is the same as that of the first embodiment.

Figure 34:
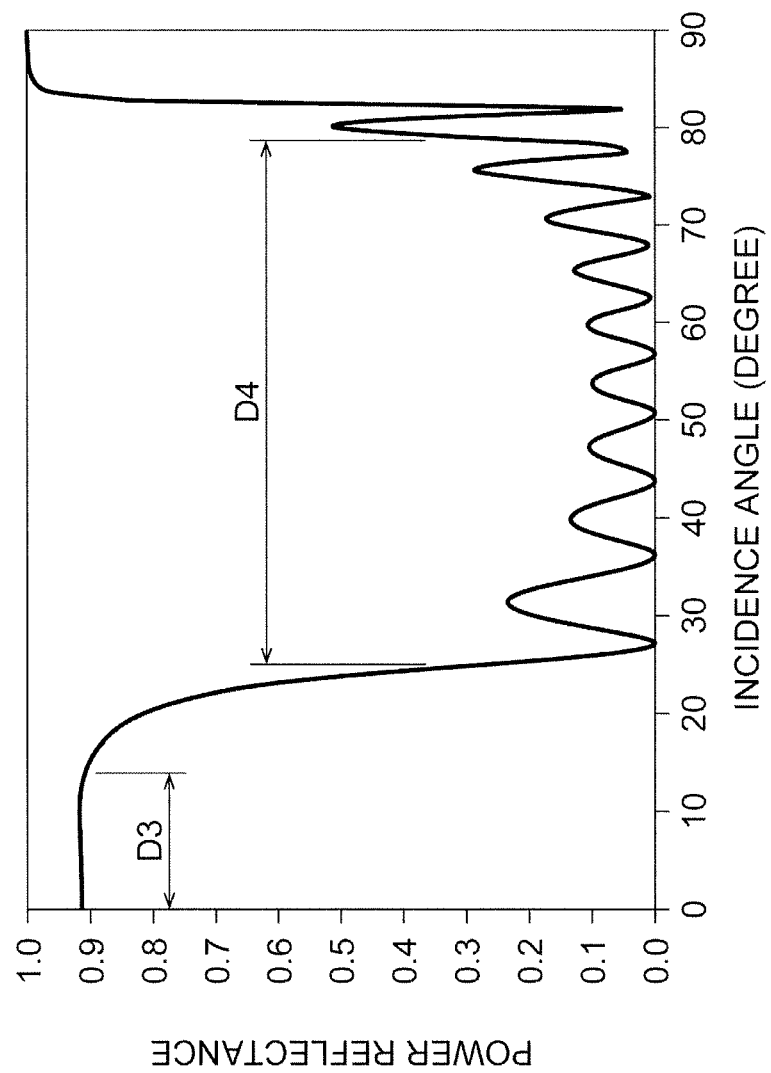
FIG. 34 is a graph illustrating a change of a reflectance in accordance with a change of an incidence angle in an n-type GaAs/AlGaAs layer of FIG. 33.

FIG. 34 is a graph illustrating a change of a reflectance in accordance with a change of an incidence angle in the n-type GaAs/AlGaAs layer of FIG. 33. As illustrated in this graph, the reflectance is high and substantially exceeds 90% in a predetermined range D3 in which an incidence angle is close to 0°. On the other hand, the reflectance is low and substantially below 20% in a predetermined range D4 where the incidence angle is far from 0°. Therefore, the zero-order light B1 is reflected, but the first-order light B2 and the negative first-order light B3 can be suitably transmitted according to the DBR layer 28.

Figure 35:
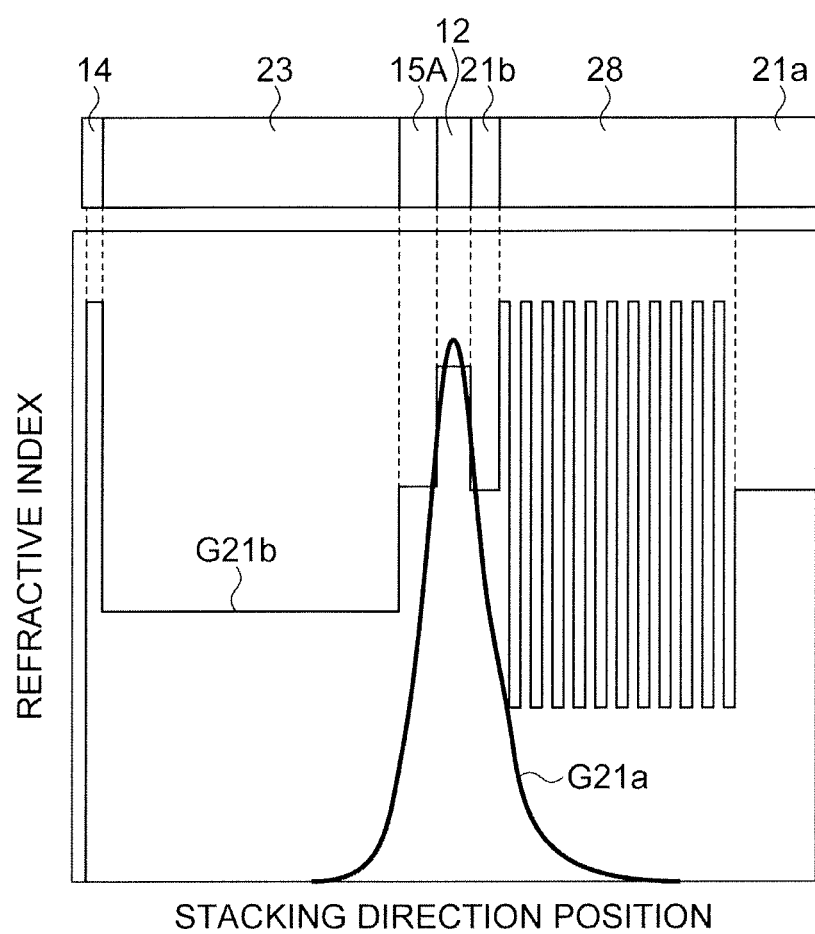
FIG. 35 is a graph illustrating a refractive index distribution and an electric field mode distribution of a laser element used at the time of determining a structure of the n-type GaAs/AlGaAs layer which is the DBR layer.

FIG. 35 illustrates a refractive index distribution G21a and an electric field mode distribution G21b of a laser element used at the time of determining a structure of the n-type GaAs/AlGaAs layer serving as the DBR layer 28. The horizontal axis represents a position in the stacking direction, and a range thereof is 5.0 μm. Even in the second specific example, the active layer 12 is regarded as a single layer having an average dielectric constant and a total film thickness, and the phase modulation layer 15A is regarded as a single layer having an average dielectric constant in order to simplify the calculation.

The semiconductor light emitting element according to the embodiment is not limited to the above-described embodiments, and various other modifications can be made. For example, the laser element comprised of the semiconductors of GaAs-base, InP-base, and nitride-base (particularly, GaN-base) compounds has been exemplified in the above-described examples of FIGS. 1 and 2 and the first and second specific examples, the invention can be applied to laser elements comprised of various semiconductor materials other than these materials.

REFERENCE SIGNS LIST 1A, 1B . . . laser element; 2A . . . light emitting device; 2a . . . light reflection surface; 2b . . . light emission surface; 4 . . . drive circuit; 6 . . . support substrate; 7 . . . control circuit; 10 . . . semiconductor substrate; 11, 13, 21, 23 . . . cladding layer; 12 . . . active layer; 14 . . . contact layer; 15A, 15B . . . phase modulation layer; 15a . . . base layer; 15b, 15c . . . modified refractive index region; 16, 17 . . . electrode; 17a . . . opening 18, 28 DBR layer; 19 . . . anti-reflection film; B1 . . . zero-order light; B2 . . . first-order light; B3 . . . negative first-order light; Ez . . . electric field mode distribution; G1, G2 . . . center of gravity; O . . . lattice point; R . . . unit constituent region; RIN . . . inner region; and ROUT . . . outer region.

The invention claimed is:

1. A semiconductor light emitting element which has a light emission surface and a light reflection surface arranged to face the light emission surface and which outputs an optical image of an arbitrary shape along a normal direction of the light emission surface and an inclined direction having predetermined inclination and spread angle with respect to the normal direction, the semiconductor light emitting element comprising:
an active layer arranged between the light emission surface and the light reflection surface;
a first cladding layer arranged between the light emission surface and the active layer;
a second cladding layer arranged between the light reflection surface and the active layer; and
a phase modulation layer arranged between the first cladding layer and the active layer or between the second cladding layer and the active layer,
wherein any one of the first and second cladding layers includes a distributed Bragg reflector layer which has a transmission characteristic with respect to a specific optical image outputted along the inclined direction and has a reflection characteristic with respect to zero-order light outputted along the normal direction,
the phase modulation layer includes a base layer and a plurality of modified refractive index regions each of which has a refractive index different from a refractive index of the base layer, and
the phase modulation layer is configured such that:
where, in an XYZ orthogonal coordinate system defined by a Z axis coinciding with the normal direction and the X-Y plane including X and Y axes orthogonal to each other and coinciding with one surface of the phase modulation layer including the plurality of modified refractive index regions, a virtual square lattice constituted by M1(an integer of one or more) ×N1 (an integer of one or more) unit constituent regions R each having a square shape is set on the X-Y plane, in the unit constituent region R(x, y) on an X-Y plane specified by a coordinate component x (an integer of from one to M1) in an X-axis direction and a coordinate component y (an integer of from one to N1) in a Y-axis direction, a center of gravity G1 of the modified refractive index region positioned in a unit constituent region R(x, y) is away from a lattice point O(x, y) which is a center of the unit constituent region R(x, y) and a vector is directed in a specific direction toward the center of gravity G1 from the lattice point O(x, y).

2. The semiconductor light emitting element according to claim 1, wherein
the second cladding layer includes the distributed Bragg reflector layer, and
an interval between the distributed. Bragg reflector layer and the phase modulation layer is set such that a component of the zero-order light toward the light emission surface after being reflected by the distributed Bragg reflector layer and a component of the zero-order light directly directed to the light emission surface from the phase modulation layer weaken each other.

3. The semiconductor light emitting element according to claim 1, wherein where a lattice constant of the virtual square lattice is a, a distance r between the center of gravity G1 of the modified refractive index region positioned inside the unit constituent region R(x, y) and the lattice point O(x, y) satisfies $0 \le r \le 0.3a$.

4. The semiconductor light emitting element according to claim 1, Wherein in a state of satisfying the following first of sixth conditions:
the first condition defined the coordinates (x, y, z) in the XYZ orthogonal coordinates system satisfy relationships represented by following Formulas (1) to (3) with respect to spherical coordinates (d1, $\theta_{tilt}$, $\theta_{rot}$) defined by a length d1 of a radius vector, a tilt angle $\theta_{tilt}$ from the Z axis, and a rotation angle $\theta_{rot}$ from the X axis specified on the X-Y plane:

$$x = d1 \sin\theta_{tilt} \cos\theta_{rot} \quad (1)$$

$$y = d1 \sin\theta_{tilt} \sin\theta_{rot} \quad (2)$$

$$z = d1 \cos\theta_{tilt} \quad (3);$$

the second condition defined that letting a beam pattern corresponding to the optical image outputted from the semiconductor light emitting element is a set of bright spots directed in directions defined by the angles $\theta_{tilt}$ and $\theta_{rot}$, the angles $\theta_{tilt}$ and $\theta_{rot}$ are converted to a coordinate value $k_x$, which is a normalized wave number defined by a following Formula (4), on a Kx axis corresponding to the X axis and a coordinate value $k_y$, which is a normalized wave number defined by a following Formula (5), on a Ky axis corresponds to the Y axis and orthogonal to the Kx axis:

$$k_x = \frac{a}{\lambda} \sin\theta_{tilt} \cos\theta_{rot} \quad (4)$$

$$k_y = \frac{a}{\lambda} \sin\theta_{tilt} \sin\theta_{rot} \quad (5)$$

a: Lattice constant of virtual square lattice
λ: Oscillation wavelength of semiconductor light emitting element;
the third condition defined that a specific wave number range including the beam pattern is constituted by M2(an integer of one or more) ×N2 (an integer of one or more) image regions FR each having a square shape in a wave number space defined by the Kx axis and the Ky axis;
the fourth condition defined that, in the wave number space, a complex amplitude F(x, y), which is obtained by two-dimensional inverse Fourier transform of each image region FR($k_x$, $k_y$), specified by the coordinate component $k_x$ (an integer of from 0 to M2−1) in the Kx-axis direction and the coordinate component $k_y$ (an integer of from 0 to N2−1) in the Ky-axis direction, to the unit constituent region R(x, y) on the X-Y plane, is given by a following Formula (6) with j as an imaginary unit:

$$F(x, y) = \sum_{k_x=0}^{M2-1} \sum_{k_x=0}^{N2-1} FR(k_x, k_y) \exp\left[j2\pi\left(\frac{k_x}{M2}x + \frac{k_y}{N2}y\right)\right]; \quad (6)$$

the fifth condition defined that the complex amplitude F(x, y) is defined by a following Formula (7) where an amplitude term is A(x, y) and a phase term is P(x, y) in the unit constituent region R(x, y):

$$F(x,y) = A(x,y) \times \exp[jP(x,y)] \quad (7); \text{ and}$$

the sixth condition defined that the unit constituent region R(x, y) is defined by an s axis and a t axis which are parallel to the X axis and the Y axis and orthogonal to each other at the lattice point O(x, y),
the phase modulation layer is configured such that:
in a state in which a line segment length r(x, y) from the lattice point O(x, y) to the center of gravity G1 of the corresponding modified refractive index region is set to a common value in each of the M1×N1 unit constituent regions R, an angle φ(x, y) formed by a line segment connecting the lattice point O(x, y) and the center of gravity G1 of the corresponding modified refractive index region and the s axis satisfies a relationship expressed by the following formular:

$$\varphi(x,y) = C \times P(x,y) + B$$

C: a proportional constant
B: an arbitrary constant, and
the corresponding modified refractive index region is arranged in the unit constituent region R(x y).

5. A light emitting device comprising:
a plurality of semiconductor light emitting elements each having an identical structure as the semiconductor light emitting element according to claim 1; and
a drive circuit configured to individually drive the plurality of semiconductor light emitting elements.

6. The light emitting device according to claim 5, wherein each of the plurality of semiconductor light emitting elements includes any of a semiconductor light emitting element outputting the optical image of a red wavelength range, a semiconductor light emitting element outputting the optical image of a blue wavelength range, and a semiconductor light emitting element outputting the optical image of a green wavelength range.

* * * * *